(12) United States Patent
Tarng

(10) Patent No.: US 8,089,324 B2
(45) Date of Patent: Jan. 3, 2012

(54) VARACTOR-FREE AMPLITUDE CONTROLLED OSCILLATOR(ACO) FOR SYSTEM ON CHIP AND SYSTEM ON CARD XTALESS CLOCK SOC

(76) Inventor: Min Ming Tarng, San Jose, CA (US)

(*) Notice: Subject to any disclaimer, the term of this patent is extended or adjusted under 35 U.S.C. 154(b) by 4 days.

(21) Appl. No.: 12/317,973

(22) Filed: Dec. 31, 2008

(65) Prior Publication Data

US 2009/0134947 A1 May 28, 2009

Related U.S. Application Data

(63) Continuation-in-part of application No. 12/288,770, filed on Oct. 23, 2008, now Pat. No. 7,663,349, and a continuation-in-part of application No. 12/229,412, filed on Aug. 23, 2008, and a continuation-in-part of application No. 12/082,601, filed on Apr. 12, 2008, and a continuation-in-part of application No. 12/079,179, filed on Mar. 25, 2008, and a continuation-in-part of application No. 11/593,271, filed on Nov. 6, 2006, now Pat. No. 7,511,589, and a continuation-in-part of application No. 11/500,125, filed on Aug. 5, 2006, now Pat. No. 7,525,392.

(51) Int. Cl.
*H03B 5/18* (2006.01)
*H03L 1/00* (2006.01)
*H03L 5/00* (2006.01)

(52) U.S. Cl. .............. 331/117 FE; 331/109; 331/176; 331/183

(58) Field of Classification Search .............. 331/15, 331/36 L, 109, 117 FE, 117 R, 167, 181–183, 331/176
See application file for complete search history.

(56) References Cited

U.S. PATENT DOCUMENTS

| | | | |
|---|---|---|---|
| 6,504,361 B1 * | 1/2003 | Gleixner | 324/207.17 |
| 6,838,952 B2 * | 1/2005 | Ramet | 331/183 |
| 6,906,596 B2 * | 6/2005 | Kitamura et al. | 331/36 C |
| 7,061,359 B2 * | 6/2006 | Ding et al. | 336/200 |
| 7,126,435 B2 * | 10/2006 | Naviasky et al. | 331/182 |
| 7,132,901 B2 * | 11/2006 | Cojocaru | 331/117 FE |
| 7,167,062 B2 * | 1/2007 | van Zeijl | 331/185 |
| 7,812,683 B2 * | 10/2010 | Sutardja | 331/176 |

* cited by examiner

*Primary Examiner* — Levi Gannon

(57) ABSTRACT

The fundamental breakthrough in green technology are the Varactor Free Amplitude Controlled Oscillator VFACO and the planar EMI-Free Planar Inductor. The VFACO makes the fine tune for oscillation frequency. It has the frequency compensation over temperature. It doesn't have the VCO self-modulation-induced phase noise. It is phase-noiseless. It is high-Q and high stability. It increases the communication capacity. The EMI-Free Planar Inductor is the backbone of the platform of green technology. The platform of green technology contains the Xtaless ClockChip, Inductorless PMU & PA and ESDS-PCB to provide the green technology for green chip design. Especially for the $4^{th}$ generation wireless communication, the Inductorless PMU & PA are the most important green technology. The Xtaless ClockChip adopts the most advanced self-compensation Amplitude controller. The ESDS-PCB has the minimum Via assignment algorithm to make the optimum pin assignment for the platform of green technology. The self-compensation Amplitude controller is so powerful that the Xtaless ClockChip is trimless and/or trimfree Xtaless ClockChip. It is plastic-packageable and IP-able Xtaless ClockChip that it is the only market-ready-product Xtaless ClockChip.

18 Claims, 61 Drawing Sheets

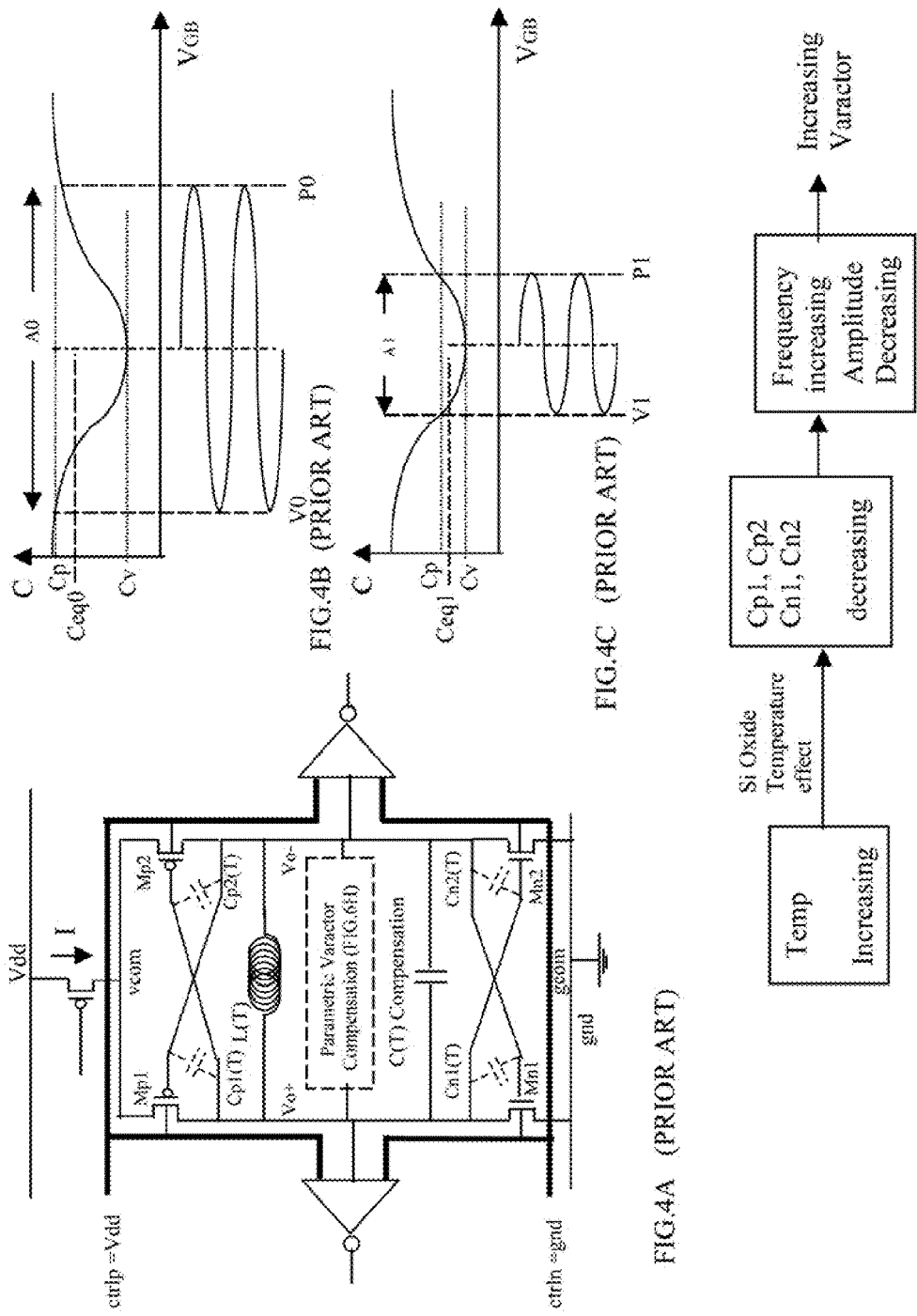

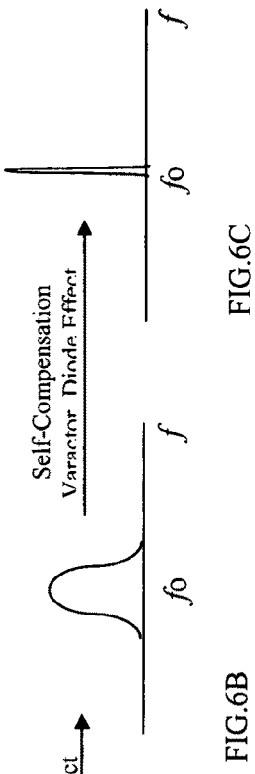
FIG.6A
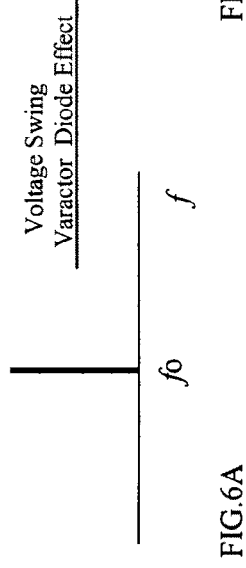
FIG.6D
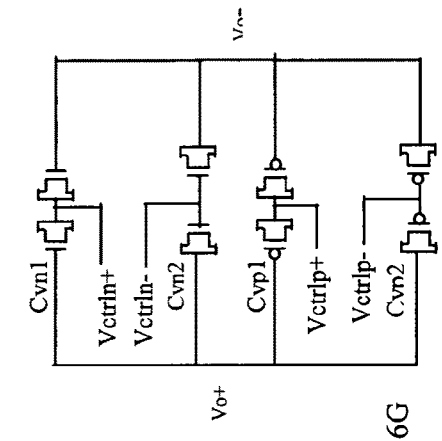
FIG.6B
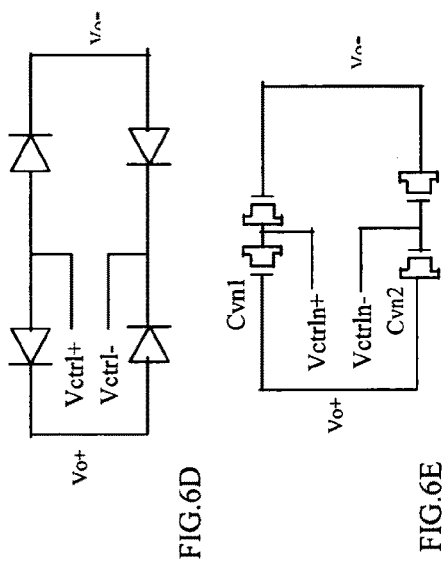
FIG.6E
FIG.6F
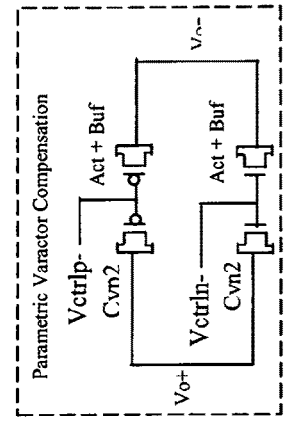
FIG.6C
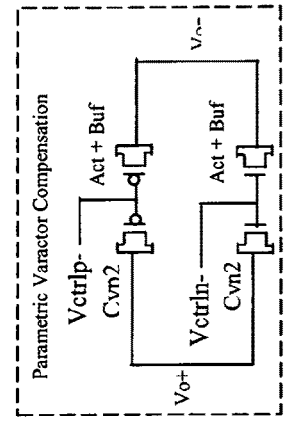
FIG.6G
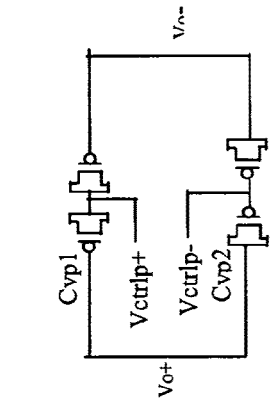
FIG.6H

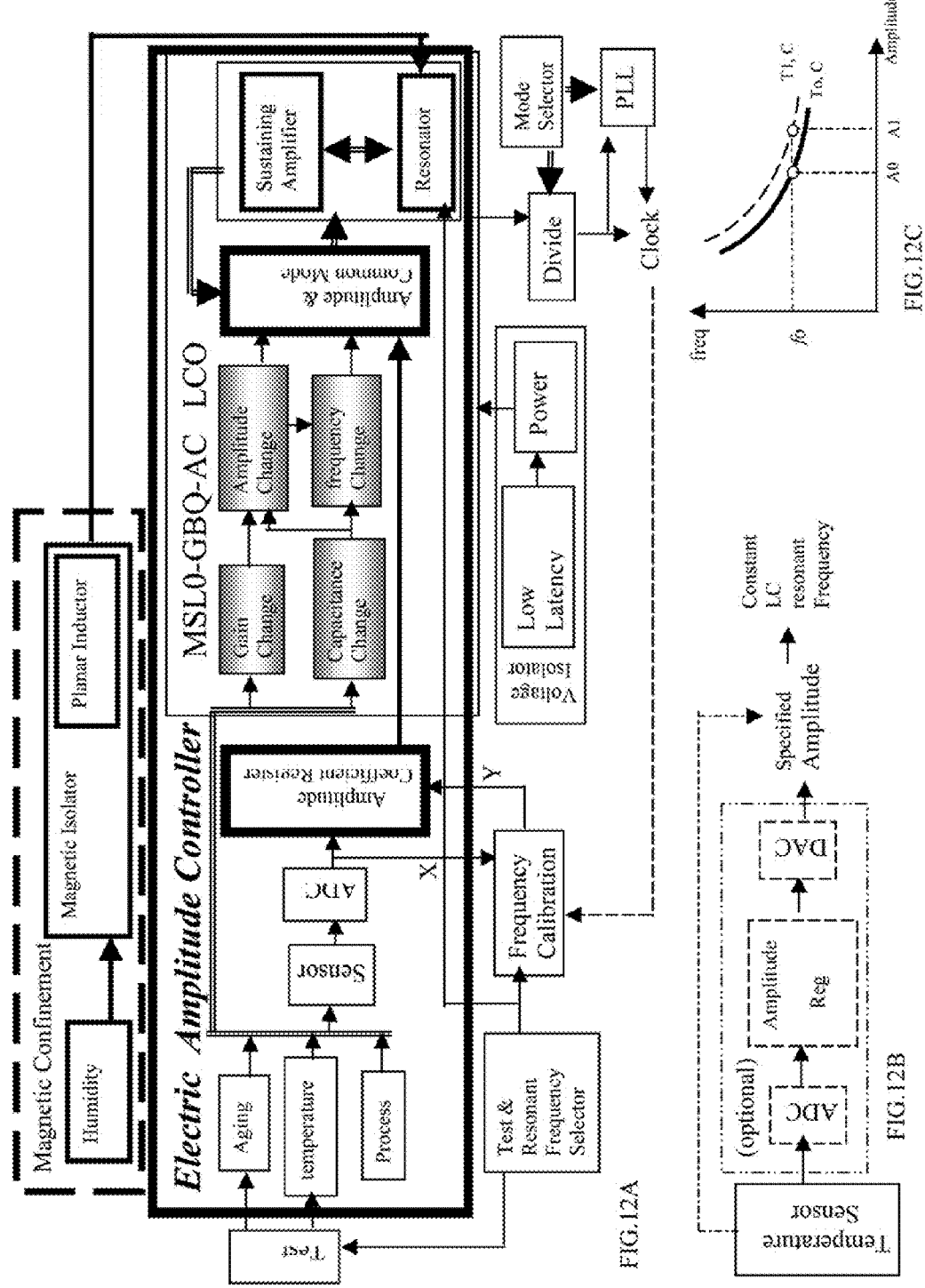

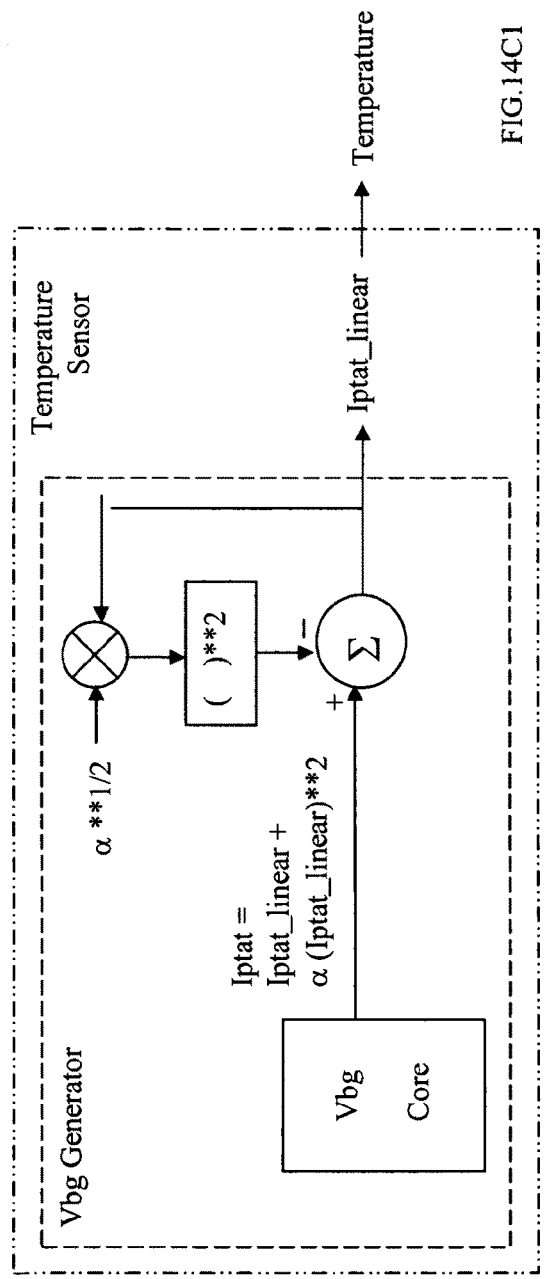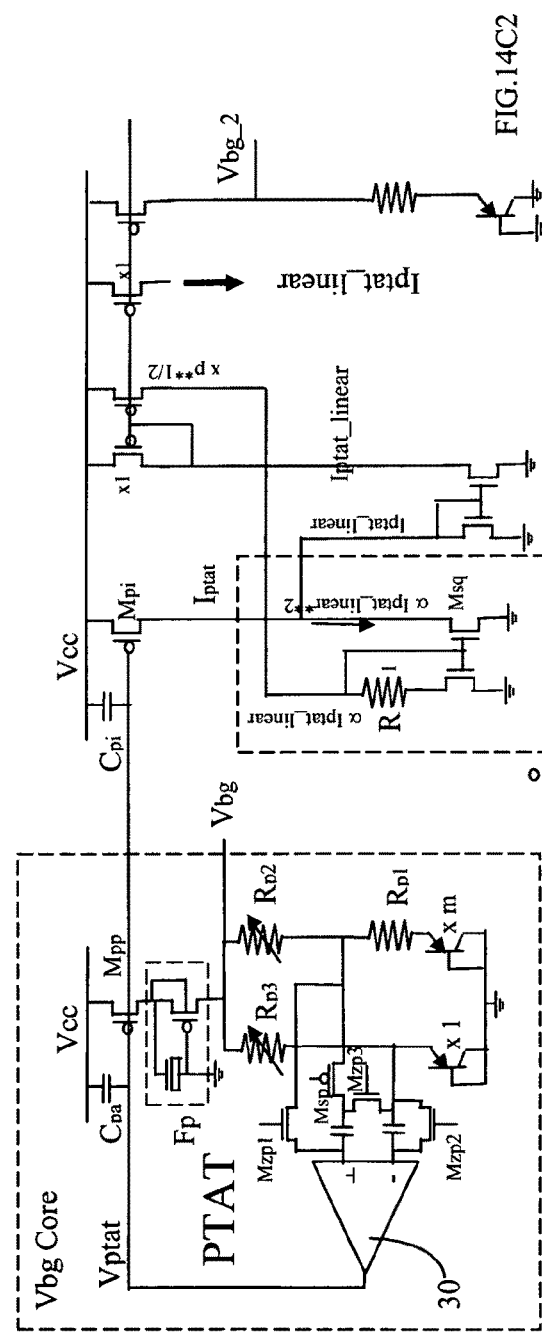
FIG.14C1
FIG.14C2

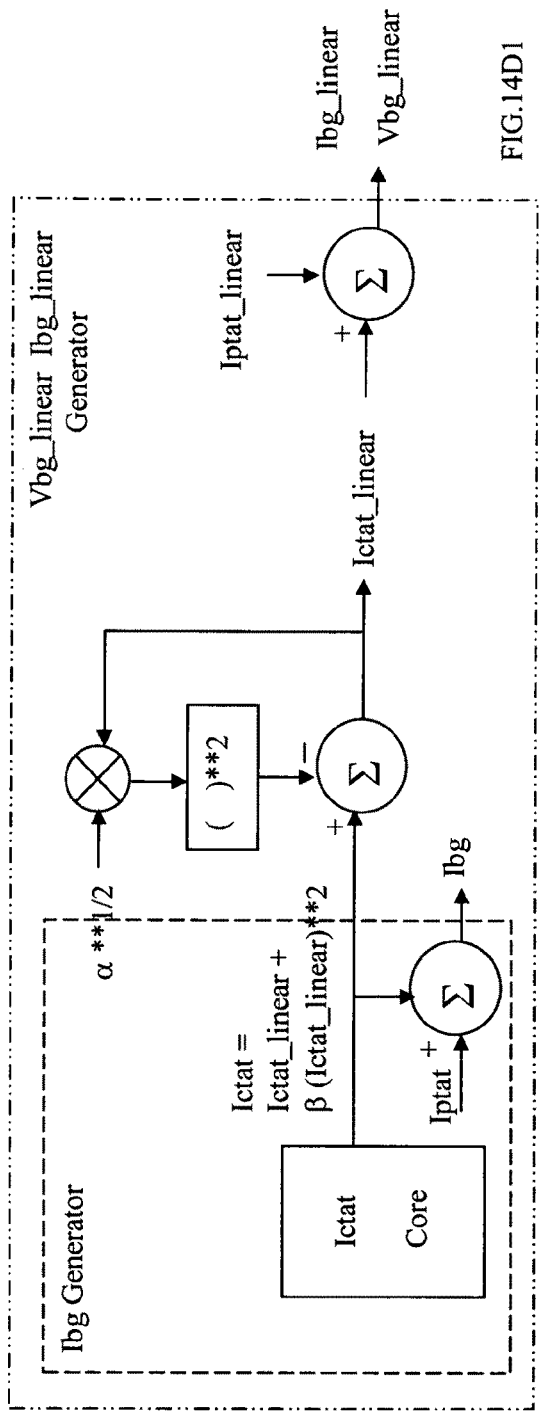
FIG.14D1
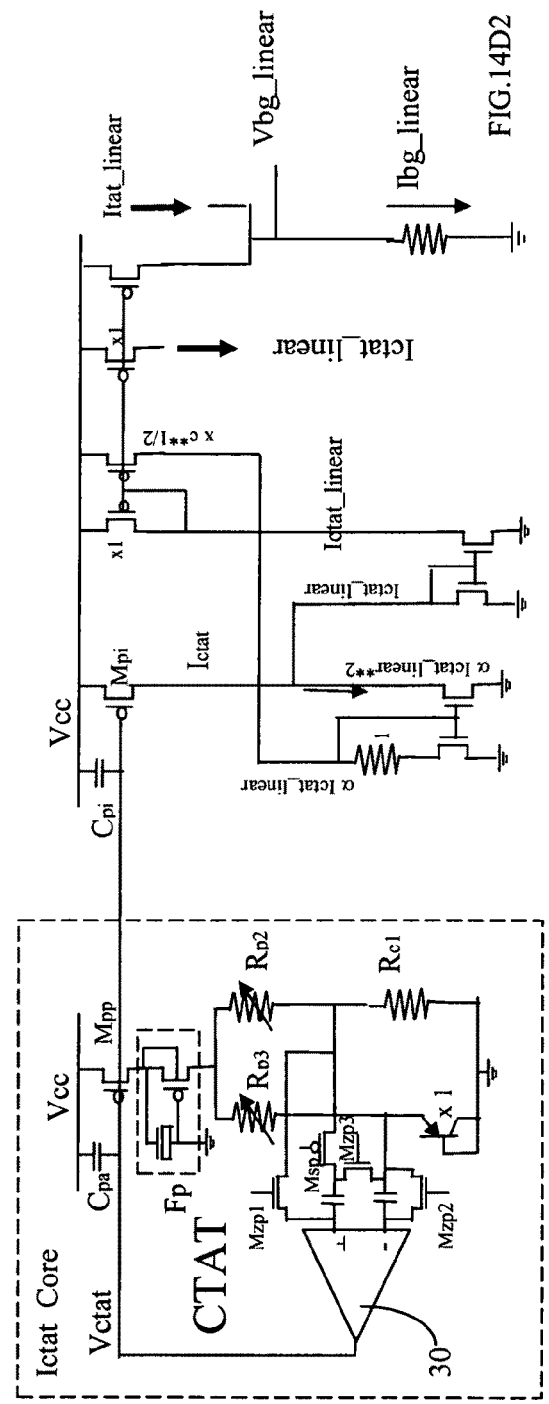
FIG.14D2

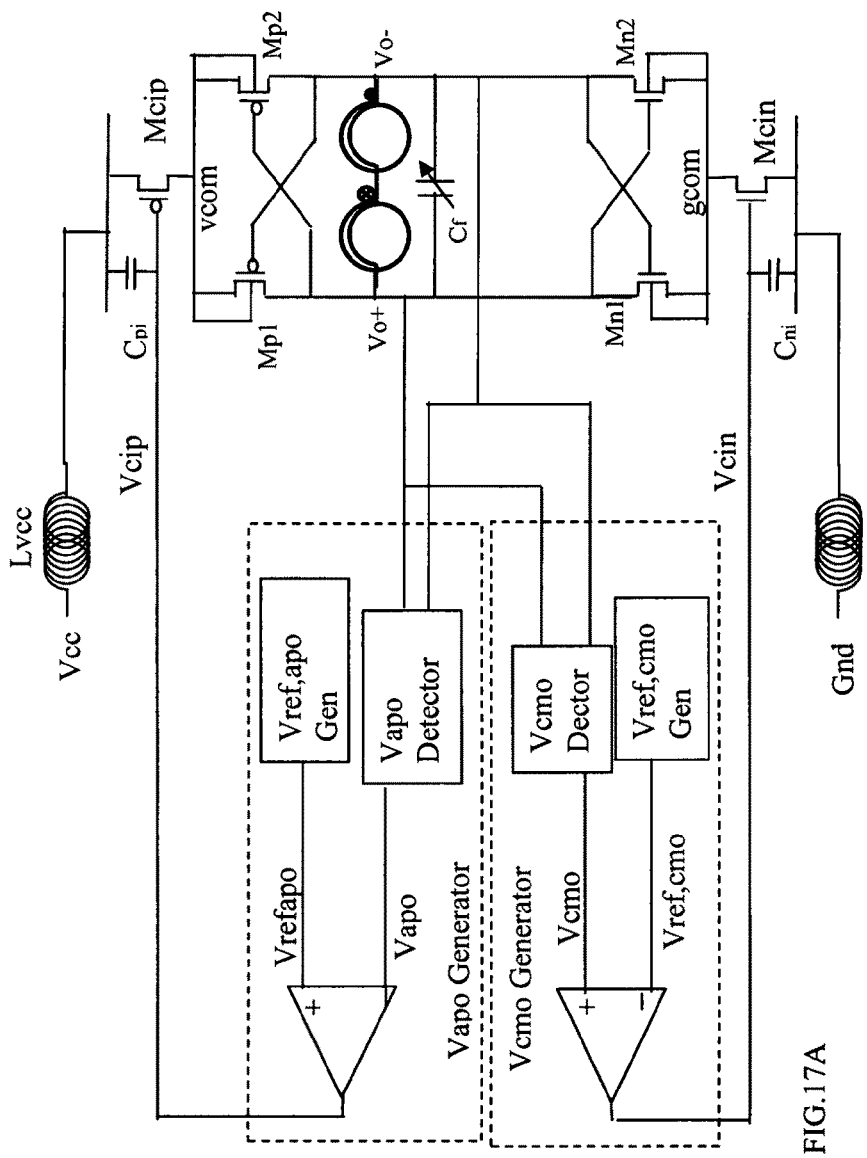
FIG.17A
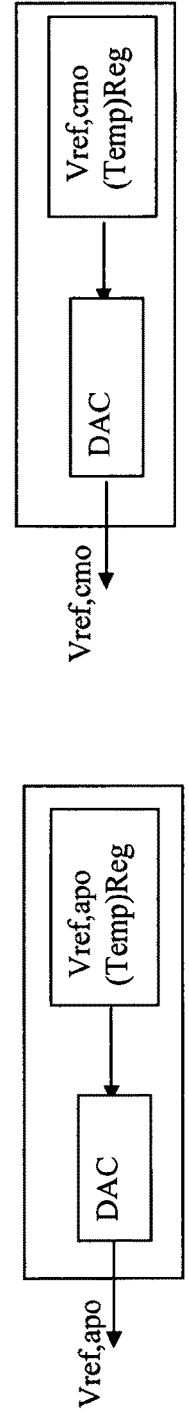
FIG.17C
FIG.17B

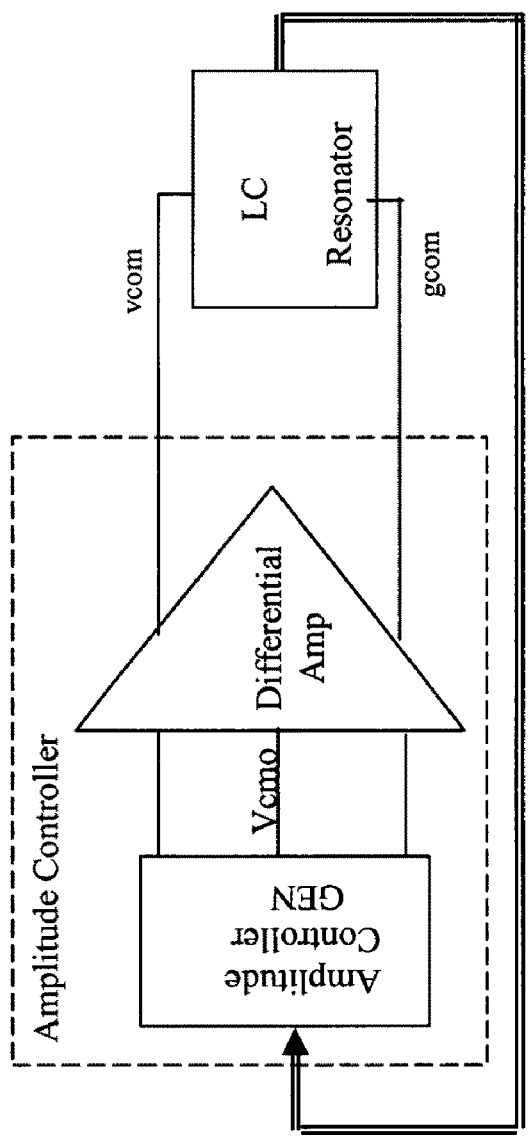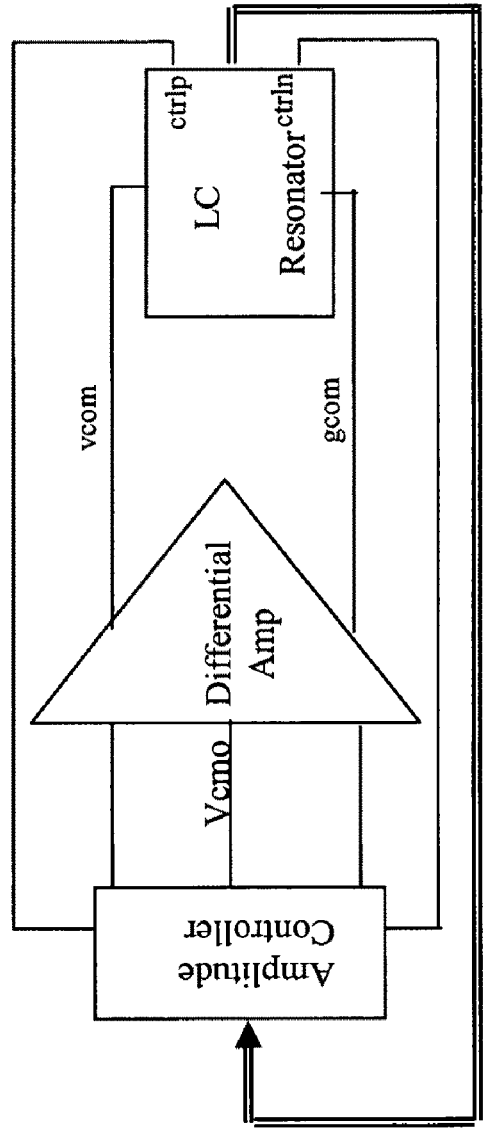
FIG.29B
FIG.29C

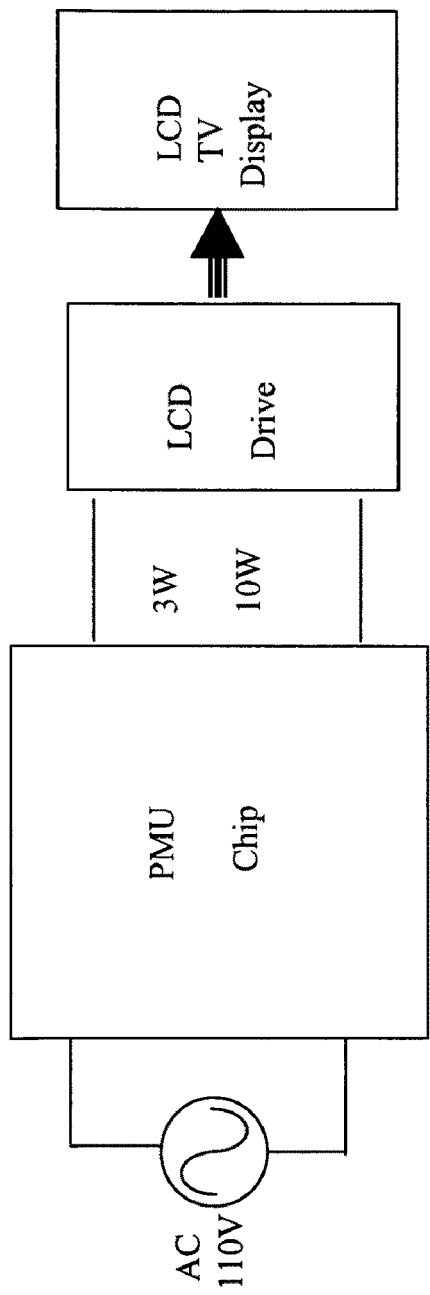
FIG.34
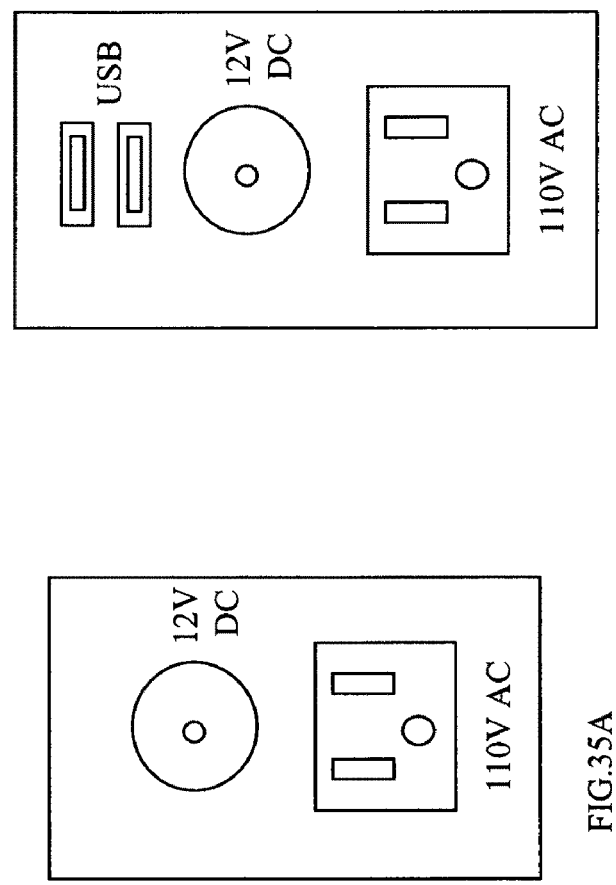
FIG.35A
FIG.35B

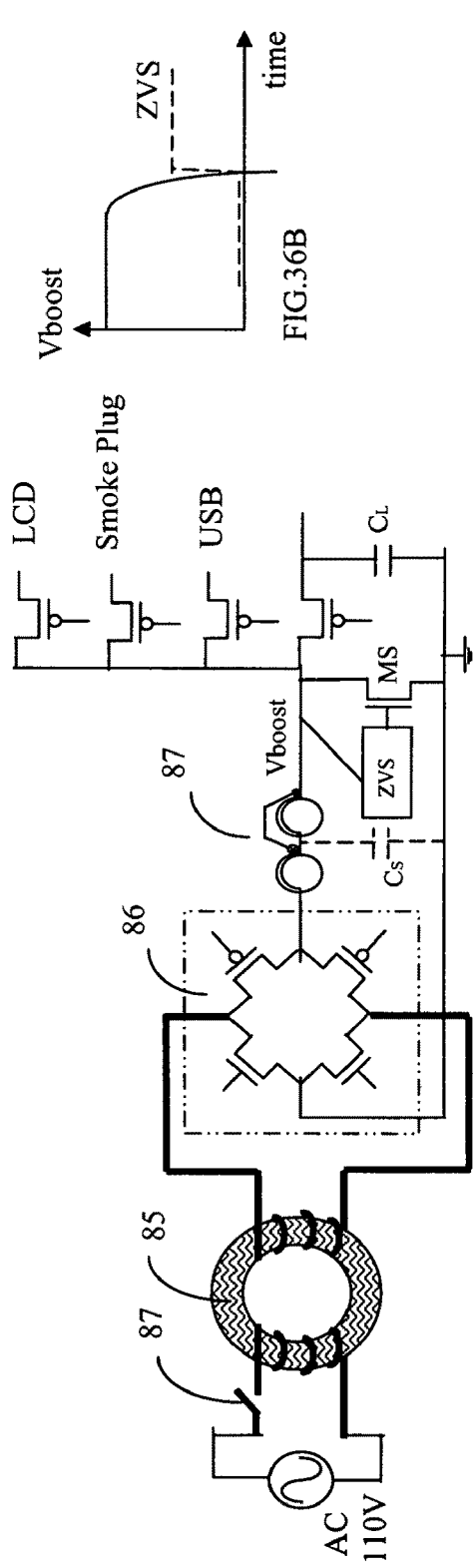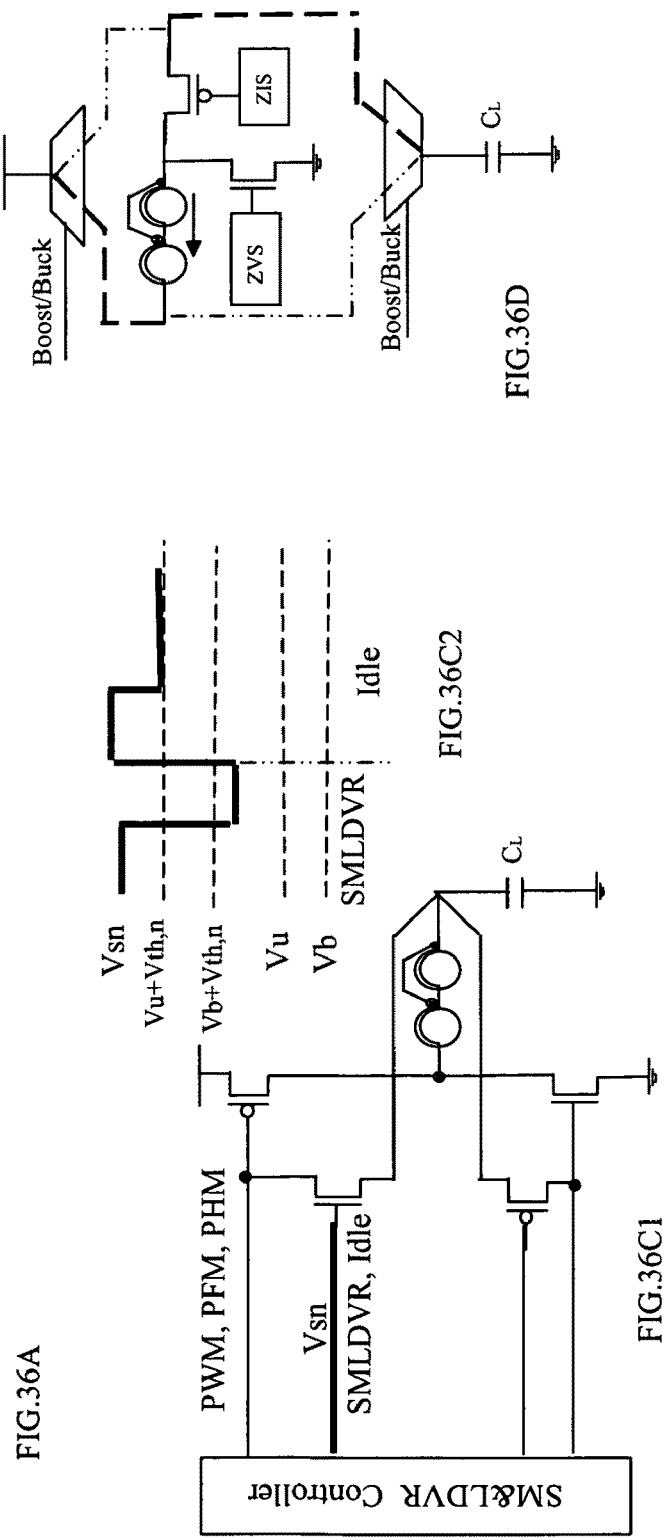

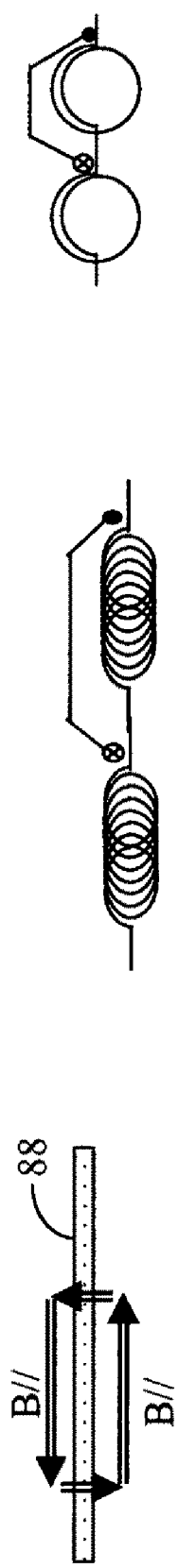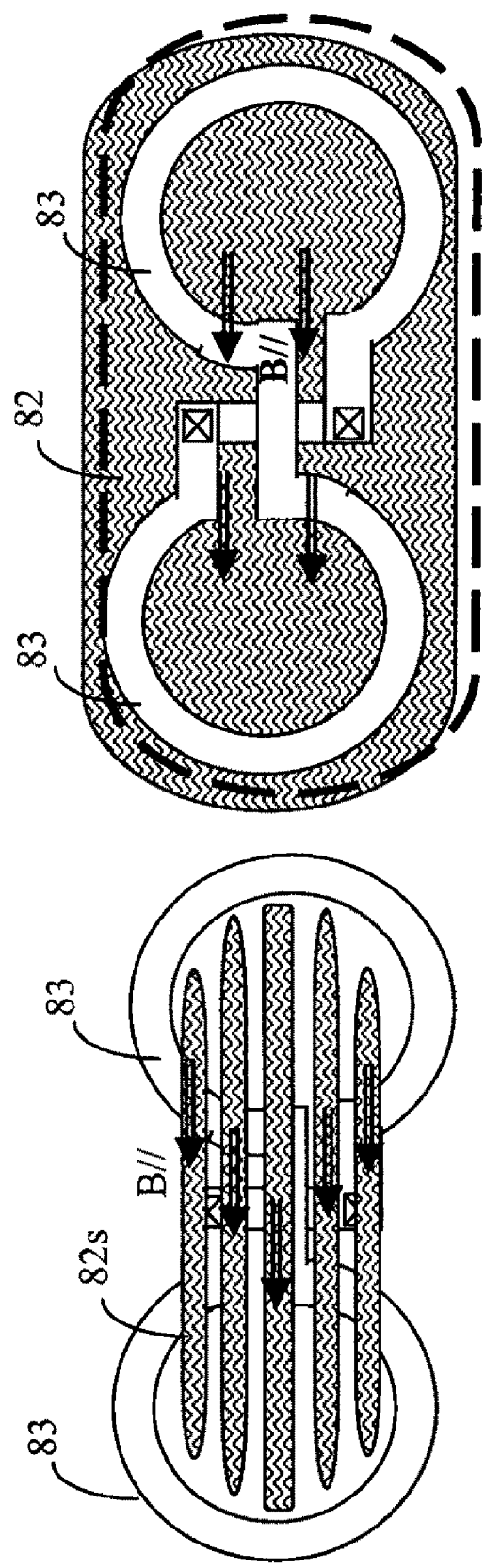

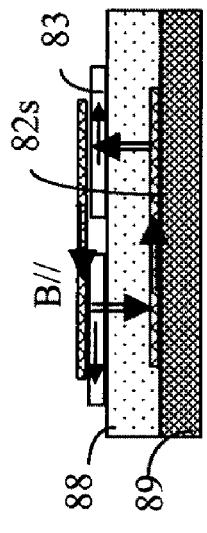
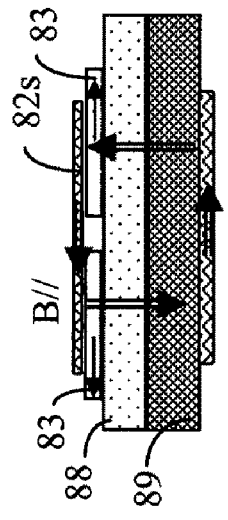
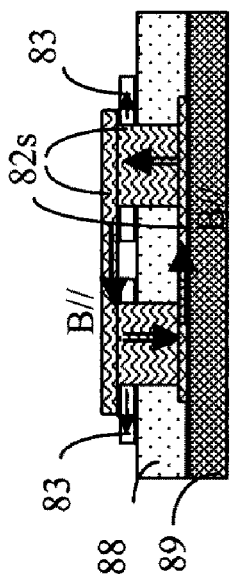
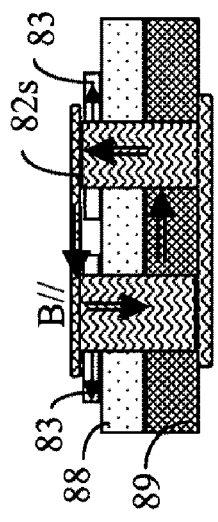
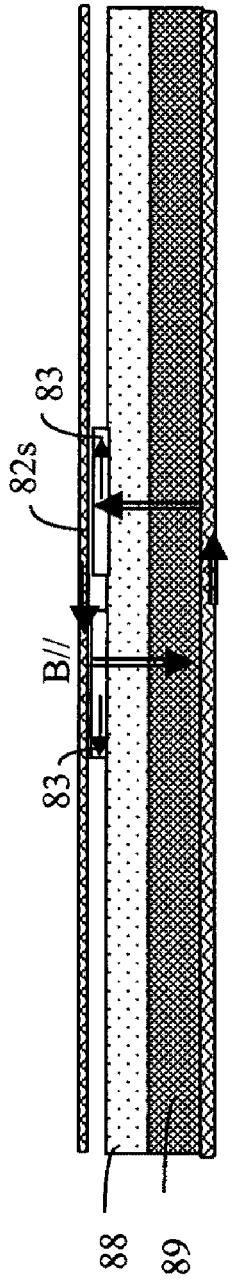

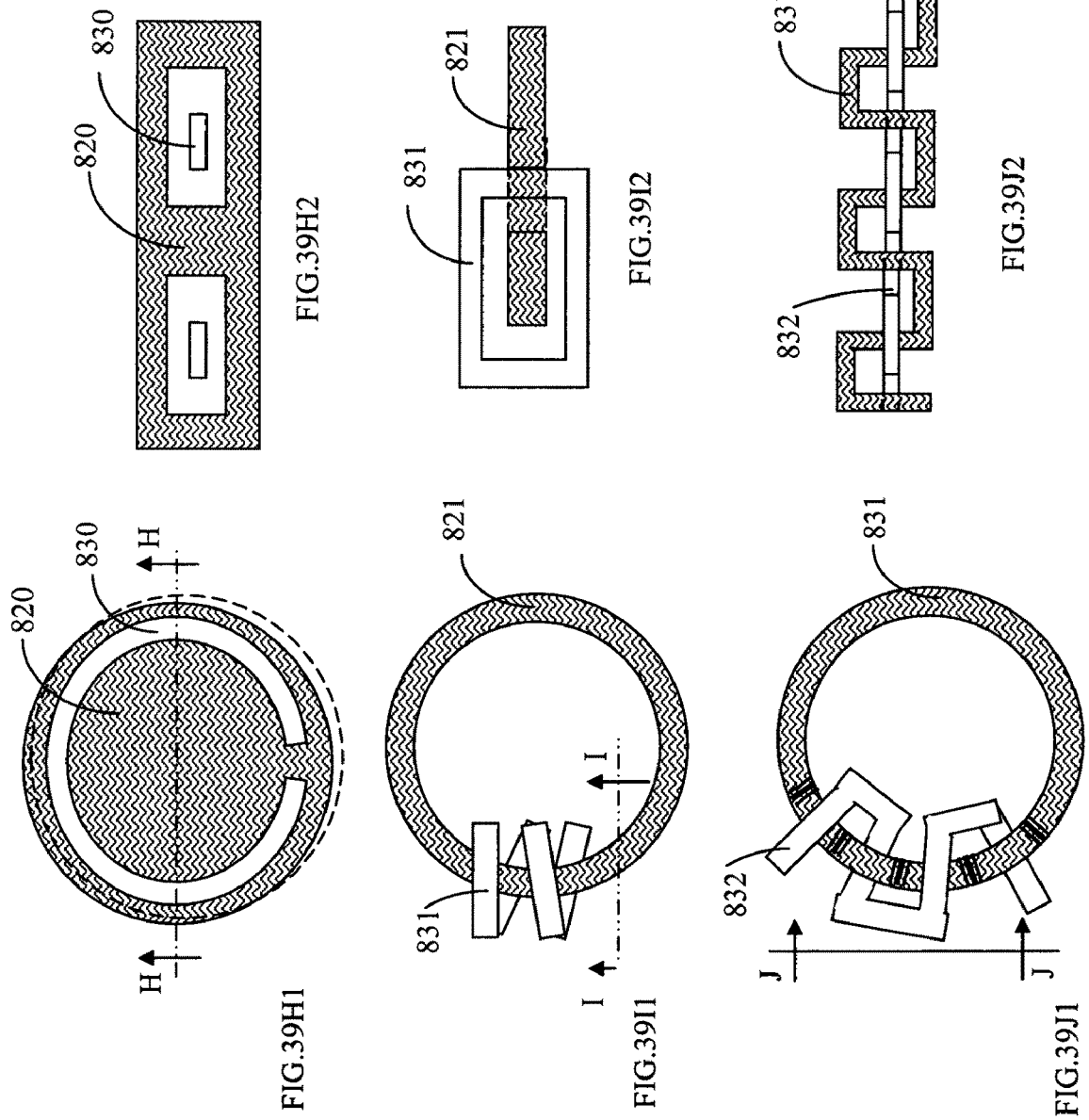

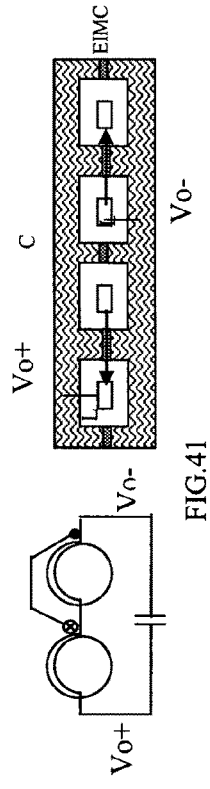 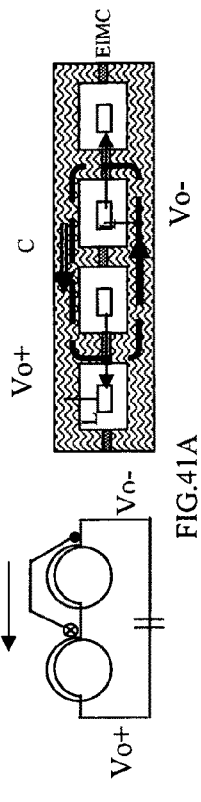 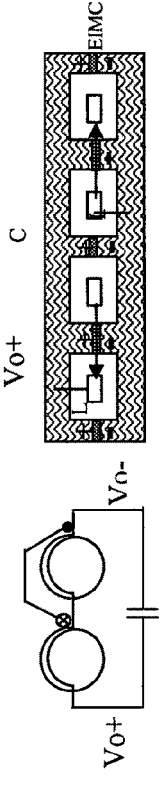 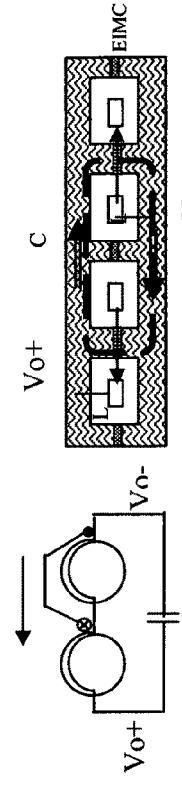 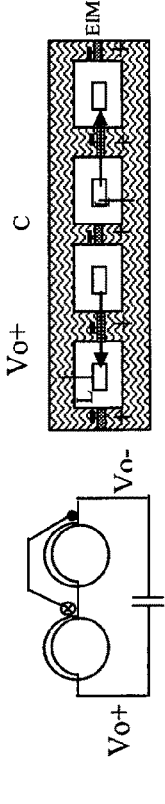
FIG.40  FIG.40A  FIG.40B  FIG.40C  FIG.40D
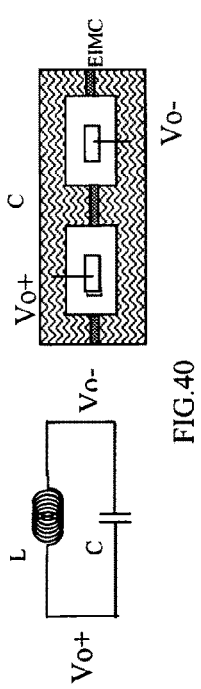 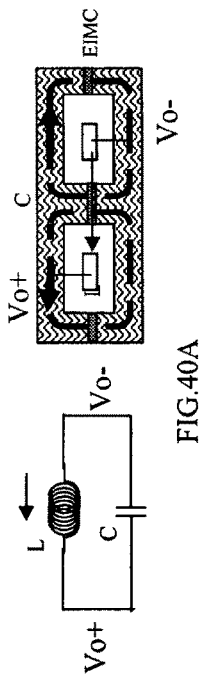 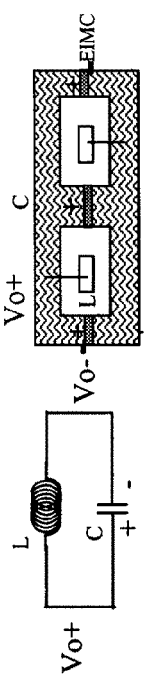 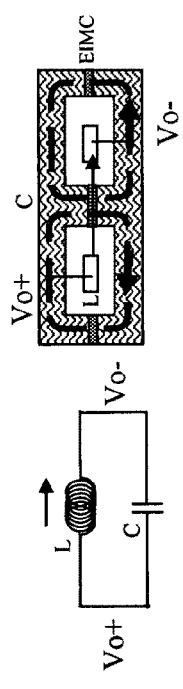 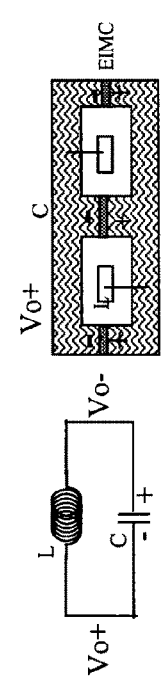
FIG.41  FIG.41A  FIG.41B  FIG.41C  FIG.41D

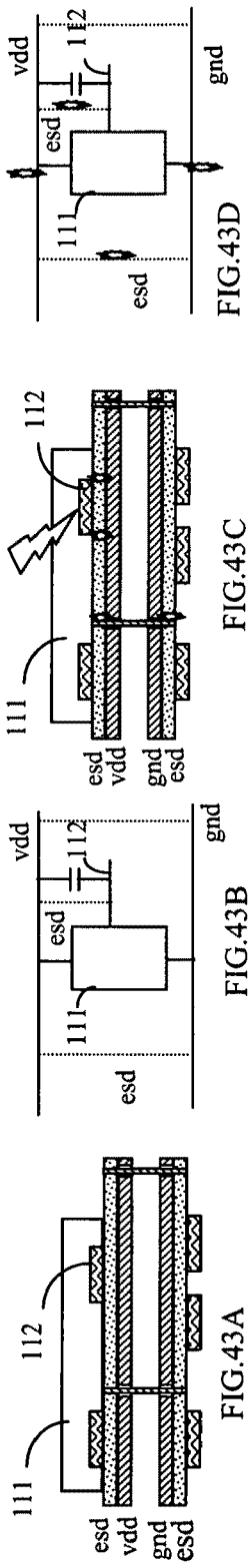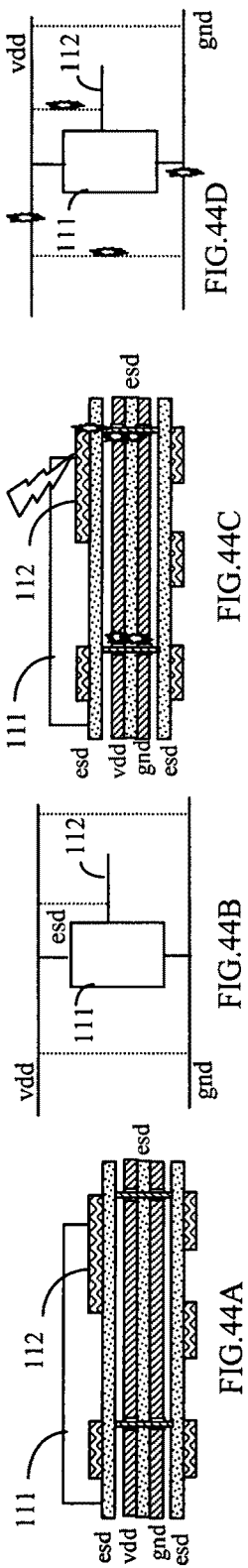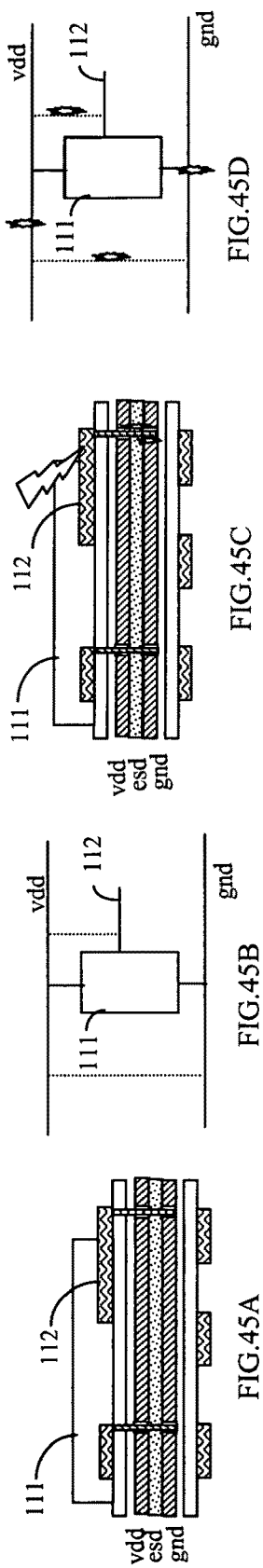

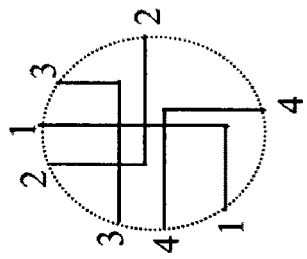
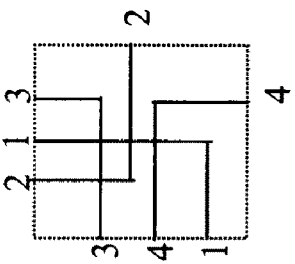
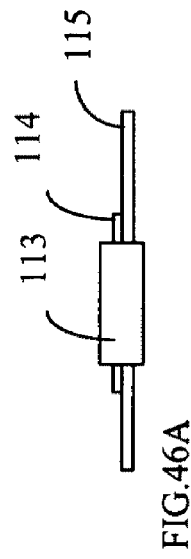
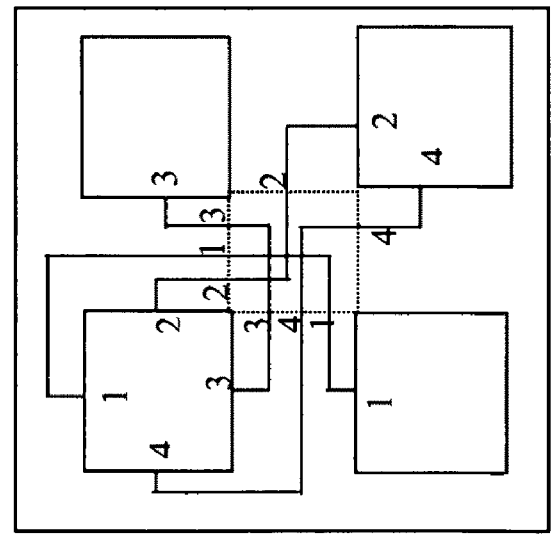
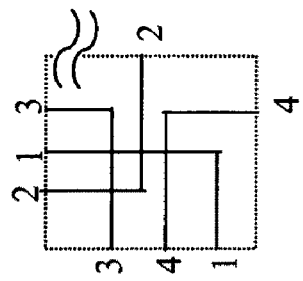
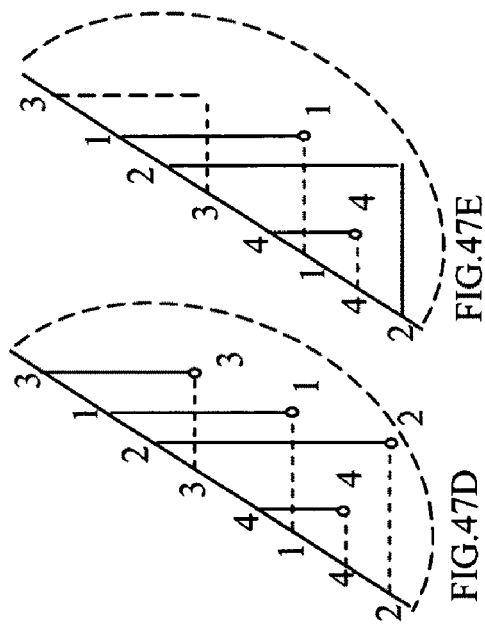
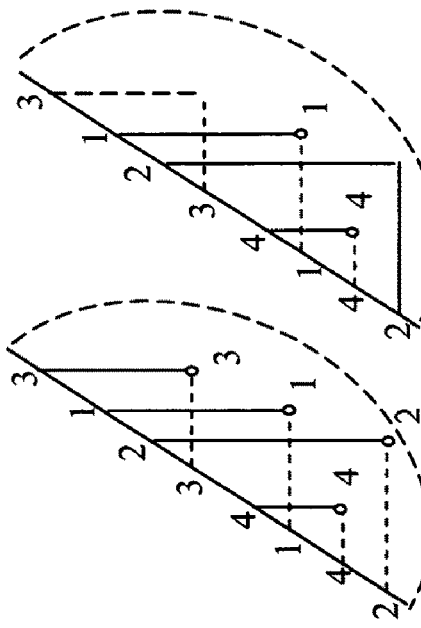

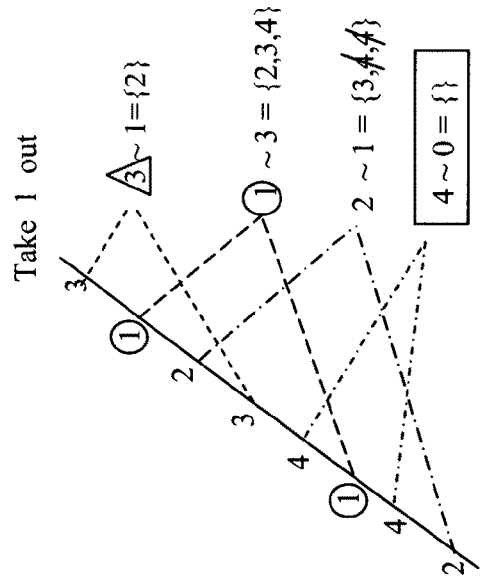
FIG.48A
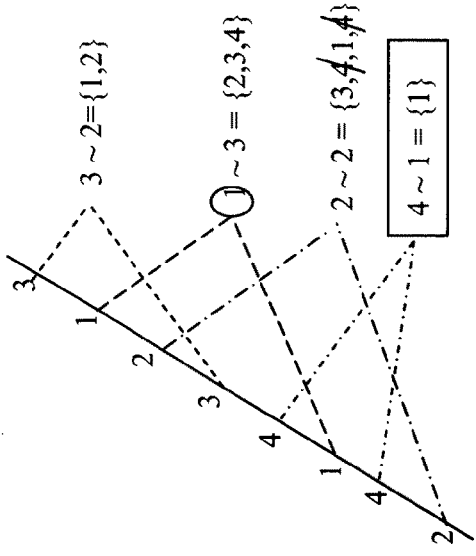
FIG.48B
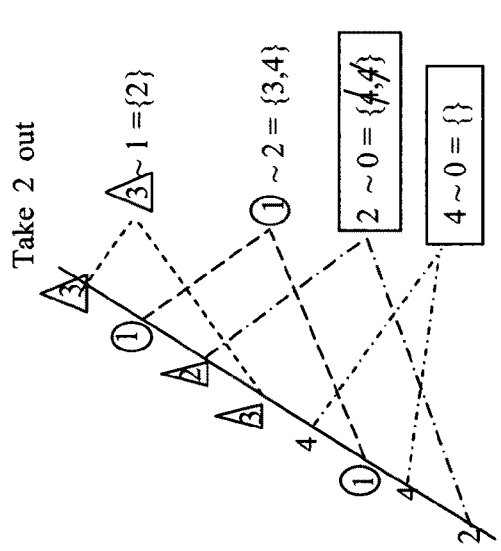
FIG.48C
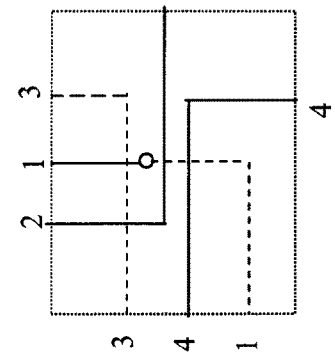
FIG.48D
FIG.48E

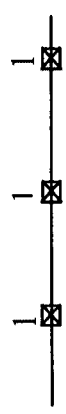
FIG.49A
FIG.49B
FIG.50A
FIG.50B
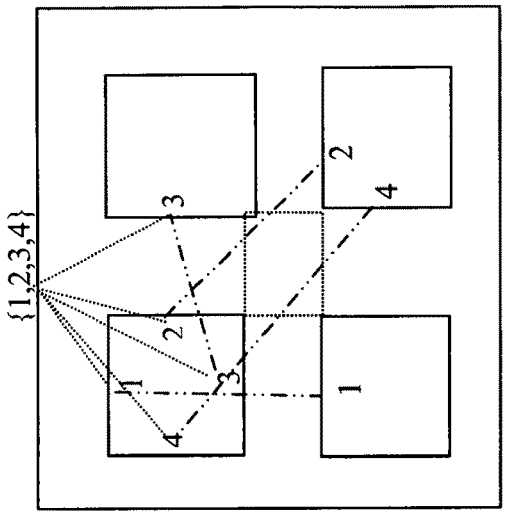
FIG.52
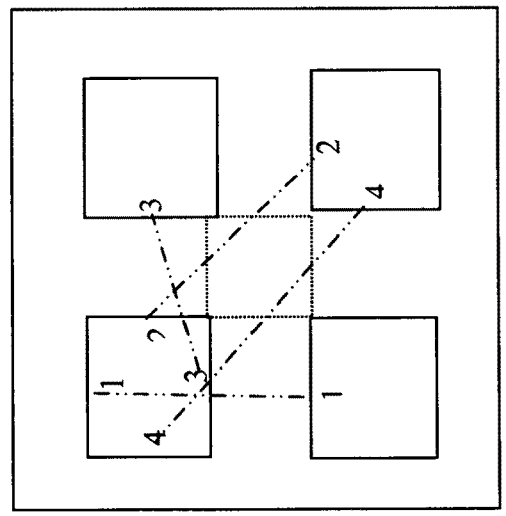
FIG.51

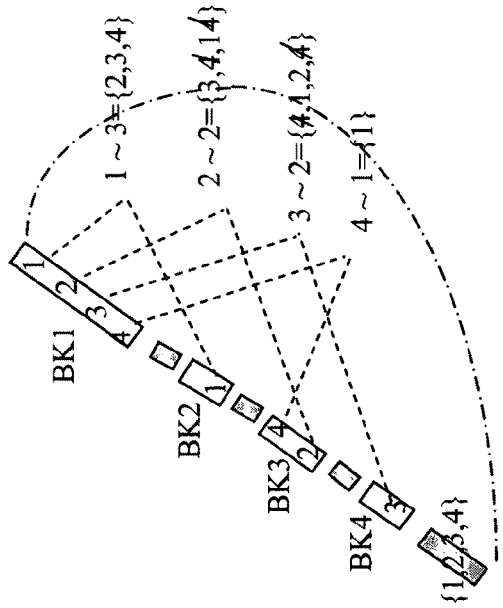
FIG.53B
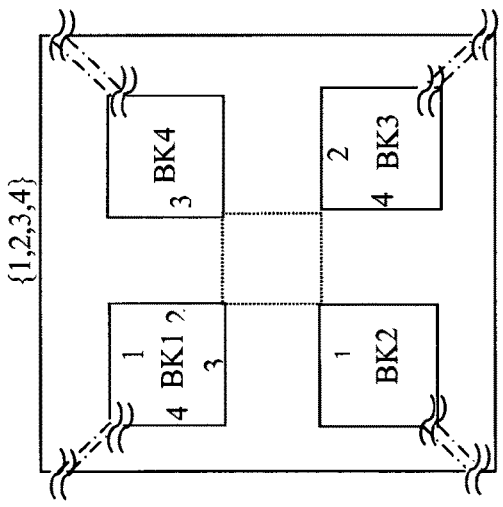
FIG.54B
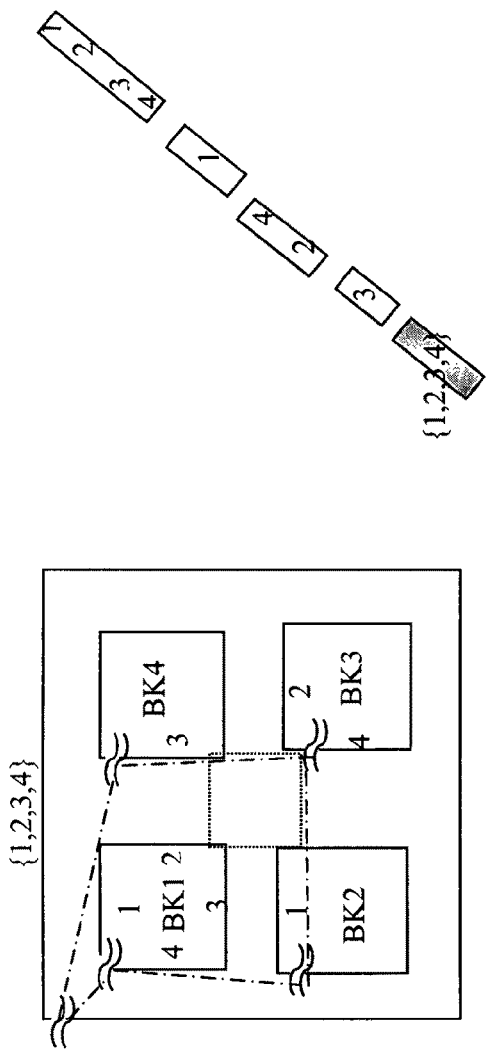
FIG.53A
FIG.54A

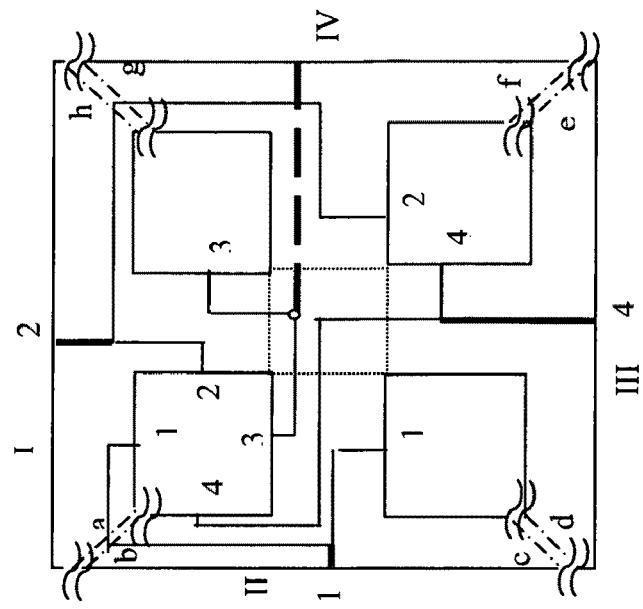
FIG.54E
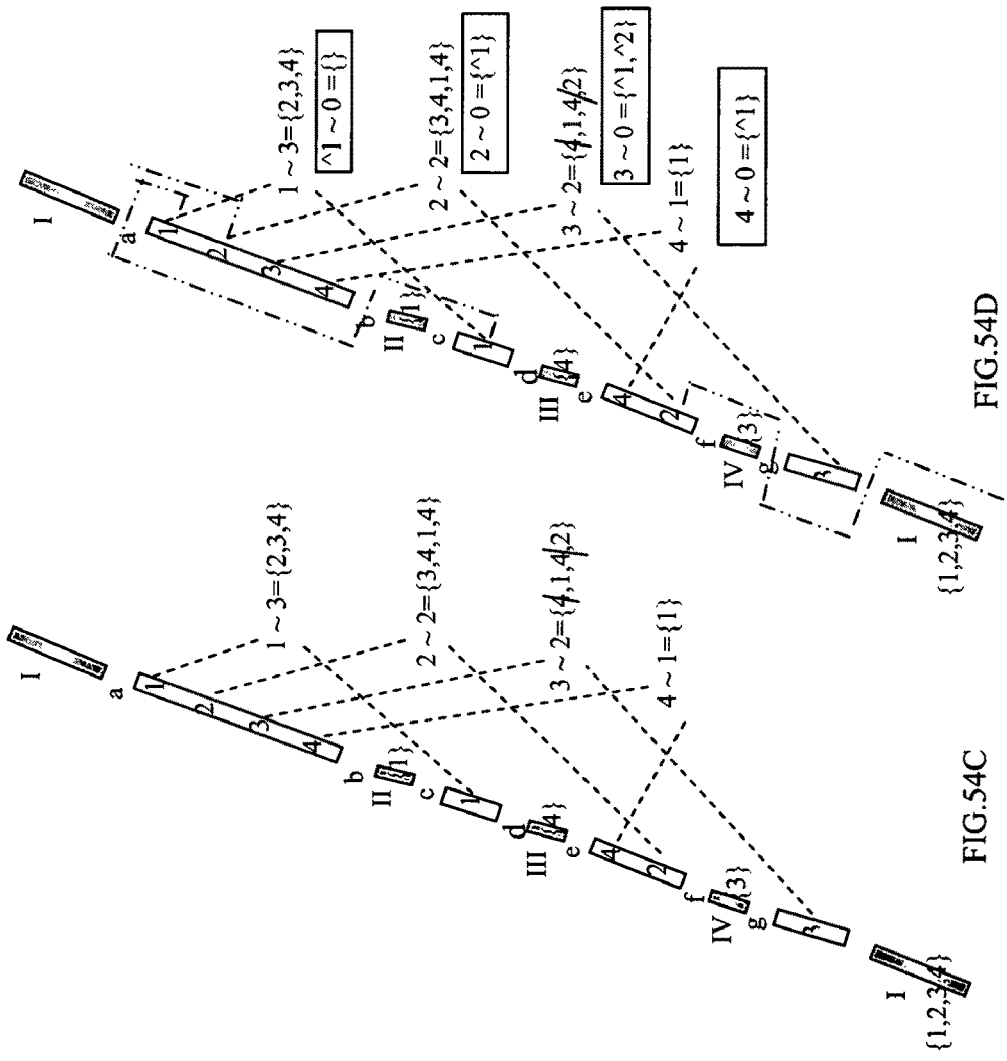
FIG.54D
FIG.54C

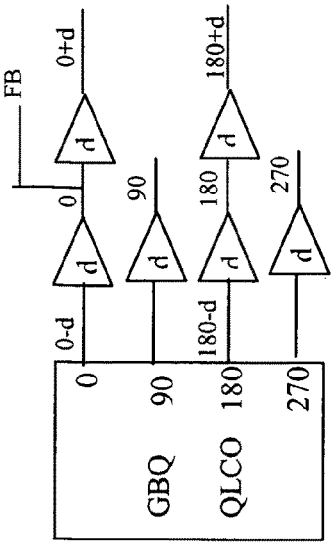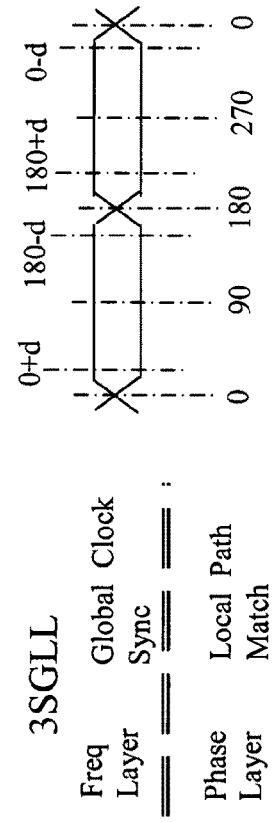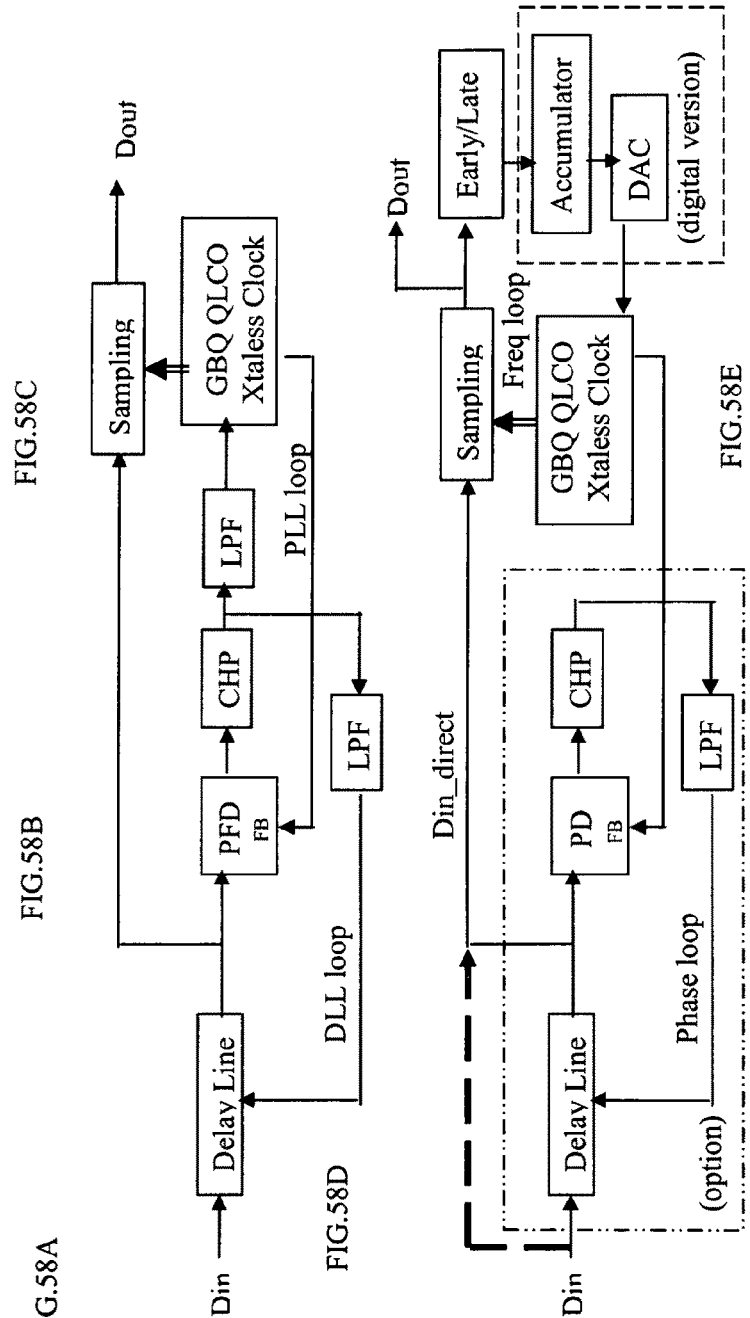
FIG. 58A
FIG. 58B
FIG. 58C
FIG. 58D
FIG. 58E

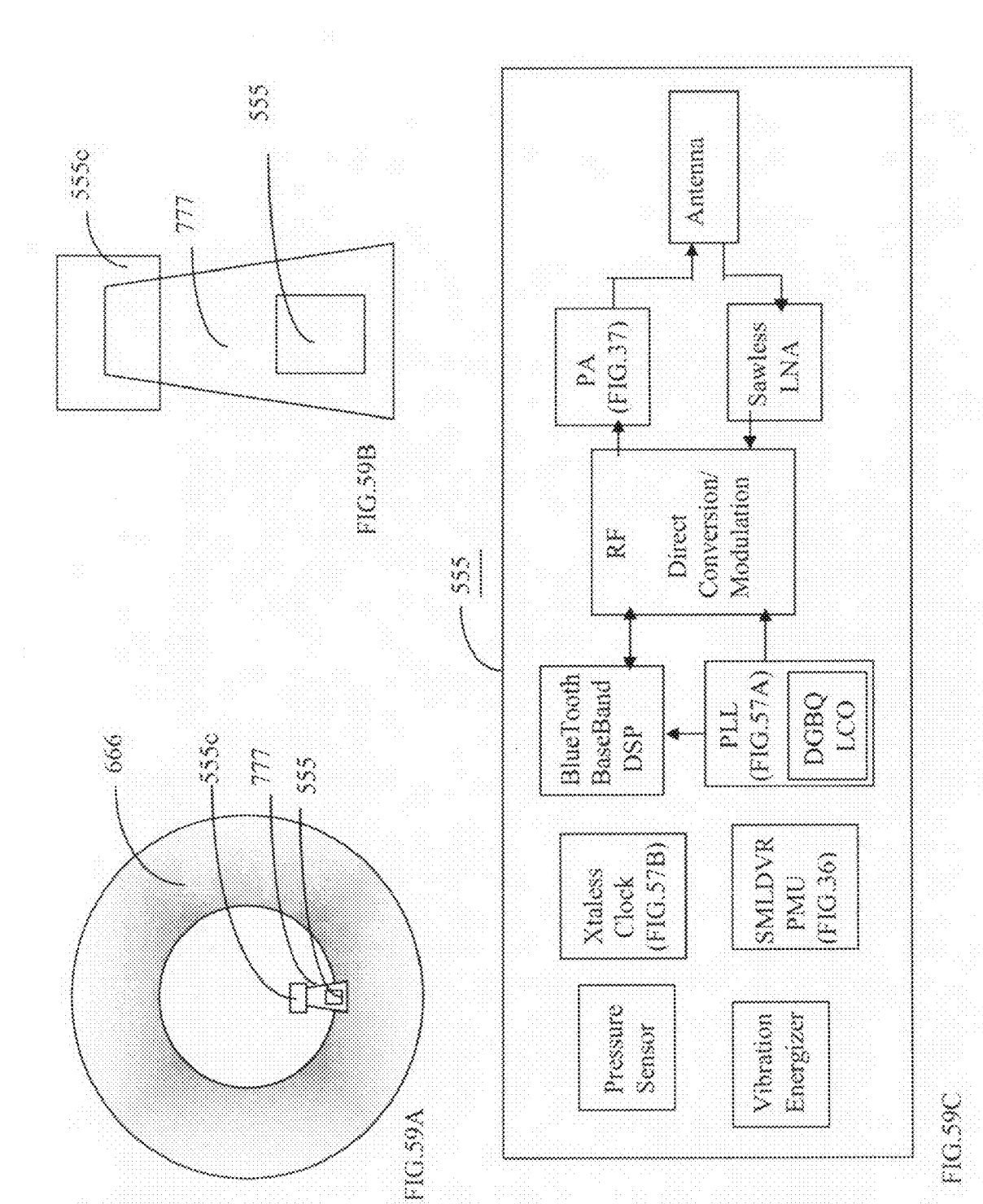

VARACTOR-FREE AMPLITUDE CONTROLLED OSCILLATOR(ACO) FOR SYSTEM ON CHIP AND SYSTEM ON CARD XTALESS CLOCK SOC

This is a Continuation in Part application claims priority of application Ser. No. 11/593,271 filed on Nov. 6, 2006, now U.S. Pat. No. 7,511,589, application Ser. No. 11/500,125 filed on Aug. 5, 2006, now U.S. Pat. No. 7,525,392, application Ser. No. 12/079,179 filed on Mar. 25, 2008, application Ser. No. 12/082,601 filed on Apr. 12, 2008, application Ser. No. 12/229,412 filed on Aug. 23, 2008, application Ser. No. 12/288,770 filed on Oct. 23, 2008 now U.S. Pat. No. 7,663,349, and a series of other applications following this prior application which herein incorporated by reference in its entirety.

BACKGROUND

1. Field of Invention

Every chip needs the clock and the power supply. Therefore, the green chip platform must include both the clock and power supply. The crystal is a mechanical resonator. It takes a lot of energy to drive the mechanical resonator to oscillate. Furthermore, the size of crystal is too large to integrate into the chip package. Therefore, it is ideal to use the electronic resonator to replace the mechanical resonator.

Ideally, the electronic facility should have the better performance than the mechanical facility. Therefore, the electronic resonator should have the better performance than the mechanical resonator. However, for one hundred years, we still use the crystal to be the reference of oscillator. To be miniature, the on-chip MEM was adopted to be the reference. However, after several years of trial, the MEM project almost all fails.

The only survival is the LC resonator. However, the previous approach of the prior art used the frequency controller. It is based on the open-loop free-running oscillator. It suffers the low Q, temperature, humidity and package problem. Since there is no other clock reference. The LC resonance itself is the final reference. It is impossible to measure the frequency deviation to make the frequency correction with feedback control.

Therefore, we make the innovation of VFACO Varactor Free Amplitude Controlled Oscillator to be the MS0-GBQ-AMC LCO. MS0 represents the Moisture Sensitivity level is Zero. The clock frequency is independent of the humidity moisture level to be constant. GBQ represents the Gain-Boost Quality factor Q. AMC is the AMplitude Controller. In contrast to the open-loop free-running frequency controller of the prior art, the Amplitude Controller AMC is a closed-loop feedback control. The frequency is function of the amplitude. $f=f(A)$. We can control the amplitude A of the LC resonance to control the frequency.

The planar-inductor design is the key component of the MS0-GBQ-AMC LCO. MS0 is the component/device GBQ is the circuit level. AMC is the system level. With the innovations in component/device level, circuit level and system level, we make the on-chip Xtaless ClockChip dream come true. With the green-technology, our Xtaless ClockChip has the superior performance: (1) Ultra-High Q Clock Performance and EMI-free (a guided magnetic field flux) inductor or transformer: (2) Since the self-compensation that only the $2^{nd}$ order variance is left to be the Trimming-less. As the $2^{nd}$ order is negligible for the low performance clock, it can even be trimming-free to save the cost of test and calibration (3) Plastic-Package-able & IP-able: (4) Ultra-Low Cost (CMOS compatible): (5) It is the only "marketing-ready" real clock "product" design.

The planar-inductor also can apply to the PCB for large power handling capability. The derived products are the versatile sockets and plugs for the green technology. For the safety purpose, the Vialess-ESD-PCB and planar-inductor work together to serve as the platform of the system level green technology. To have the 100% protection for all the signal, each net has to have one via for the ESDS Electrostatic Discharge Switch. There is the requirement to minimize the number of vias. The smart via assignment algorithm is developed to have the global via minimization. Based on our innovative methodology. The algorithm is developed for circular linear placement.

2. Description of Prior Art

In the System-On-Chip SOC technology, all the on-board components are trying to merge into the chip. The components cannot be merged, then new circuits are developed to replace the function of these components. As the component is merged into the chip, it saves power and resource. It meets the requirement and developing trend of the Green Technology.

Every chip needs the power and clock that the clock is the first to be considered merged on-chip. There are many ways to approach this problem. However, all the pioneers still followed the crystal concept that all of them used the MEM to be the reference resonance. However, the MEM approach has many defects of the aging problems, etc. The cost is high. It cannot compete the crystal oscillator, either. Therefore, the MEM approach has died.

So, the MEM clock companies switches to the LC resonator approach. However, they still use the traditional crystal resonator approach. The crystal resonator is free running. You cannot control the crystal lattice resonation. The prior art of LC resonator uses the free-running methodology, too. Therefore, the prior art put a lot effort to improve the quality Q of the inductor and let the LC resonator open-loop free running. This open-loop free-running methodology is named as the frequency control. However, there is no feedback control at all. The methodology just set the parameters for the temperature, then let the LC resonator to have free running. So, it should be named as the frequency-set instead of the frequency control. Their frequency control is actually not frequency control. There is no such function of freq=f(freq). Frequency is the controlled object. It is wrong to use the frequency to control the frequency itself. Controlling the frequency should be based on the other parameters instead of the frequency itself. Therefore, the traditional frequency controller becomes an open-loop free running. There is only parameter set for the frequency. There is no closed-loop feedback control for the frequency control.

Many people can design LC resonator, however, none of them can design the Xtaless Clock. The design of VFACO Varactor Free Amplitude Controlled Oscillator Xtaless Clock is completely different form the design of Voltage Controlled Oscillator VCO type LC resonator. The prior arts use the conventional Voltage Controlled Oscillator VCO type LC resonator design methodologies to design the Xtaless Clock. The Voltage Controlled Oscillator VCO type LC resonator has the essential self-oscillation-induced phase noise problem. It has no way to use as the LCO of the clock chip. This is the essential disaster problem of the Voltage Controlled Oscillator VCO type LC resonator to serve as the clockchip. However, nobody recognized the disaster problem. It causes the phase noise and the performance is 50 ppm over temperature variation. However, the market requirement is 1 ppm.

Therefore, the prior arts of VCO type LC resonator clock-chips go nowhere. After many years, the prior arts still fail to recognize the essential characteristics of the Xtaless Clock-Chip.

The integrated LCOs exhibit a substantially linear negative temperature coefficient (TC). To stabilize the TC, a method of the varactor diode is introduced. The capacitance of the varactor diode has the minor variance during the oscillation of the LC oscillator. The minor variance of the capacitance of the varactor diode will generate the serious Close-To-Carrier phase noise problem. Furthermore, the on-chip inductor has low Q factor. The Q factor has the inverse-square relationship with phase noise. Consequently, it is expected that the close-to-carrier (CTC) phase noise of the LCO will be substantially higher than for a comparable XO. This makes the LCO poorly suited to RF applications due to concern over reciprocal mixing and the associated degradation in receiver sensitivity.

Even worse, in the prior art, the resonant frequency varies according to the humidity. As the moisture level changes, the LC resonant frequency changes about 600 pans per million PPM between the Florida and Las Vegas. Therefore, they have to use the ceramic package to walk around the problem. However, it only solves the short-term test problem. It doesn't solve the long-term user problem. In the short-term test, changing the humidity of the test chamber, it doesn't see the problem. However, in the long run of the field application, it still shows the frequency drift due to the humidity moisture change. Even using the ceramic package doesn't solve the humidity moisture level problem, either. However, the prior an still doesn't recognize the moisture sensitivity level problem for the Xtaless ClockChip at all.

What is the difference? the Methodology. In the Elementary School, you use the Arithmetic to solve the problem. In the University, you use the Calculus to solve the same problem. Similarly, the prior art used the undergraduate EE student circuit theory to solve the LC resonator problem. They set the LC parameters and let it free running. They named the set of LC parameters to be frequency control. Actually, there is no control at all. We are able to use the most advanced Circuit and System Design Methodology to solve the LC resonator problem. Why is our approach superior to the prior arts? The simple terms are the "Design Methodology". With the most advanced Circuit and System Design Methodology, we use the anti-chaos circuit to control the chaotic LC resonator. However, the prior arts use the idealized LC resonator and the prior arts even don't know the real-life LC resonator has the parametric chaos circuit all. They just have the frequency parameter setting. They don't have the frequency control at all. From the functional relation, the frequency control is freq=f(freq). There is no such kind a function. Therefore, the prior arts actually have the frequency parameter setting. The prior arts don't have the frequency control at all. Actually, there is no such kind frequency control for the LC resonator frequency. This term "frequency control" for the LC resonator is completely violating the rigorous analytic methodology and philosophy.

The prior art clock chips are not "marketing-ready product" yet. There is no comparison between the prior Reference-free ClockChip with our Xtaless ClockChip. The prior-art clock chips are not "market-ready product" yet. The prior-art still have far way to go: they have a lot things to learn.

In our approach, we identify the functional relation of the amplitude controlling the frequency in the LC resonator. Then we controlling the amplitude to fix the frequency. The function relation is freq=f(amplitude). From the fundamental knowledge methodology and design philosophy, this amplitude control is a valid approach. However, the frequency control of the prior art is not a valid approach at all. If the fundamental methodology is not correct, how the prior arts can get the correct results? Therefore, the prior arts used the "curve fitting" to fit for the test bench calibration results. There are so many parameters varying over such a long time and different environments. The prior art is a hopeless approach. However, the prior arts don't know the fundamental problem is their design methodology and the architecture and system based on the wrong design methodology, not the circuit itself.

Furthermore, we adopt the green technology platform approach. The Xtaless ClockChip technology can be extended to apply in the inductorless Power Management Unit PMU and the high power efficiency power amplifier. The inductor of the PMU and PA can be implemented with the on-chip planar inductor to be the inductorless PMU and inductorless PA. It saves a lot of energy and resource to be the green chip of the green technology.

Objects and Advantages

The green technology platform is constituted of the clock and power. The power includes the PMU and PA. The clock is the Xtaless ClockChip and the power is the no on board inductor Inductorless PMU and PA. All the Xtaless Clock-Chip. Inductorless PA and PMU are based on the planar inductor technology. Furthermore, the Xtaless ClockChip adopting the amplitude controller methodology, the Inductorless PMU adopting the ZVS Zero Voltage Switch methodology and the PA using the recycling-energy to have the high performance of the green chip technology platform.

The amplitude control for the Xtaless ClockChip is the closed-loop feedback control having the self-compensation capability. Even we still use the NVM for trimming of the $2^{nd}$ order effects, it can self-compensate and self-adaptive for the variance of the gain due to the variation of temperature, voltage, aging, etc. With the self-compensation design techniques, only the $2^{nd}$ order variance effect is left that the Xtaless ClockChip is able to be trimming-less or even trimming-free.

The conventional crystal technology is limited to the low frequency. However, the planar inductor can operate at the high frequency that the resonator technology can be extended to the high frequency operation inductorless PMU and inductorless PA to have the complete set of the green technology platform.

DRAWING FIGURES

FIG. 4 is to illustrate the parametric capacitors effect and the parametric bulk diode effect on the LC resonator: (A) is the LC resonator having both the parametric capacitors and the parametric bulk diode; (B) is the operation of the parametric bulk diode at the large amplitude; the equivalent capacitor for this parametric bulk diode is large; (C) is operation of the parametric bulk diode at the small amplitude; the equivalent capacitor for this small bulk diode is small: (D) is the signal flow block diagram to show the catastrophic effect of the temperature on the LC resonator.

FIG. 5 is to illustrate the temperature self-compensation capacitor; (A) is the MIM capacitor: (B) is the MOM type capacitor; (C) is the parallel or serial connection of MIM capacitor and MOM capacitor to have the temperature self-compensation: (D) is the MIOM capacitor to have the temperature self-compensation: (E) is the characteristics of versatile capacitors.

FIG. 6 is to show the innovation of self-compensate bulk diode topology to compensate for the bulk diode capacitance variation in the Varactor Free Amplitude Controlled Oscillator (VFACO) LC oscillation: (A) is the spectrum of the idealized LC resonator; (B) is the spectrum of the LC resonator having the frequency-tuning effect due to the variance of the bulk diode capacitance induced by the voltage-swing of the output voltage: (C) is the spectrum of the LC resonator having the self-compensation bulk diode capacitance for the voltage swing: (D) is the differential mode diode having the self-compensation bulk diode capacitance for the voltage swing; (E) is the differential mode NMOS having the self-compensation bulk diode capacitance for the voltage swing: (F) is the differential mode PMOS having the self-compensation bulk diode capacitance for the voltage swing; (G) is the differential mode NMOS and PMOS having the self-compensation bulk diode capacitance for the voltage swing: (H) is the parametric bulk diode compensation for the self-compensation bulk diode capacitance for the voltage swing as shown in FIG. 4A.

FIG. 7 is the Varactor Free Amplitude Controlled Oscillator (VFACO) having LC resonator with the amplitude controller: (A) is the Amplitude Controlled Oscillator (ACO) circuit schematic diagram of the amplitude controlling LC resonator: (B) is the operation curve of the Amplitude Controlled Oscillator (ACO) LC resonator with amplitude controller: (C) is the operation characteristics of the parametric bulk diode of the active MOS.

Figure 9:
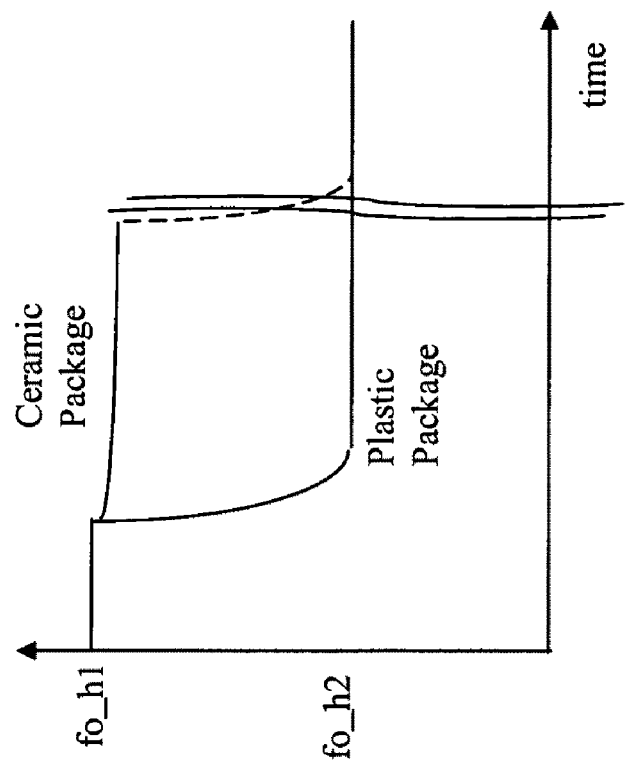
Figure 8:
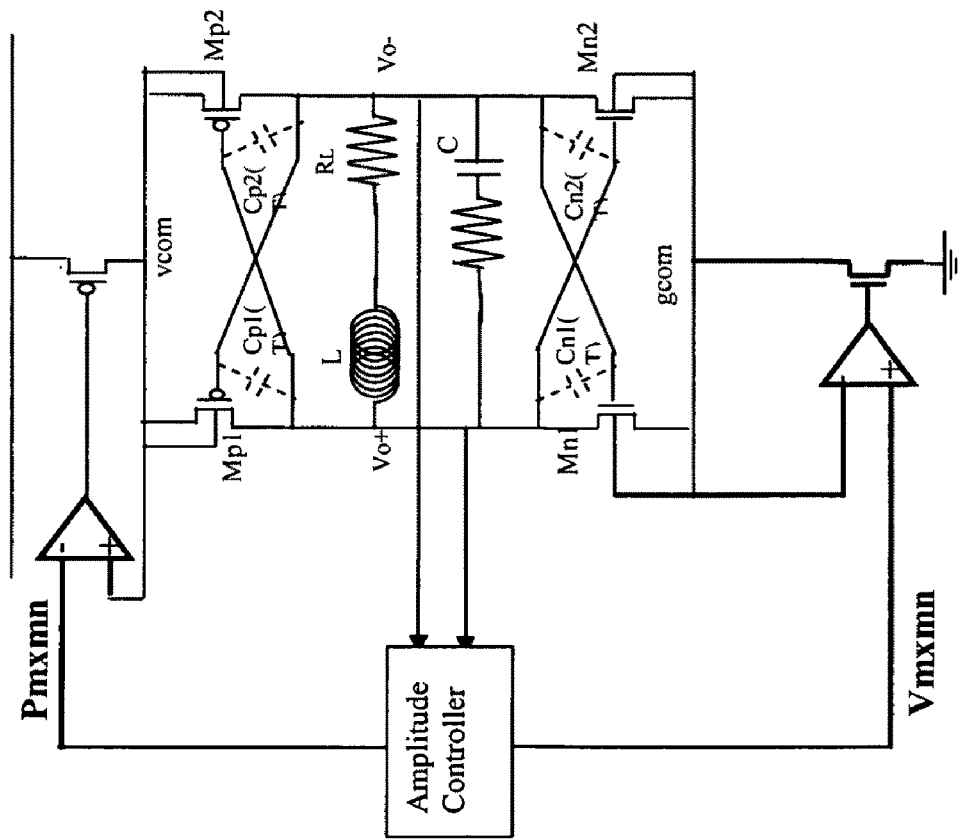

FIG. 8 is the alternative simplified design of the Amplitude Controlled Oscillator (ACO) LC resonator with amplitude controller:

FIG. 9 is the conventional LC resonator has the humidity moisture sensitivity and package problem.

FIG. 10 is the comparison between the LC resonator with the frequency controller and the LC resonator with the amplitude controller; (A) is the Voltage Controlled Oscillator VCO type LCO open-loop free running frequency controller LC resonator: (B) is the Amplitude Controlled Oscillator ACO type LCO closed-loop feedback controlling amplitude controller LC resonator.

FIG. 11 is the detailed block diagram of the Voltage Controlled Oscillator VCO type LCO open-loop free running frequency controller LC resonator; (A) is the conventional open-loop free running frequency controller LC resonator which only has the parameter setting functions for the free-running LC resonator; (B) the signal flow of the frequency controller is varactor capacitance; (C) is the operation of the open-loop free running frequency controller LC resonator with the frequency-test-curve-fitting methodology to fit for the frequency variation.

FIG. 12 is the detailed block diagram of the Amplitude Controlled Oscillator ACO type LCO closed-loop feedback controlling amplitude controller LC resonator; (A) shows the amplitude controller having masked out the gain variance due to the aging, temperature and process, etc; (B) the signal flow of the amplitude controller is oscillation amplitude: (C) is the operation of the closed-loop feedback controlling amplitude controller LC resonator.

FIG. 13 is the non-linear Kvco for the closed-loop feedback controlling amplitude controller LC resonator in PLL: (A) is the characteristic curve of the non-linear Kvco: (B) is the timing waveform $\Delta t$ of the PFD in PLL: (C) is the implementation of the non-linear Kvco with the timing waveform of the PFD to be the $\Delta f$, where the $\Delta f \sim t/\Delta t$.

FIG. 14 is the low latency controller circuit for the LC resonator with the power management and spread spectrum capabilities; (A) is the circuit block diagram of the low latency controller circuit for the LC resonator with the power management and spread spectrum capabilities; (B) is the operational characteristics curve of the low latency controller circuit for the LC resonator; (C1) is the block diagram for the Iptat, Iptat_linear and temperature sensor; (C2) is the circuit implementation for the block diagram in FIG. 14C1; (D1) is the block diagram for the Ictat, Ictat_linear, Ibg_linear and Vbg_linear: (D2) is the circuit implementation for the block diagram in FIG. 14D1.

FIG. 15 is the SSEML Scalable Single End Multiple Level PMU Power Management Unit interface: (A) is the protocol of the SSEML: (B) is the interface between the Xtaless ClockChip and the other chip: (C) is the block diagram for the SSEML in the Xtaless ClockChip; (D) is the detailed state transition block diagram for the SSEML in the Xtaless ClockChip: (E) is the operation of the SSEML in the Xtaless ClockChip to reduce the power of LC resonator without changing the clock frequency.

Figure 16:
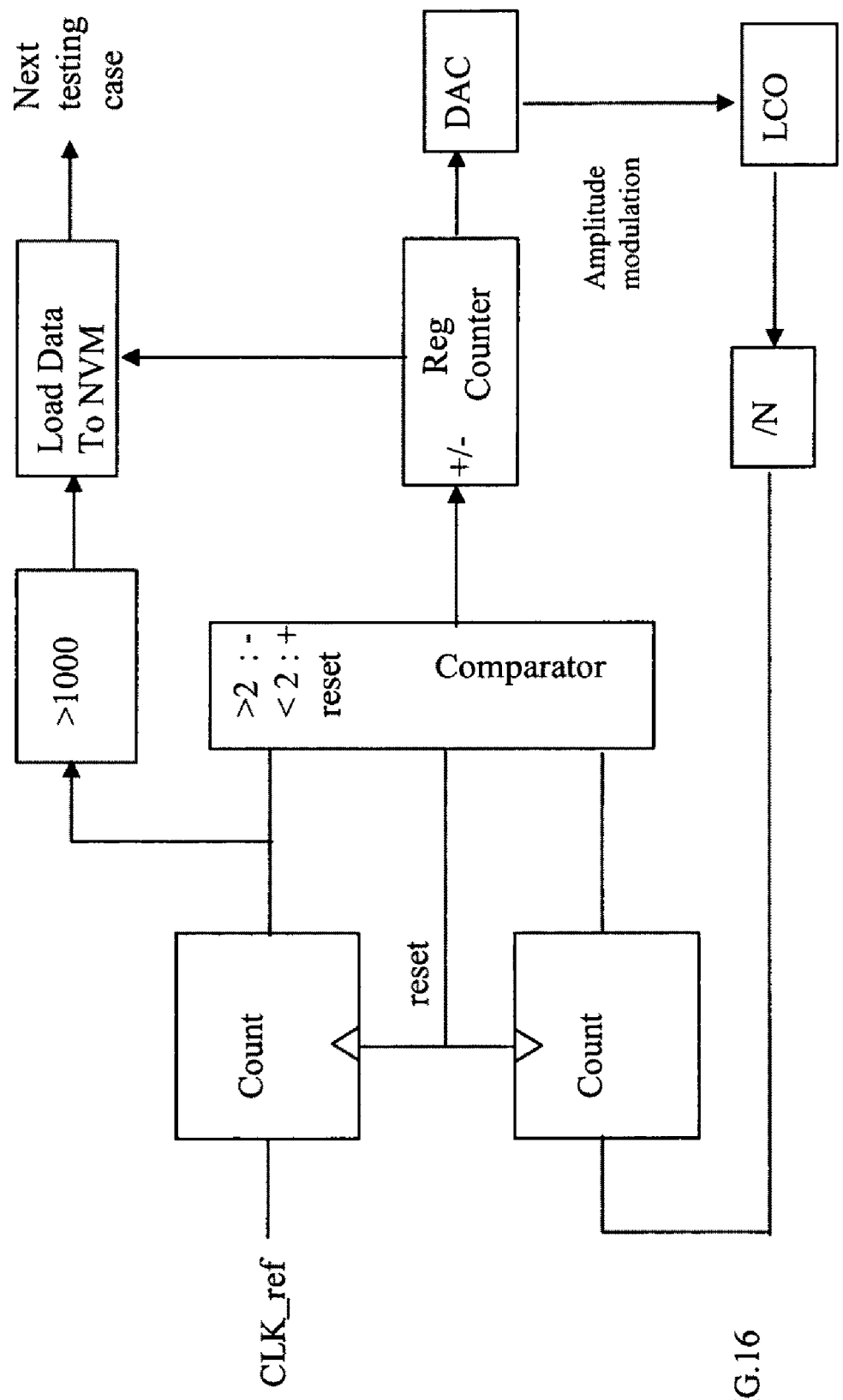

FIG. 16 is the fast flying-scan calibration/test circuit for LC resonator.

FIG. 17 is the amplitude controller for the LC resonator: (A) is the circuit schematic of the amplitude controller LC resonator: (B) is the amplitude reference generator; (C) is the common mode generator.

Figure 18:
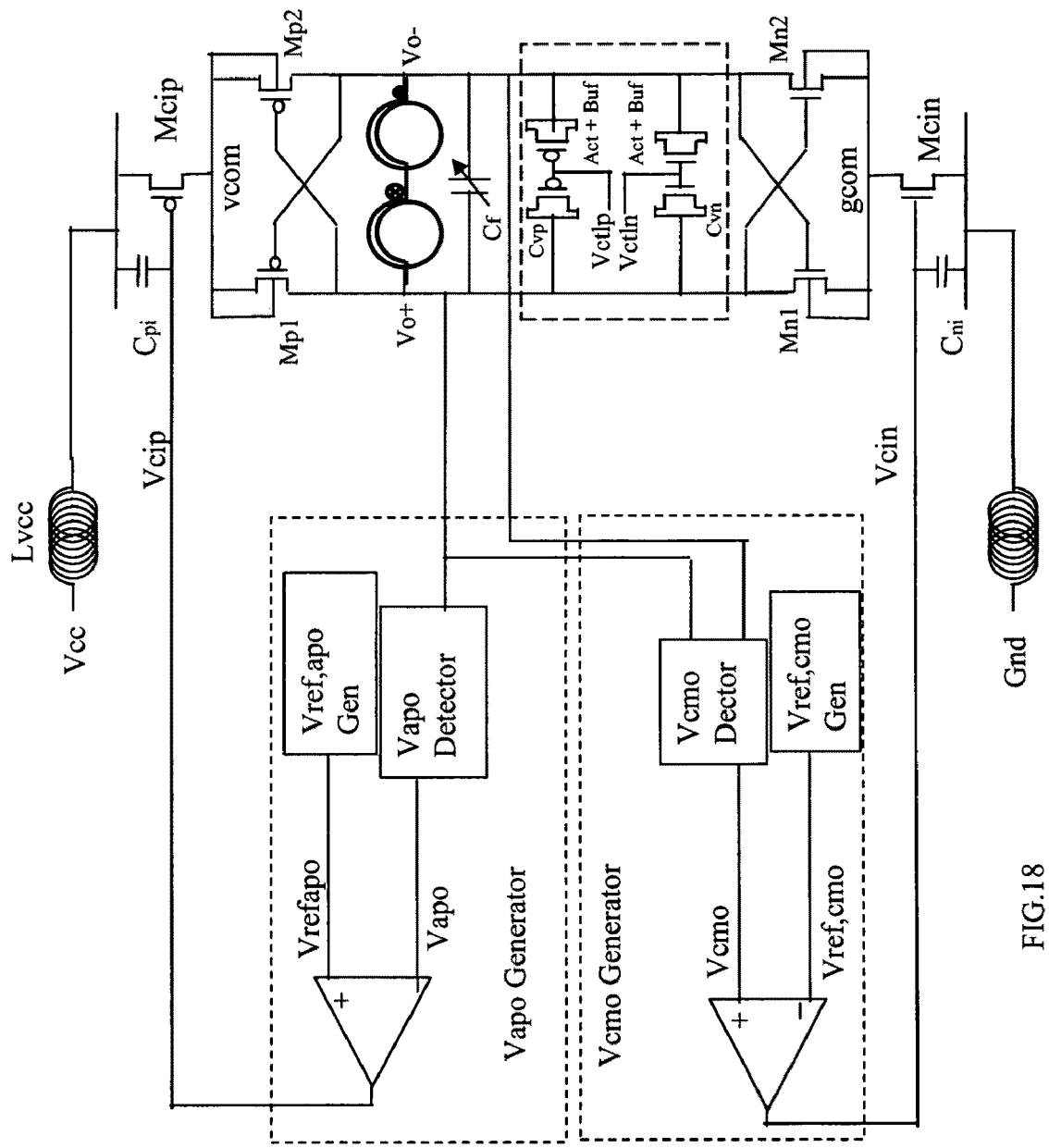

FIG. 18 is the amplitude controller for the LC resonator with the addition of the bulk diode to compensate the capacitance variance due to the voltage swing. The polarity of the bulk diode is reverse of the conventional frequency control type LC resonator.

Figure 19A:
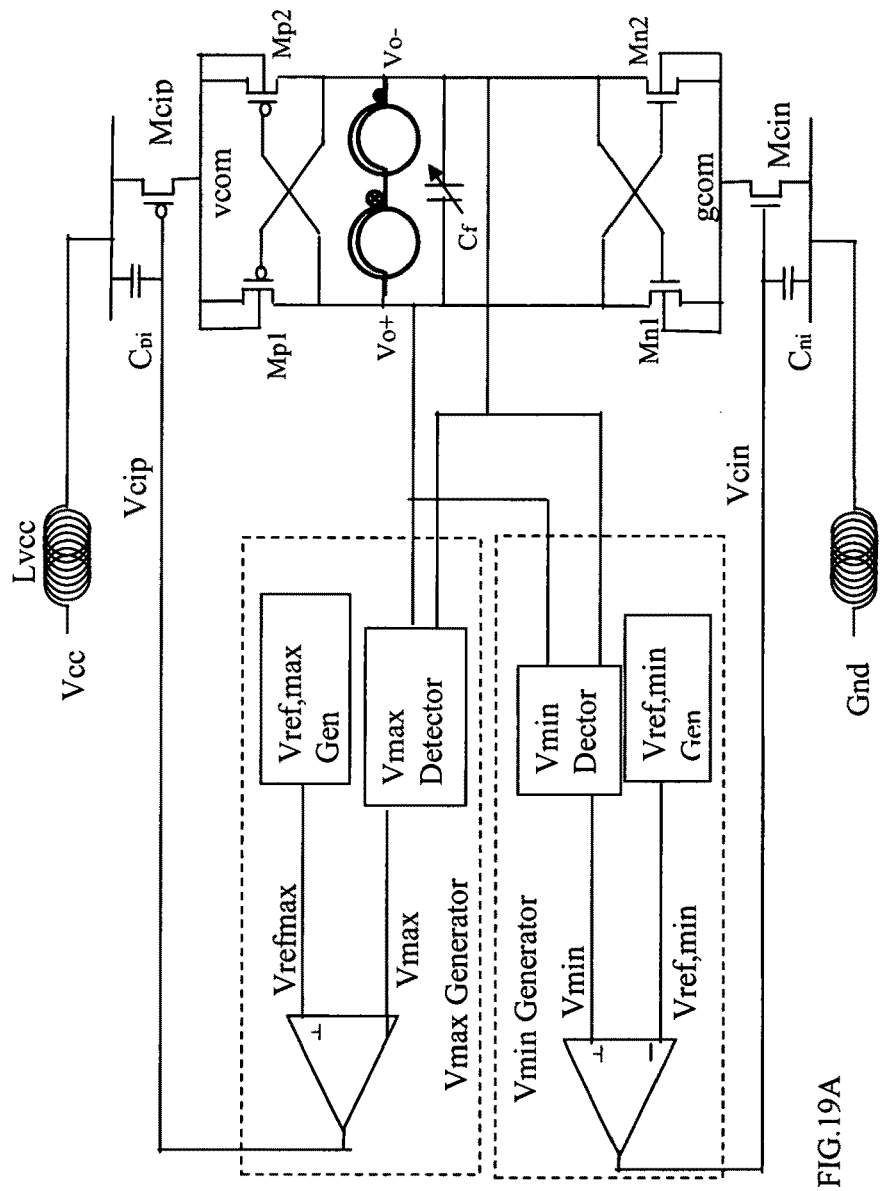

FIG. 19 is the alternative design of the amplitude controller for the LC resonator; (A) is the circuit schematic of the amplitude controller LC resonator: (B) is the maximum reference generator; (C) is the minimum reference generator.

Figure 20:
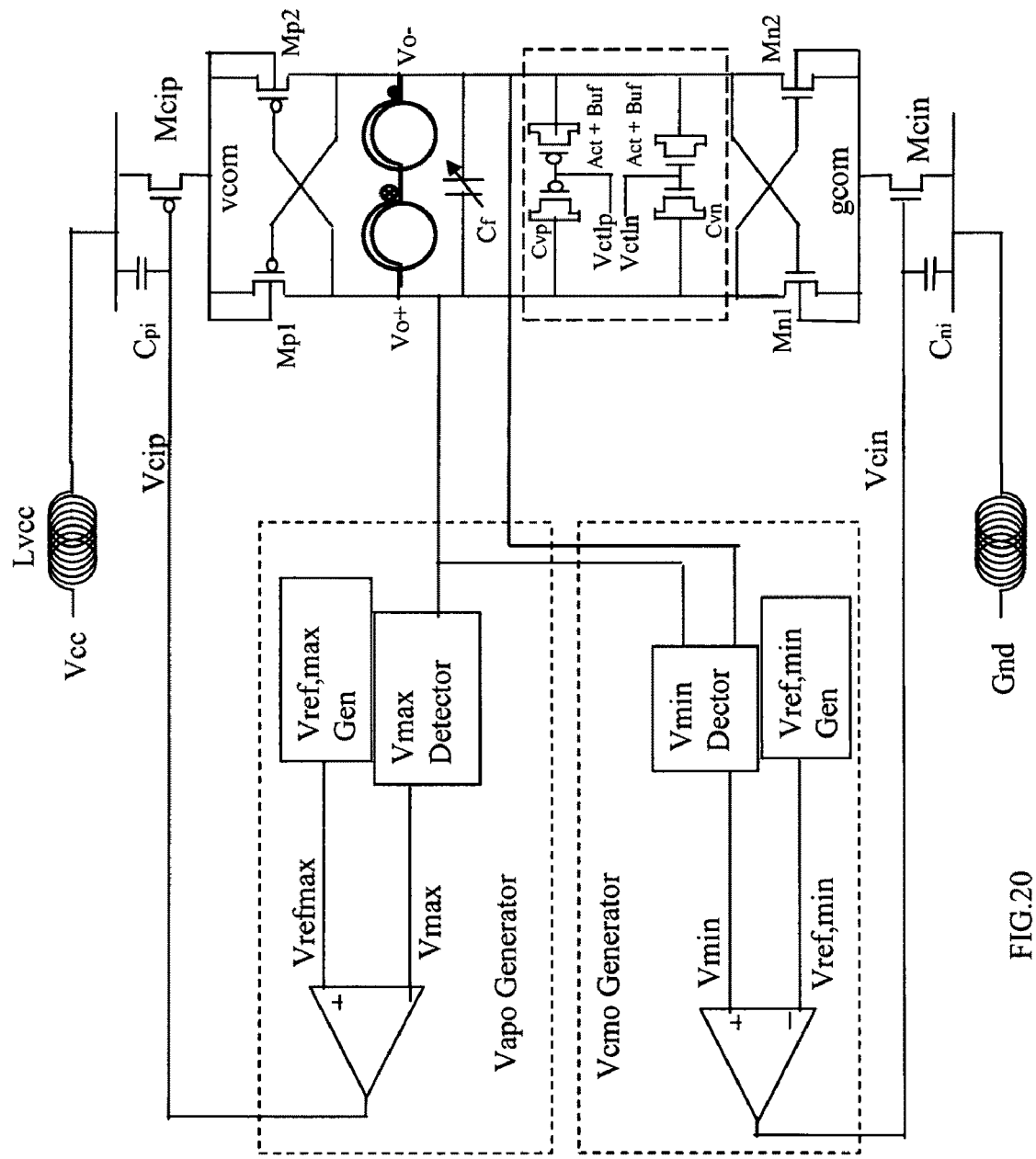

FIG. 20 is the alternative design of the amplitude controller for the LC resonator with the addition of the bulk diode to compensate the capacitance variance due to the voltage swing.

Figure 21:
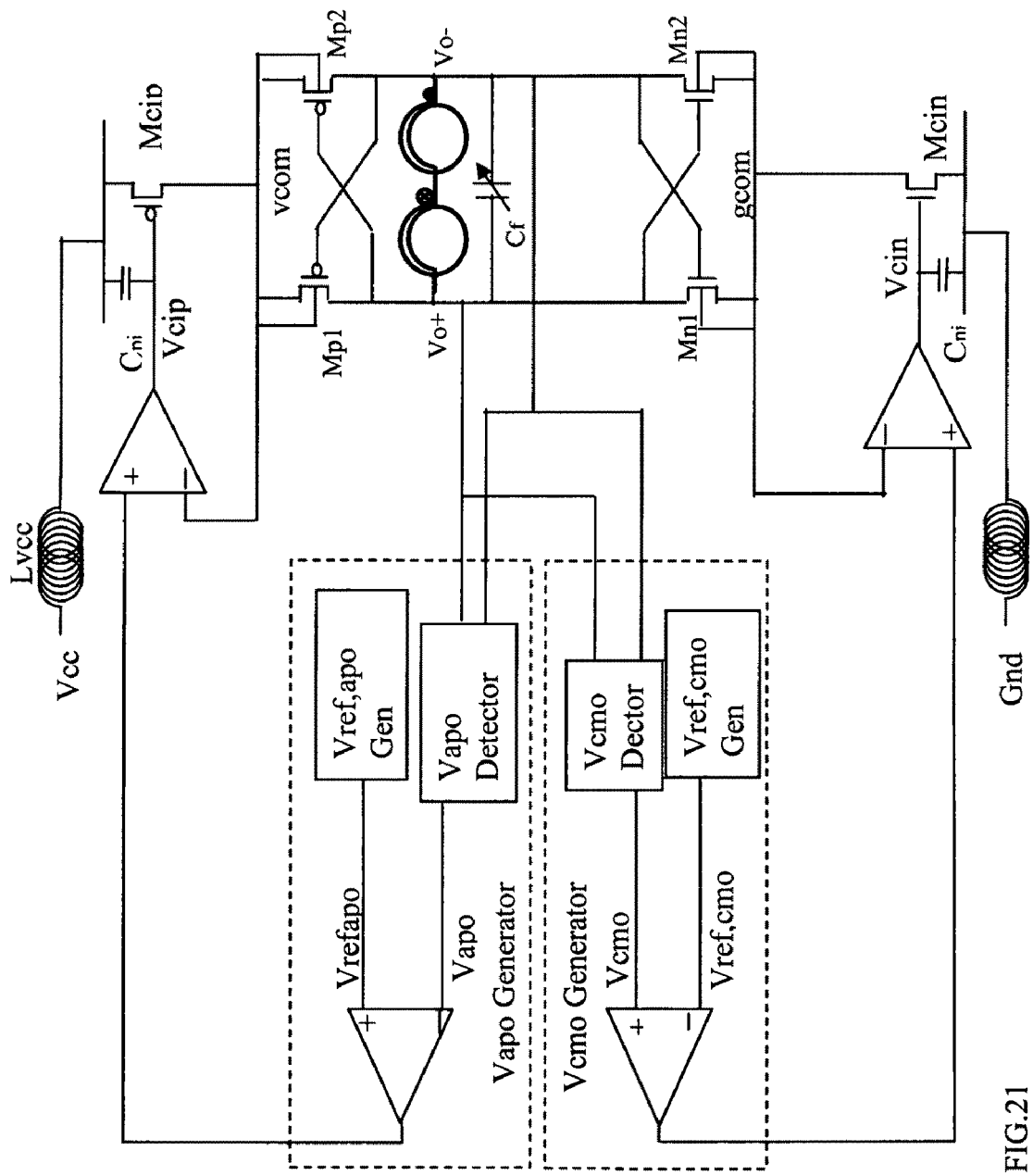

FIG. 21 is the alternative design of the amplitude controller for the LC resonator with the double gain-boost Q technology.

Figure 22:
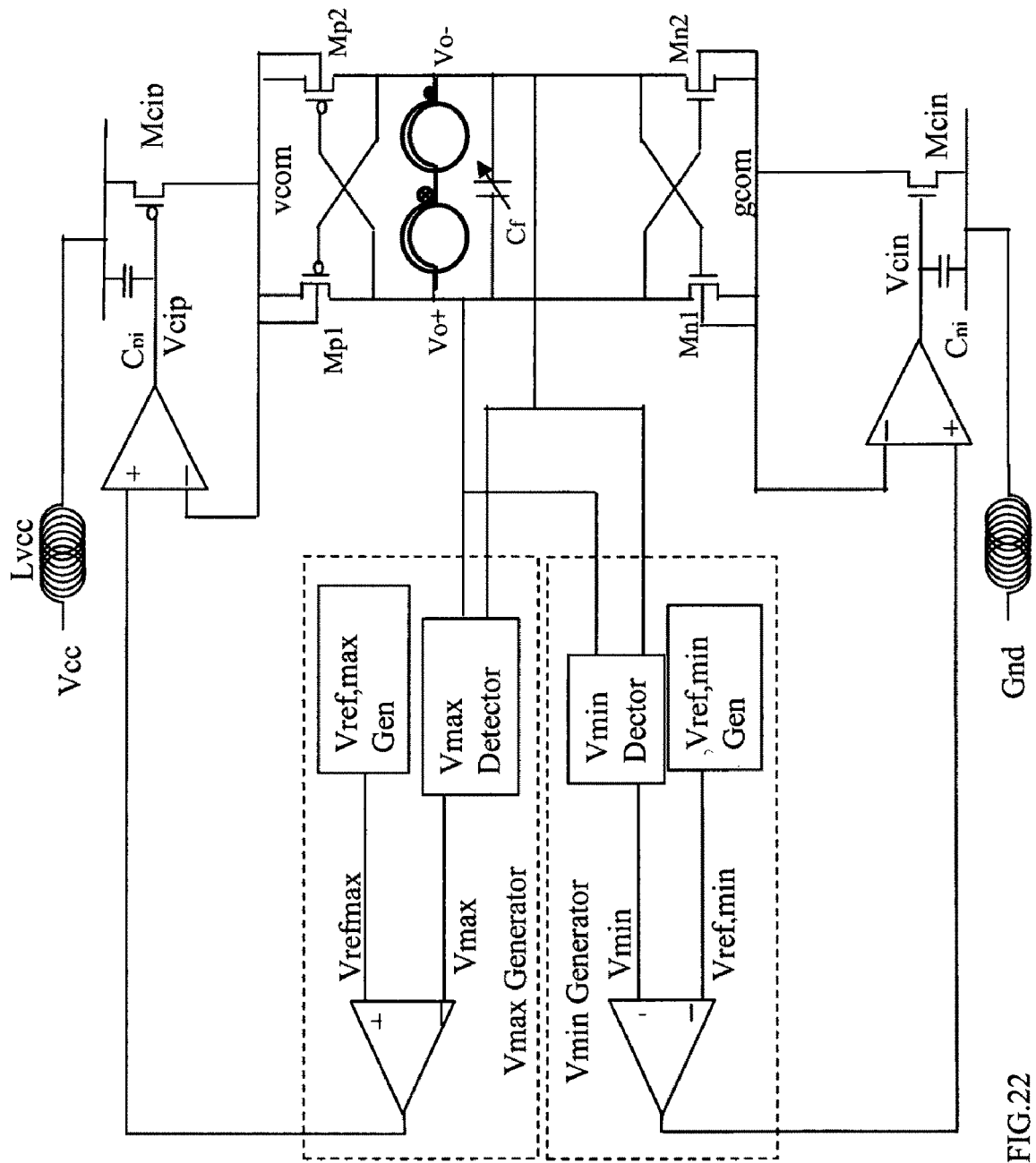

FIG. 22 is the alternative max-min type design of the amplitude controller for the LC resonator with the double gain-boost Q technology.

Figure 23:
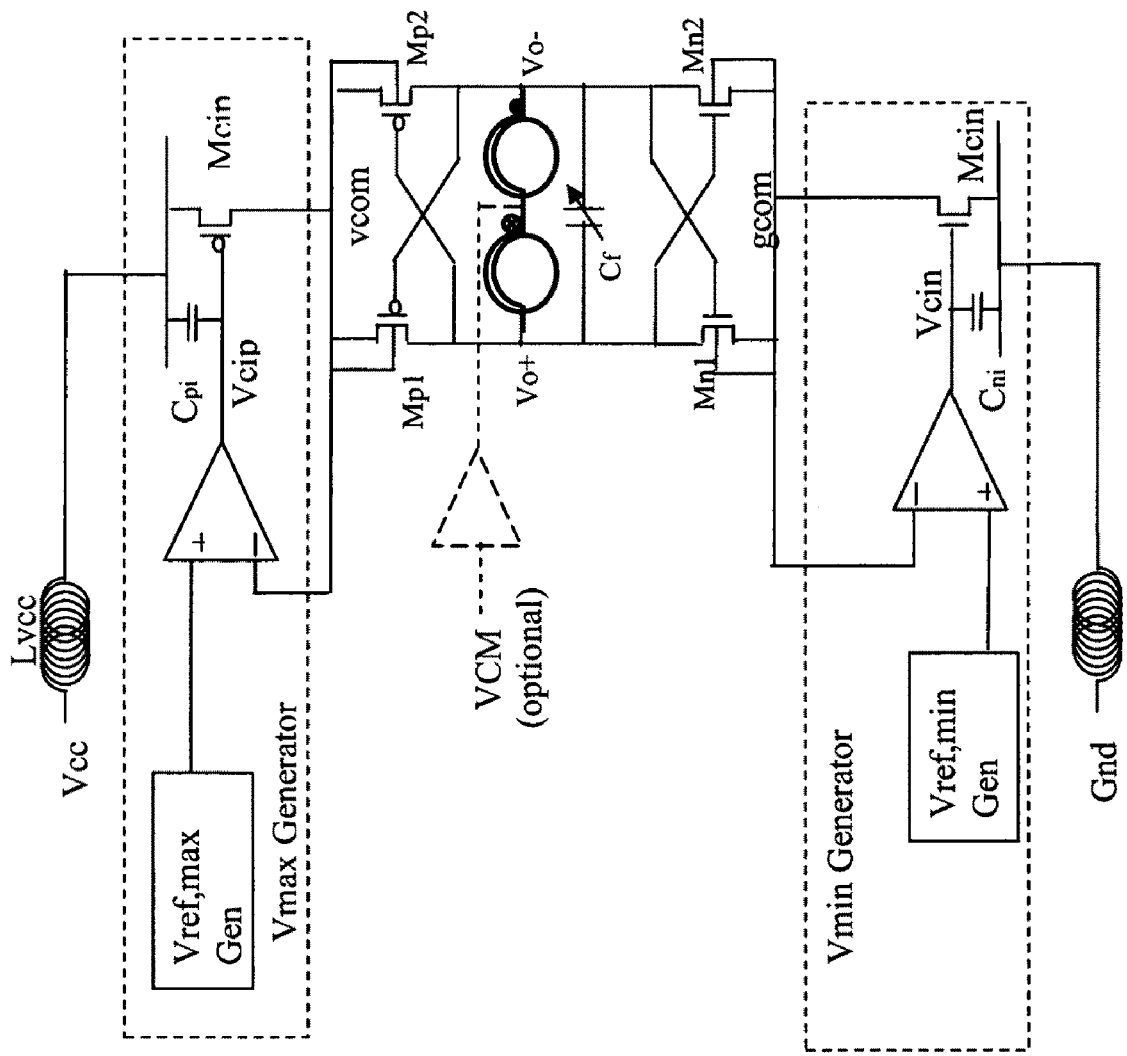

FIG. 23 is the simplified alternative design of the amplitude controller for the LC resonator with the double gain-boost Q technology.

FIG. 24 is the amplitude controller for the N type latched amplifier having the inductors as the active load: (A) is the amplitude controller for N type latched amplifier having the coupled planar inductor; (B) is the redraw of the amplitude controller for N type latched amplifier having the magnetic coupled inductor with the programmable supply voltage; (C) is the double gain-boost-Q DGBQ amplitude controller for N type latched amplifier having the coupled planar inductor; (D) is the redraw of the double gain-boost-Q DGBQ amplitude controller for N type latched amplifier having the magnetic coupled inductor with the programmable supply voltage.

FIG. 25 is the amplitude controller for the P type latched amplifier having the inductors as the active load: (A) is the amplitude controller for P type latched amplifier having the coupled planar inductor; (B) is the redraw of the amplitude controller for P type latched amplifier having the magnetic coupled inductor with the programmable supply voltage; (C) is the double gain-boost-Q DGBQ amplitude controller for P type latched amplifier having the coupled planar inductor: (D) is the redraw of the double gain-boost-Q DGBQ amplitude controller for P type latched amplifier having the magnetic coupled inductor with the programmable supply voltage.

FIG. 26 (A) is the amplitude controller applying to the source degenerated LC VCO: (B) is the amplitude controller applying to the high-frequency LC VCO design using capacitive degeneration.

FIG. 27 is the amplitude controller applying to the quadratic QVCO; (A) is the amplitude controller applying to the electric coupling quadratic QVCO: (B) is the amplitude controller applying to the magnetic coupling quadratic QVCO.

FIG. 28 is the amplitude controller applying to the crystal oscillator and the FBAR oscillator: (A) is the section view of voltage-tunable film bulk acoustic resonator (FBAR): (B) is the electric model of the film bulk acoustic resonator (FBAR): (C) is the amplitude controller applying to the crystal oscillator; (D) is the amplitude controller applying to the FBAR oscillator.

Figure 29D:
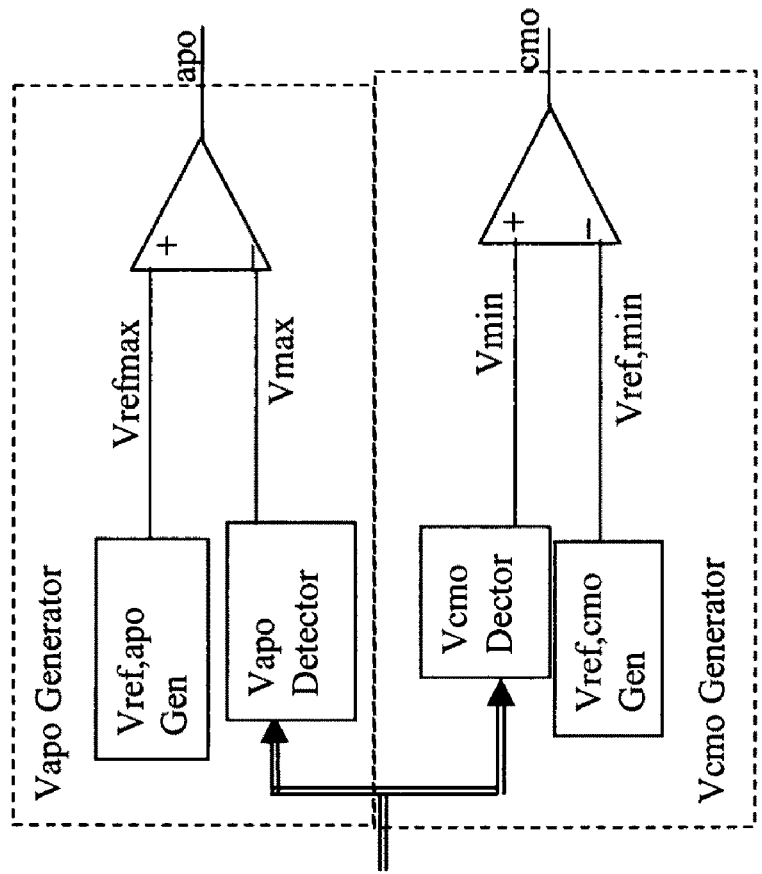

FIG. 29 (A) is the conjugate current mode amplitude controller for the LC resonator; (B) is the conjugate voltage mode amplitude controller for the LC resonator; (C) is the conjugate voltage mode amplitude controller for both power supply and bulk diode control of the LC resonator; (D) is the block diagram of the amplitude controller.

FIG. 30 is the comparison between the conventional frequency controller LC resonator and our amplitude controller LC resonator: (A) is the open-loop free-running frequency controller; (B) is the closed-loop feedback controlled amplitude controller.

FIG. 31 is the spread-spectrum amplitude controller LC resonator; (A) is the spread spectrum generator being embedded in the amplitude controller (B) is one kind of the implementation of the spread spectrum generator with the TRNG true random number generator.

FIG. 32 (A) is the generic constant temperature resonator; (B) is the constant temperature Xtaless resonator: (C) is the constant temperature crystal resonator; (D) the constant temperature LC resonator.

FIG. 33 (A) is constant temperature MS0-GBQ-AMC-LCO Clock: (B) is the on-chip self-heating temperature compensation calibration system.

FIG. 34 is the single-chip PMU system for the LCD TV.

FIG. 35 are the versatile sockets for modern home: (A) is the AC socket and the smoker socket; (B) is the AC socket, the smoker socket and the USB socket.

FIG. 36 (A) is the circuit schematic for the smart socket and single chip PMU: (B) is the VZS voltage zero switching operation for the smart socket and single chip PMU: (C1) is the unified SMLDVR switch mode and low drop voltage regulator; (C2) is the operation curves in the SMLDVR and idle mode to save the power: (D) is the configurable boost and buck SMPS.

FIG. 37 is the common mode applying to the envelop extraction recovery EER of power amplifier: (A) is the N type envelop extraction recovery EER of power amplifier; (B) is the P type envelop extraction recovery EER of power amplifier.

FIG. 38 (A) is planar inductor having the magnet loop being confined in a slice structure; (B) is the planar inductor symbol; (C) is the alternative planar inductor symbol.

FIG. 39 is the on-chip EMI-Free planar inductor: (A) is the top view of the EMI-Free planar inductor; (B) is the top view of the alternative design of EMI-Free planar inductor: (C) is the section view of the on-chip EMI-Free planar inductor planar inductor: (D) is the alternative different section view of the on-chip of the EMI-Free planar inductor: (E) the another different section view of the on-chip EMI-Free planar inductor: (F) is the soft magnetic material covering over and under the chip; (G) is the magnet covering over and under the whole chip: (H1) is the top view of the EMI-Free spiral-type planar inductor; (H2) is the section view of the EMI-Free spiral-type planar inductor: (I1) is the top view of the EMI-Free solenoid-type planar inductor: (I2) is the section view of the EMI-Free solenoid-type planar inductor; (J1) is the top view of the EMI-Free toroidal-meander-type planar inductor; (J2) is the section view of the EMI-Free toroidal-meander-type planar inductor.

FIG. 40 is the single integrated LC resonator; (A) is the inductor current flowing to charge up the top plate: (B) is the capacitor charge storage: (C) is the inductor current reverse flowing to charge the bottom plate: (D) is the capacitor reverse charge storage.

FIG. 41 is the dual integrated LC resonator; (A) is the inductor current flowing to charge up the top plate; (B) is the capacitor charge storage; (C) is the inductor current reverse flowing to charge the bottom plate: (D) is the capacitor reverse charge storage.

Figure 42A:
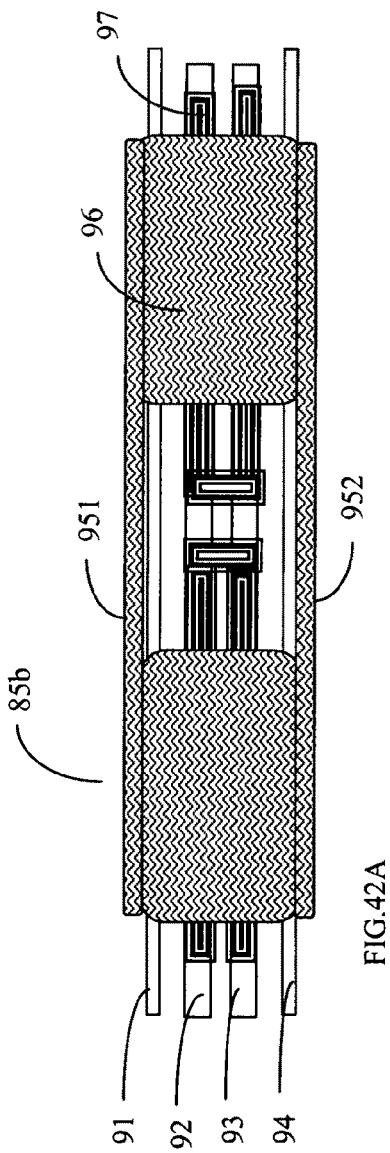

FIG. 42 is the PCB version on-board planar inductor; (A) is the section view of the embedded-in on-board planar inductor; (B) is the three dimensional 3-D view of the on-board planar inductor; (C) is three-dimensional view of the current loop for the on-board planar inductor.

FIG. 43 is the electric static discharge switch ESDS-PCB having the power and ground layer closing to the top and bottom layers: (A) is the section view of ESDS-PCB: (B) is the equivalent schematics of the ESDS-PCB: (C) is the section view of ESDS-PCB during the ESD; (D) is the equivalent schematics of the ESDS-PCB during the ESD.

FIG. 44 is the ESDS-PCB having the power and ground layer at the middle of the layers with the buried vias for high-speed high-frequency and RF circuits; (A) is the section view of ESDS-PCB: (B) is the equivalent schematics of the ESDS-PCB; (C) is the section view of ESDS-PCB during the ESD; (D) is the equivalent schematics of the ESDS-PCB during the ESD.

FIG. 45 is the ESDS-PCB having the power and ground layer at the middle of the layers with the contacting vias for low-speed low-frequency circuits; (A) is the section view of ESDS-PCB: (B) is the equivalent schematics of the ESDS-PCB: (C) is the section view of ESDS-PCB during the ESD: (D) is the equivalent schematics of the ESDS-PCB during the ESD.

FIG. 46 is the illustrated example of the two-dimensional 2-D placement and via assignment for ESDS IC, hybrid PCB and high acceleration high-g PCB, etc; (A) is the section view of the high-g PCB; (B) is the generic placement and route for the ESDS IC, hybrid PCB and high-g PCB, etc.

FIG. 47 is the 2-D placement and via assignment for ESDS IC, hybrid PCB and high-g PCB, etc for the switch box: (A) is the switch box; (B) is the circular topology of the switch box as shown in FIG. 47A: (C) is the boundary-split of the switch box; (D) is the linear placement for the switch box: (E) illustrates the "Tangs Theorem": for N 2-pin nets; there are at most (N−2) vias.

FIG. 48 is to illustrate the minimum-via maximum planarization algorithm; (A) building up the linear interval graph and calculates the "Tangs Distance" for the linear interval graph: (B) removing the net having the maximum "Tangs Distance" and update the "Tangs Distance" for the linear interval graph: (C) removing the net having the maximum "Tangs Distance" and update the "Tangs Distance" for the linear interval graph: (D) applying the "Tangs Theorem" to remove one via at the beginning and end of this linear graph; (E) is the final optimum via assignment for the switch box router.

FIG. 49 is to show the merge and remove of the 2-pin nets in the linear placement algorithms for the maximum planarization: (A) two successive pins belong to the same net can be merged: (B) the merged net is removed front the linear placement interval graph.

FIG. 50 is to show how to modify the multiple-pin nets to be multiple 2-pin net; (A) is the multiple-pin net: (B) with the pin-splitting, the multiple-pin net is split to be 2-pin nets.

FIG. 51 is the 2-D placement problem for the global via assignment with the maximum planarization FIG. 52 is the 2-D placement problem for the global via assignment with the maximum planarization and the boundary pin assignment.

FIG. 53 (A) is one kind of split for the boundary to convert the 2-D placement to be the circular linear placement problem: (B) is the corresponding circular linear placement to the 2-D placement as shown in FIG. 51A.

FIG. 54 (A) is the another kind of split of the boundary to convert the 2-D placement to be the circular linear placement problem: (B) is the corresponding circular linear placement to the 2-D placement as shown in FIG. 52; building up the linear interval graph and calculates the "Tangs Distance" for the linear interval graph: (C) is the alternative representation of the circular linear interval graph; (D) making the detour routine for the net having the maximum "Tangs Distance"; (E) is the optimum 2-D maximum planarization and minimum via assignment.

Figure 55:
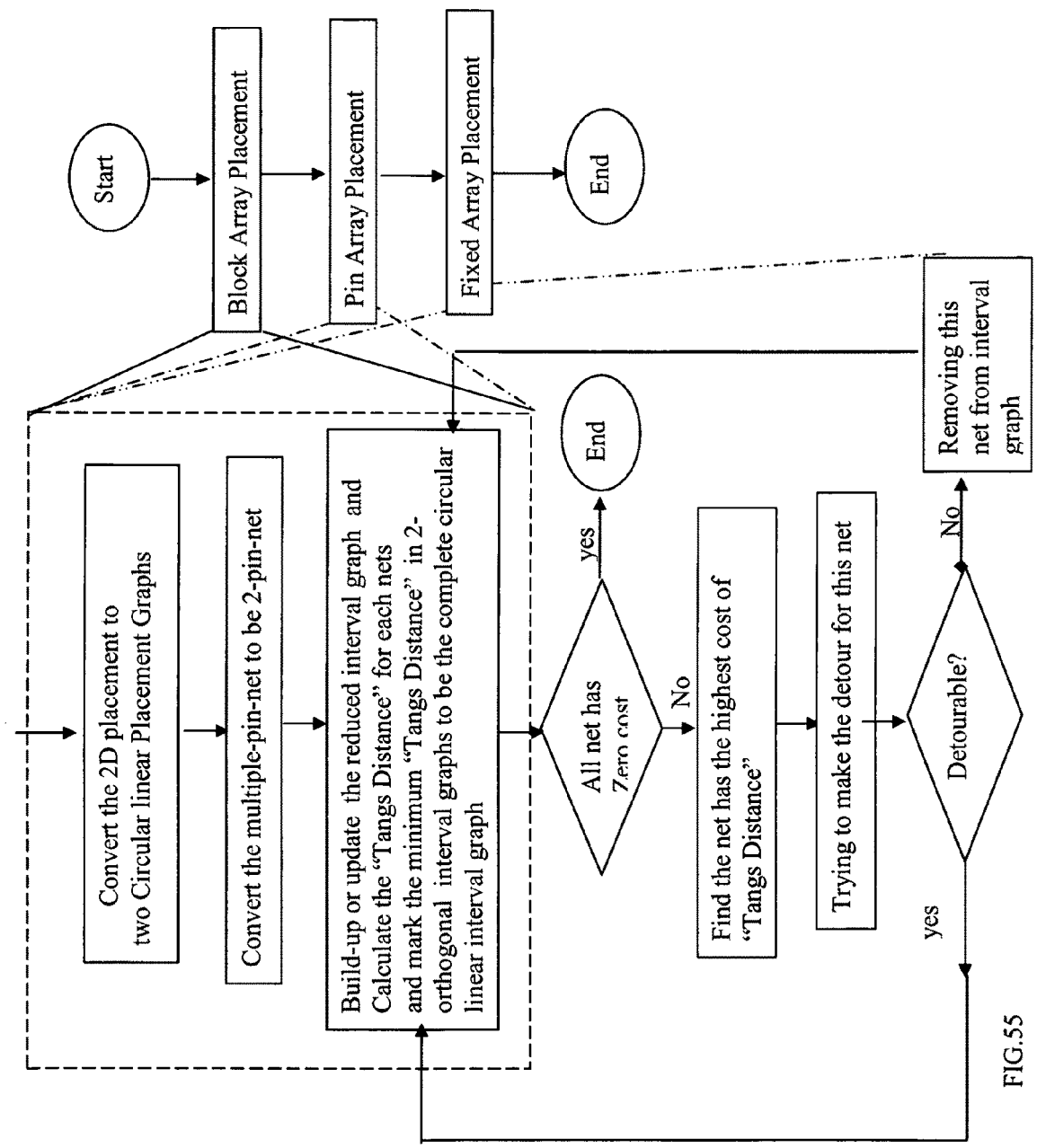

FIG. 55 is the flow chart for the optimum via assignment for maximum planarization and minimum via assignment.

FIG. 56 is the Xtaless ClockChip: (A) is the signal flow block diagram of the Xtaless ClockChip; (B) is the floor Planning and Layout of the Xtaless ClockChip.

FIG. 57 (A) is the Xtaless ClockChip including the PLL which can serve as IP of RadioChip. SerDesChip, etc: (B) is the Xtaless ClockChip using the frequency divider to replace the PLL to generate the clock.

FIG. 58 is the Super-Speed Synchronization Global Lock Loop 3SGLL for the USB-3 with the Xtaless ClockChip green technology: (A) is the hierarchical frequency layer and the phase layer of 3SGLL USB-3: (B) is the late and early CDR sampling; (C) is the circuit implementation of the late and early signal: (D) is generic 3SGLL USB-3 having the DLL, PLL and the Xtaless Clock; (E) is the PD for Phase Loop and Early/Late for Frequency Loop with the GBQ LCO as the high frequency Xtaless Clock.

FIG. 59 is the Green Safety Chip design for the tire safety with the Xtaless ClockChip green technology: (A) is the tire having the tire-pressure monitor; (B) is the tire-pressure monitor mounted on the stub: (C) is the block diagram of the tire-pressure monitor.

DESCRIPTION AND OPERATION

Figure 1:
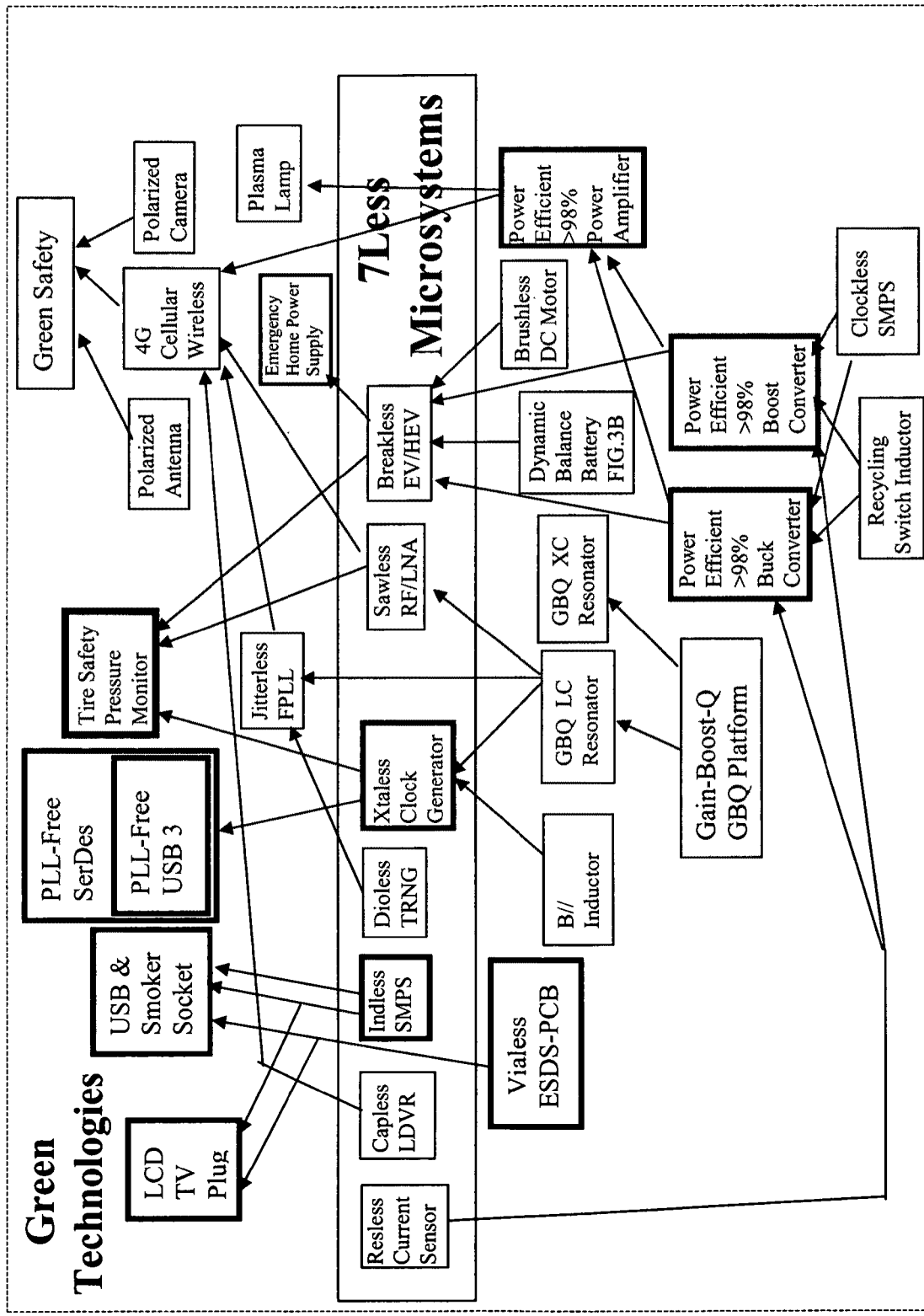
FIG. 1 is the platform of the green technology which includes the Xtaless clock. Inductorless PMU and PA.

Green Technology is very challenge. Shrinking the device size means both the save of the resource and energy. As shown in FIG. 1, the thick dark lines enclosed components are the key components of the green technology. The Xtaless clock and Inductorless PMA and PA are the backbone of the green technology platform.

For the MS0-GBQ-AMC Xtaless clockchip in the green technology, there are three key technologies, the MS0. GBQ and AMC. MS0 is the Moisture Sensitivity zero. The clock frequency is independent of the moisture level. GBQ is the Gain-Boost-Q. With the GBQ technology, the Q of the LC resonator can boost from 4 to 10,000,000. The AMC is the closed-loop feedback controlled Amplitude Controller. With our innovative three key technologies, the Xtaless clockchip will take over all the clock and frequency control market. From the design methodology and system perspective, the amplitude controller is completely different from the conventional frequency controller of the prior-arts.

In the undergraduate school basic circuit theory, the LC resonator is treated as the linear circuit to be "periodic circuit". The frequency controller of all the prior art is derived from the linear circuit theory. They use the set & go, open-loop free-running LC resonator approach. They set the parameters for the LC resonators first, then let the LC resonator free to run. In summary, the frequency controller of the prior art is the open-loop free-running methodology for the linear periodic LC resonator circuit.

With the graduate school nonlinear chaotic theory, we are the first to treat the LC resonator to be the nonlinear "chaotic circuit". The nonlinearity comes from the $2^{nd}$ order MOS device. The chaotic circuit is the quasi-periodic with random stochastic behavior which is corresponding to the periodic oscillation with littering of the LC resonator. For the chaotic circuit, we design the anti-chaos feedback-loop amplitude controller to eliminate the chaos from the nonlinear chaotic LC resonator. In summary, the amplitude controller of our innovation is the closed-loop feedback/feedforward-controller methodology for the nonlinear chaotic LC resonator circuit.

Figure 2B:
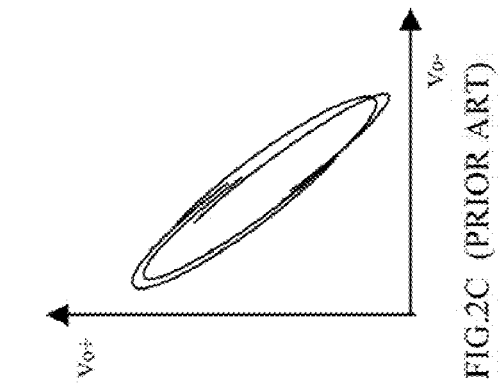
FIG. 2 is to illustrative the principle of the amplitude controller for the LC resonator: (A) is the differential LC resonator; (B) is the oscillatory curve and the frequency of the output voltages: (C) is the chaos of the chaotic LC resonator; (0) is to vary the amplitude with the amplitude control to keep the output oscillation to be the fixed frequency fo.
Figure 2C:
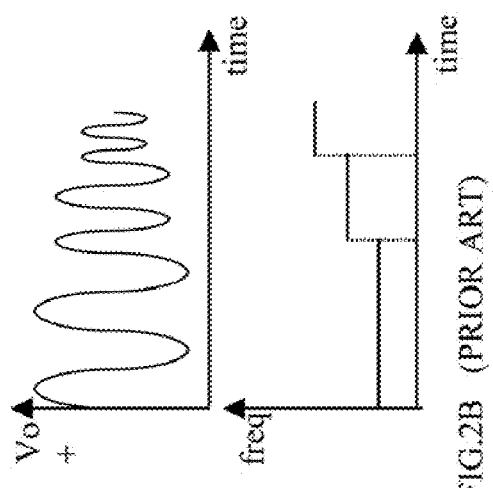
Figure 2D:
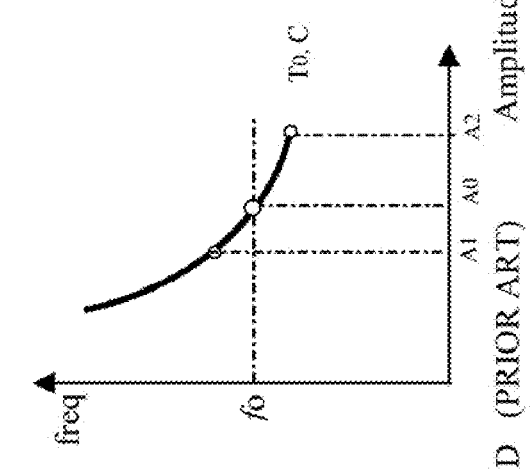
Figure 2A:
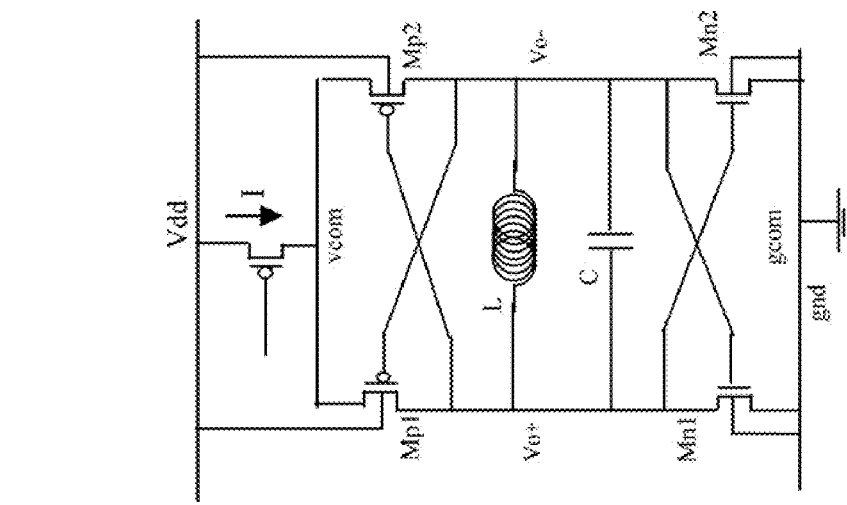

The traditional frequency controller of the prior art is based on the wrong design methodology. Actually, there should not have the frequency controller at all. As shown in FIG. 2A, it is a LC resonator. The traditional approach is based on the free-running concept. There is the implicit "no-touch" concept on the LC resonator. Let the LC resonator to be free-running mode. Any control on the LC resonator will interrupt the natural frequency oscillation of the LC resonator. Therefore, set the supply current and set the inductance L and capacitance C, then let the LC resonator go. So, it is the frequency setting, not the frequency controlling.

It is expected the LC resonator will oscillate at the constant frequency, $f=1/(LC)^{1/2}$. However, as shown in the FIG. 2B, the amplitude of the output voltage of the LC resonator is varying and the frequency is varying accordingly. As shown in the FIG. 2C, on the phase plot of the LC resonator, it shows that the free-running naturally resonant LC resonator is a chaotic circuit, not a periodic circuit. The conventional thinking of the LC resonator is a periodic circuit is completely wrong. The chaotic degree is very small that all the people think the LC resonator is a periodic circuit and uses the free-running approach. For the free running mode, it just needs to set the correct L and C value and let it go. It is the frequency setting, not frequency control. This is valid only for the ideal passive resonator having no active devices.

The fundamental philosophy of the amplitude control is to recognize the LC resonator is a low-degree chaotic circuit. We need to develop the anti-chaotic circuit to get rid of the chaos of the LC resonator. Furthermore, as shown in FIG. 2D, it shows the frequency being the function of the amplitude. In other words, controlling the amplitude to be a fixed value, we can fix the resonant frequency at a constant frequency. This is the fundamental concept of the amplitude control for real-life active resonator.

To design the LC resonator correctly, it should use the Nonlinear Chaotic Circuit Theory instead of the linear LC filter theory in the basic Circuit Theory. From the design methodology of the Nonlinear Chaotic Circuit Theory, the famous Tangs Resonance Rule is derived. The Amplitude Controller is based on the Tangs Resonance Rule. The Tangs Resonance Rule is summarized as follows.

[Tangs Resonance Rule] The chaotic LC resonator has the complex conjugate relation
(1) resonant imaginary relation $fo \sim 1/(LC)^{1/2}$
(2) energy dissipation balanced real relation $IV \sim /CV^2$
where V is the amplitude of the LC resonator.
(I) From $IV \sim fCV^2$, we get $(IN) \sim fC$.
Therefore, for the LC resonator. C decreases, f increases.
(II) From $IV \sim fCV^2$, we get $(I/C) \sim fV$.
So, for the LC resonator, amplitude V decreases, increases, and vice versa. Therefore, the dissipation term will influence the resonant term as shown in FIG. 2D. This effect is through the nonlinear term as shown in FIG. 4. However, the linear LC circuit theory fails to modeling this effect and fails to recognize this problem.

Furthermore, as shown in FIG. 12, the Amplitude Controller is a system and architecture level LC resonator design. To have the real Xtaless ClockChip product, we have made the three levels technology breakthrough innovations as follows.
(1) device level—planar EMI-free Inductor
(2) circuit level—GBQ/DGBQ LC
(3) system and architecture level—Amplitude Controller
These three levels must be coupled to work to be the complete working Xtaless ClockChip.

Figure 3B:
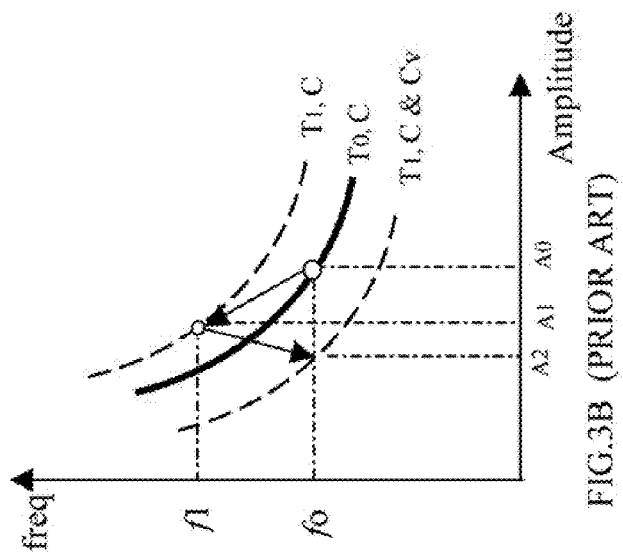
FIG. 3 is the conventional frequency control for the LC resonator; (A) is the system of the conventional frequency control: (B) is the operating curves of the frequency control for the LC resonator.
Figure 3A:
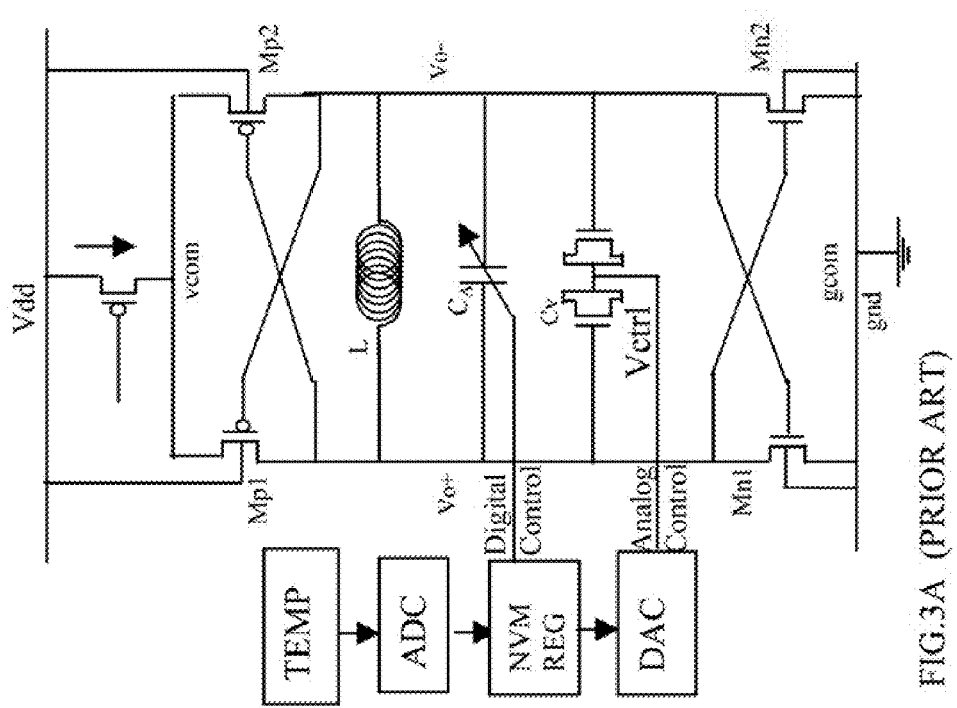

As shown in FIG. 3A, it is the conventional frequency controller LC resonator in the prior an. It is noted that the polarity of the varactor is completely wrong due to the failure of the Xtaless ClockChip problem. It makes the clock spectrum spreading due to the voltage swing of the oscillation. As shown in FIG. 3B, at the temperature T0, the LC resonator is oscillates at fo frequency with amplitude A0. As the temperature varies front T0 to T1, the frequency increases to bell. To slow down the LC resonator from f1 to f0, the control voltage Vctrl is changed to add more capacitance to the LC resonator. The frequency decreases from f1 to fo and the amplitude becomes to A2. To have this kind operation, as shown in FIG. 3A, the on-chip temperature sensor TEMP sends the temperature information to ADC. Then the corresponding control voltage information stored in the non-volatile memory and register NVM REG is taken out and sent to DAC to convert to be the analog Vctrl signal to adjust the capacitance variance of the LC resonator.

As shown in the FIG. 3A, for the coarse tune of the frequency, it is done by the digital control of the bank of capacitor array. For the fine tune of the frequency, it is done by the analog control of the varactor diode. As shown in FIG. 3B, as the temperature varies, the control voltage Vctrl changes to tune the average capacitance to adapt to the variance of the capacitance due to the temperature.

The amplitude-control clock chip is the only clock chip which works for the RF/Wireless product. It doesn't use frequency control varactor that it will not generate the Close To Carrier CTC phase. Furthermore, the Gain-Boost-Q (GBQ) amplitude K common-mode control will increase the Q of the LC resonator a lot that any CTC phase noise will be further suppressed with the GBQ amplitude control.

The fine tune of the oscillatory frequency is done with the amplitude without the varactor diode. There is no CTC phase noise generation. On the contrary, the Gain-Boost-Q amplitude control further suppress the other CTC phase noise. The amplitude control is not only not generating CTC phase noise but also increasing Q to suppress the other CTC phase noise. Therefore, the amplitude control clock chip is the only clock chip which can use in the RF/Wireless/Cellular Phone products.

In the conventional frequency controller LC resonator approach, the prior arts just knew the frequency varies as the temperature varies. They don't know why and how the frequency varies. The prior arts just used the test bench curve Fitting trying to reduce the frequency variances with the addition of the capacitance of the varactor. This blind and brute force curve fitting approach is completely wrong.

Figure 7B:
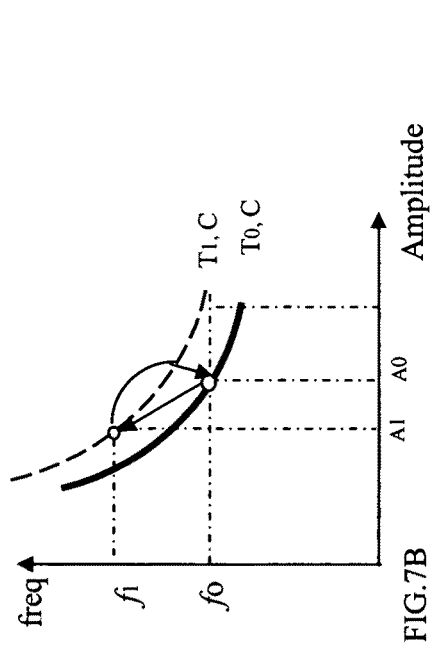
Figure 7C:
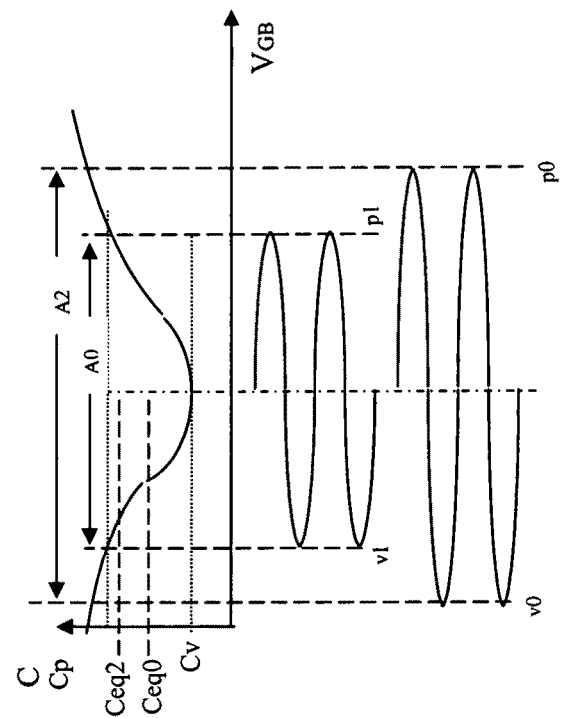
Figure 7A:
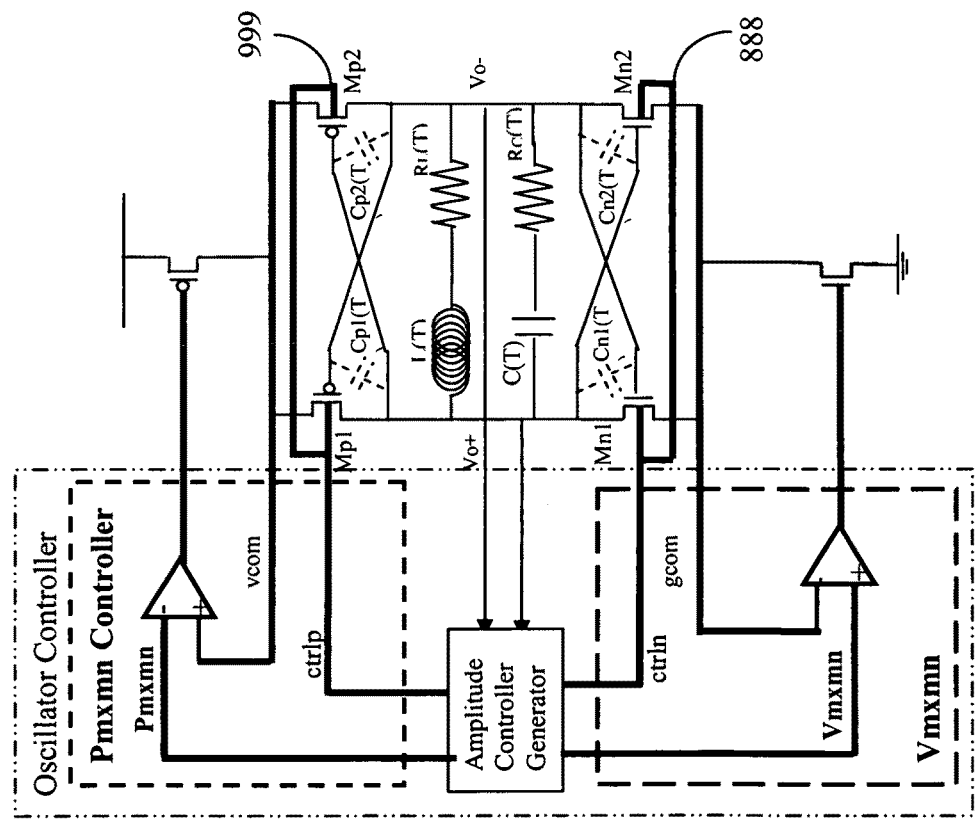

FIG. 4 shows how the temperature induces the catastrophic effect on the oscillation frequency of the LC resonator. As shown in FIG. 4A and FIG. 7A, there are the parametric capacitance L(T), C(T), RL(T), RC(T), Cp1(T), Cp2(T), Cn1(T), and Cn2(T). However, there are the most important factors are missing count. It is the bulk diode effect of the MOS devices Mp1, Mp2, Mn1 and Mn2. It is the main reason that the LC resonator having the catastrophic frequency variance due to the temperature variation induced the amplitude variation. Because the frequency variance due to the temperature variation induced the amplitude variation is a catastrophic phenomena, all the prior arts failed to recognize the catastrophic mechanism.

As shown in FIG. 4B, as the LC resonator has the large amplitude, the equivalent capacitance of the parametric varactor diode of MOS devices is large. As shown in FIG. 4C, as the LC resonator has the small amplitude, the equivalent capacitance of the parametric varactor diode of MOS devices is small. The catastrophic frequency variance due to the temperature variation is as shown in FIG. 4D. As the temperature increases, the parametric capacitance Cp1, Cp2, Cn1, Cn2 of the LC resonator decreases. The resonant frequency of the LC resonator increases and the resonant amplitude decreases as shown in FIG. 3B. As shown in FIG. 4B and FIG. 4C, then the equivalent capacitance of the bulk diode of the MOS devices Mp1, Mp2, Mn1 and Mn2 are reduced further. As shown in FIG. 4D, it becomes a catastrophic unstable loop. The catastrophic phenomenon is the frequency higher, the less parametric capacitor; the less parametric capacitor, the frequency higher, etc. Therefore, even with the tiny temperature variation, the catastrophic unstable loop will make the very large capacitance variance. Therefore, with the amplitude controller, we can break the catastrophic unstable loop.

As shown in FIG. 2D and FIG. 4A, the amplitude controller controls the bulk connections of the MOS devices Mp1, Mp2, Mn1 and Mn2. The bulk nodes of the gm-amplifier is controlled by the output of the amplitude controller. A Green Technology Platform apparatus comprises a magnetic-electric resonator accommodating to generate a plurality of clock signals having a resonant frequency. A gm-amplifier is coupled to the magnetic-electric resonator and an oscillator controller is coupled to the magnetic-electric resonator and gm-amplifier means. The oscillator controller is adapted to generate a plurality of outputs to control a plurality of bulk nodes of the gm-amplifier. Furthermore, a plurality of outputs are correlated with temperature.

To make the LCO circuit analysis and design, we need to build the correct model first. However, there is no model for the LCO which includes the effects of the temperature change, amplitude change, gain change and frequency, etc. Being similar to the PLL, for the conventional LCO design, there are the coarse control of the frequency and fine control of the frequency. The LCO has the capacitor bank for the set of the coarse frequency and the LCO uses the varactor diode bank for the fine tune of the capacitor to compensate the temperature variance.

In our innovation, to avoid the CTC problem, we don't use the varactor diode to compensate the temperature induced capacitance variance. Furthermore, we try to completely eliminate the parametric varactor diode effect of Mp1, Mp2, Mn1 and Mn2 that we have the Parametric Varactor Compensation as shown FIG. 6H. The frequency controller is an isolated controller. The frequency controller sends the varactor diode controlling bits to switch on or off the varactor diode of the LCO. The LCO is free-running. There is no feedback control for the frequency control.

The amplitude controller sends the amplitude control bits to the amplitude control register and send the common-mode control bit to the common-mode control register. The amplitude DAC will convert the amplitude control bits to the amplitude voltage; the common-mode DAC will convert the common-mode control bits to the common-mode voltage. As shown in FIG. 7A and FIG. 8, the amplitude control feedback control amplifier and common-mode feedback control amplifier make the comparisons between the LCO amplitude and common-mode voltage to set the LCO to oscillate at the specified amplitude to have the specified frequency to compensate the capacitance variance due to the temperature variance. The amplitude control is very complicate feedback control loop.

Figure 11A:
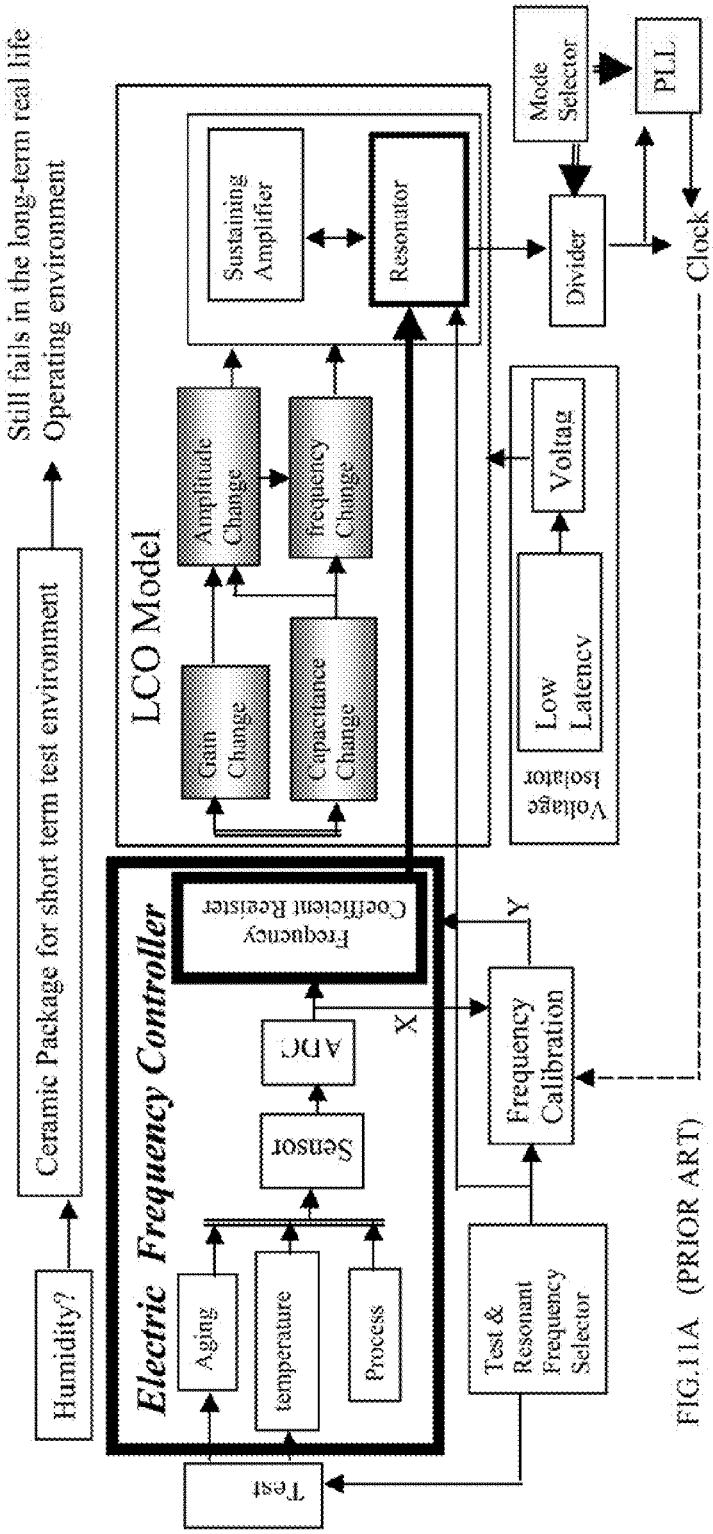

So, as shown in FIG. 11A, the frequency control of the LCO is very simple isolated controller having the open-loop free-running oscillation. The frequency control can be completely decoupled from the LCO resonator. So, in the drawing, the frequency controller doesn't include the LCO model. As shown in FIG. 12A, the amplitude control of the LCO is very complicated coupling controller having the closed-loop feedback controlled oscillation. The amplitude control cannot be decoupled from the LCO resonator. So, in the drawing, the amplitude controller does include the LCO model to illustrate the closed-loop feedback amplitude controlling relations.

Figure 5B:
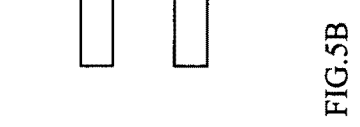
Figure 5E:
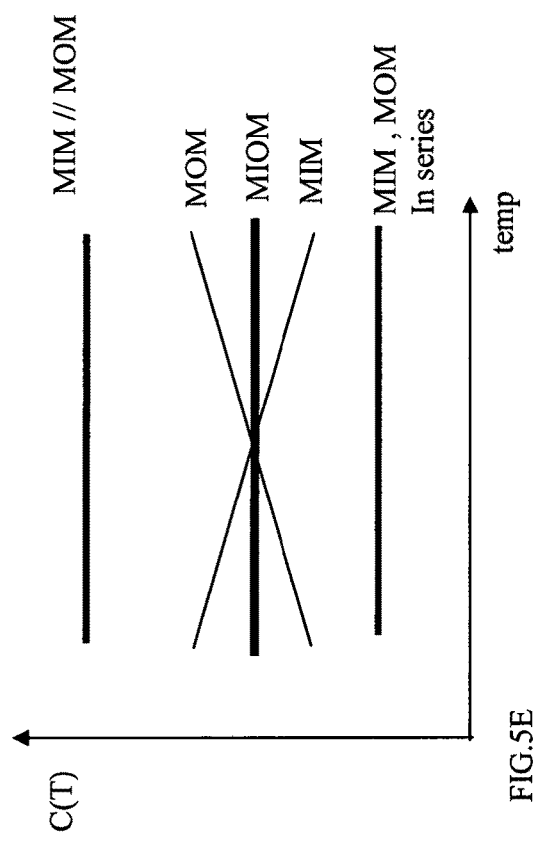
Figure 5A:
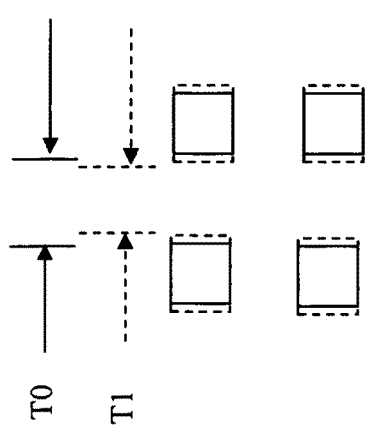
Figure 5C:
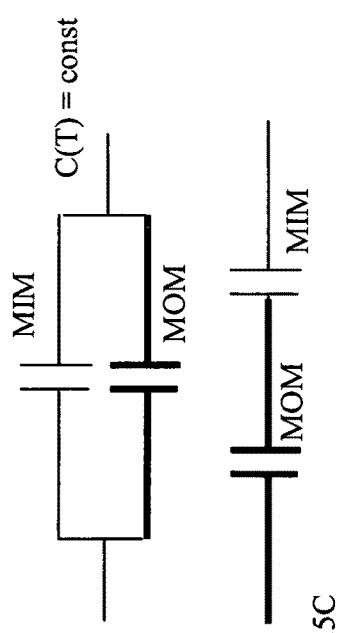
Figure 5D:
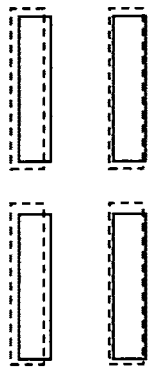

To stop the catastrophic unstable loop, first we have the temperature self-compensation capacitor C(T). As shown in FIG. 5A, the interdigital fringe-capacitance MOM capacitor has the positive temperature coefficient TC. As the temperature increase, the distance between the strip of the MOM capacitor decreases. As shown in FIG. 5B, the MIM capacitor has the negative temperature coefficient TC. As the temperature increase, the distance between the plates increases that the capacitance decreases. As shown in FIG. 5C, as the MIM and MOM connected in parallel or in series, the temperature increases effect of MIM and MOM will cancel with each other. Furthermore, as shown in FIG. 5D, the MIOM has the hybrid structure of the MIM and MOM that the it has the temperature self-compensation effect. Both FIG. 5C and FIG. 5D are referred to the temperature self-compensation capacitor.

The varactor diode of the conventional prior arts further has the frequency-shift drawback due to voltage swing capacitance variance effect. It comes from the PLL circuit design. It cannot use in the Xtaless ClockChip design. It makes the Xtaless ClockChip is unstable over temperature variance. FIG. 6 is to show the innovation of Varactor Free Amplitude Controlled Oscillator (VFACO) self-compensate varactor topology to compensate for frequency shift due to the bulk capacitance variation in the Varactor Free Amplitude Controlled Oscillator (VFACO) LC oscillation. As shown in FIG. 6A, the spectrum of the idealized LC resonator is a δ function at frequency fo. Even with the inductor L having the parametric resistance $R_L$ and the capacitor C having the parametric resistance $R_C$, it still has the idealized delta function spectrum due to the compensation with the positive resistance of the active device. However, as shown in FIG. 6B, the spectrum of the real-life LC resonator has the Lorentz function distribution. The prior art and a lot of people have the wrong concept that they think it is due to the resistances $R_L$ and $R_C$. Nobody recognizes the problem being due to the parametric bulk diode effect of the active devices. It is the frequency-tuning effect due to the variance of the varactor capacitance being caused by the voltage-swing. The capacitance of bulk diode varies as the voltage Vo+ and Vo− swing. The frequency fo is only the weighted average of the capacitor. The variance of the capacitance of the bulk diode causes the fine modulation of the frequency. Even worse, the variance of the capacitance of bulk diode is anti-symmetric. During the variance of Vo+ and Vo−, one side of varactor is more forward bias and the junction capacitance increases. On the other side is more reverse biased and the junction capacitance decreases, and vice versa. Therefore, the capacitor loading at the two node Vo+ and Vo− are not the same and varies. Therefore, the oscillation curve is distorted and the frequency drifts. To eliminate the frequency drift. FIG. 6C is the spectrum of the LC resonator having the self-compensation bulk diode capacitance for the voltage swing.

FIG. 6D is the differential mode diode having the self-compensation varactor capacitance for the voltage swing. FIG. 6E is the differential mode NMOS having the self-compensation varactor capacitance for the voltage swing. FIG. 6F is the differential mode PMOS having the self-compensation varactor capacitance for the voltage swing. FIG. 6G is the differential mode NMOS and PMOS having the self-compensation bulk diode capacitance for the voltage swing. Referring to FIG. 4A, as shown in FIG. 6H, it is compensating bulk diodes to compensate the bulk diodes of NMOS devices Mn1, Mn2 and PMOS devices Mp1, Mp2. FIG. 6H is the bulk diode Compensation for the self-compensation bulk diode capacitance for the voltage swing. The self-compensation bulk diode in FIG. 6H and the NMOS devices Mn1, Mn2 and PMOS devices Mp1, Mp2 are corresponding to the self-compensation bulk diode capacitance as shown in FIG. 6G. It is noted that the polarity of the NMOS devices Mn1, Mn2 and PMOS devices Mp1, Mp2 just reverse the conventional connections of the prior art. In other words, the connections of the prior art are wrong. The prior art fails to recognize the voltage swing induced frequency shift problem. The wrong connection of the polarity for the prior art varactor diode made the case even worse. In summary, to be the trimless/trimfree LC resonator for the Xtaless ClockChip, it needs following four techniques.

$1^{st}$: the equal parametric resistance $R_L=R_C$ (as shown in FIG. 7A);

$2^{nd}$: the temperature compensation capacitor (as shown in FIG. 5C or FIG. 5D);

$3^{rd}$: the voltage swing compensation bulk diode (as shown in FIG. 6H);

$4^{th}$: the LCO with the guided magnetic field flux inductor (as shown in FIG. 39).

Figure 24B:
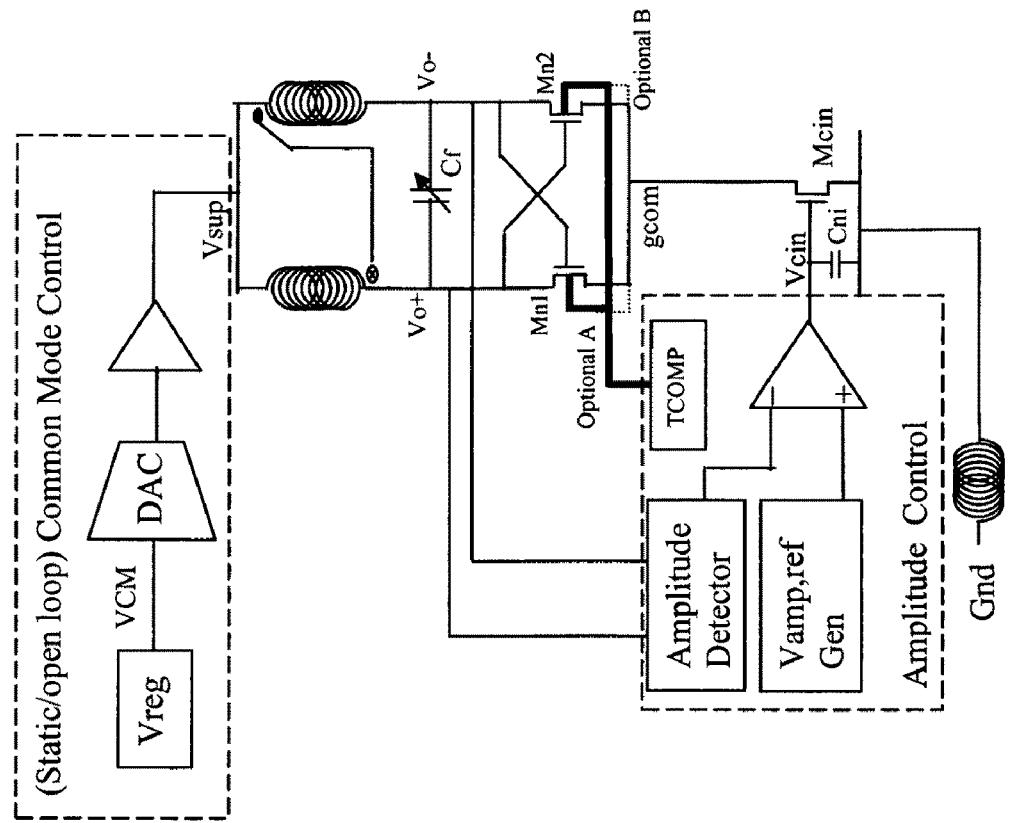
Figure 24A:
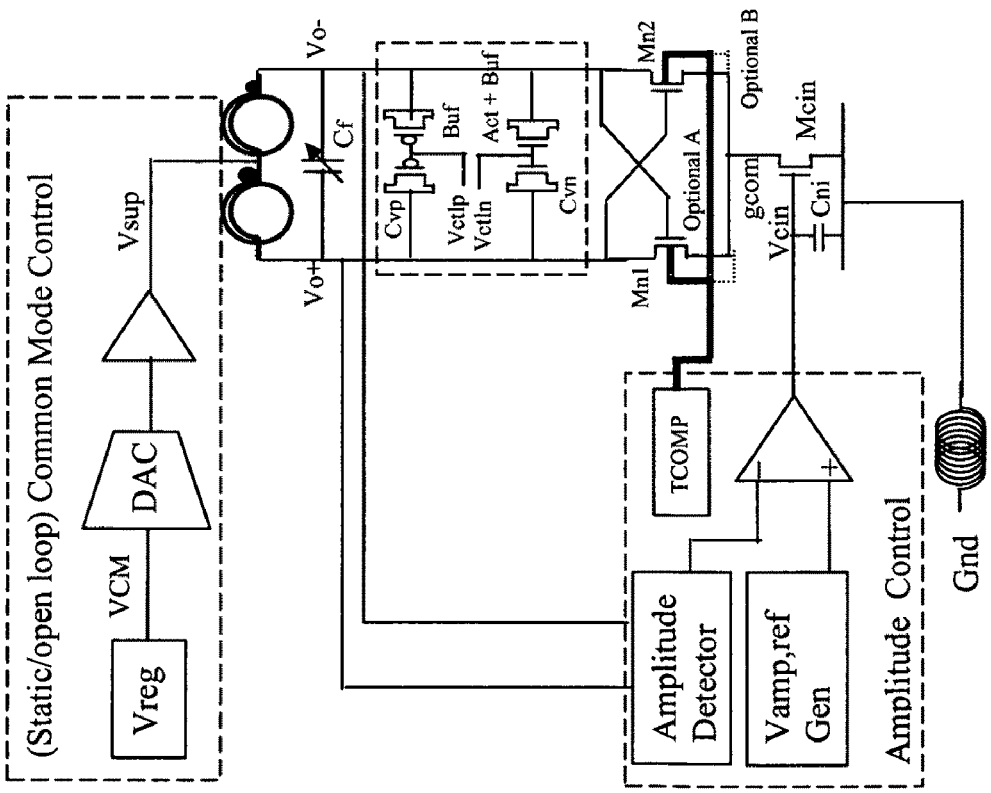
Figure 25B:
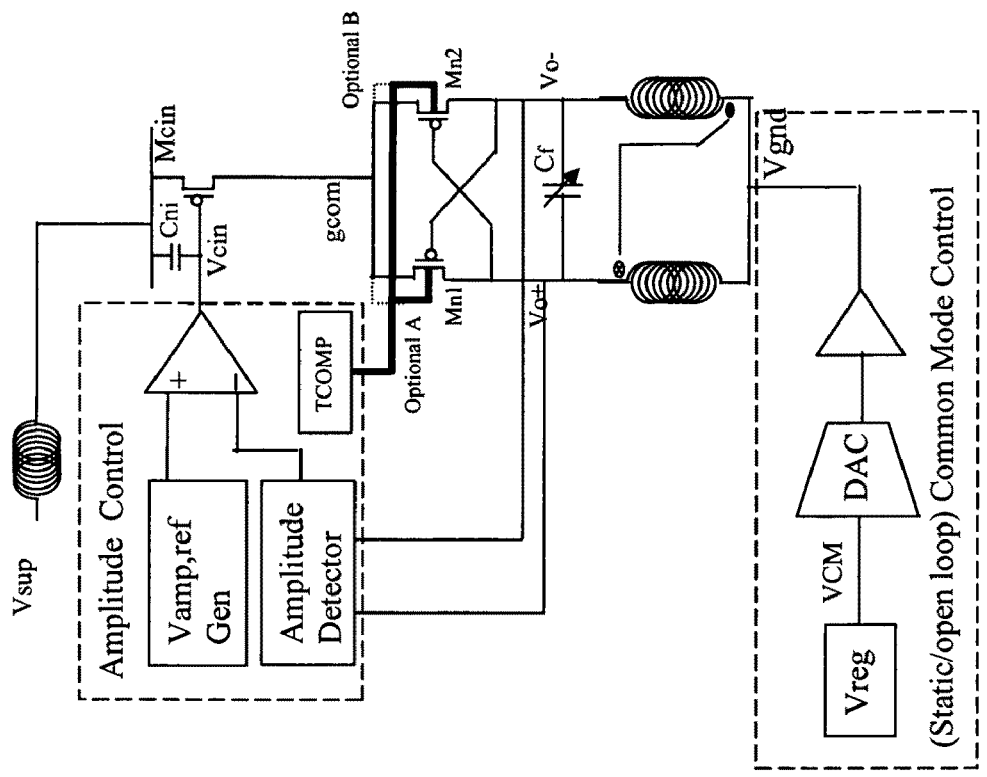
Figure 25A:
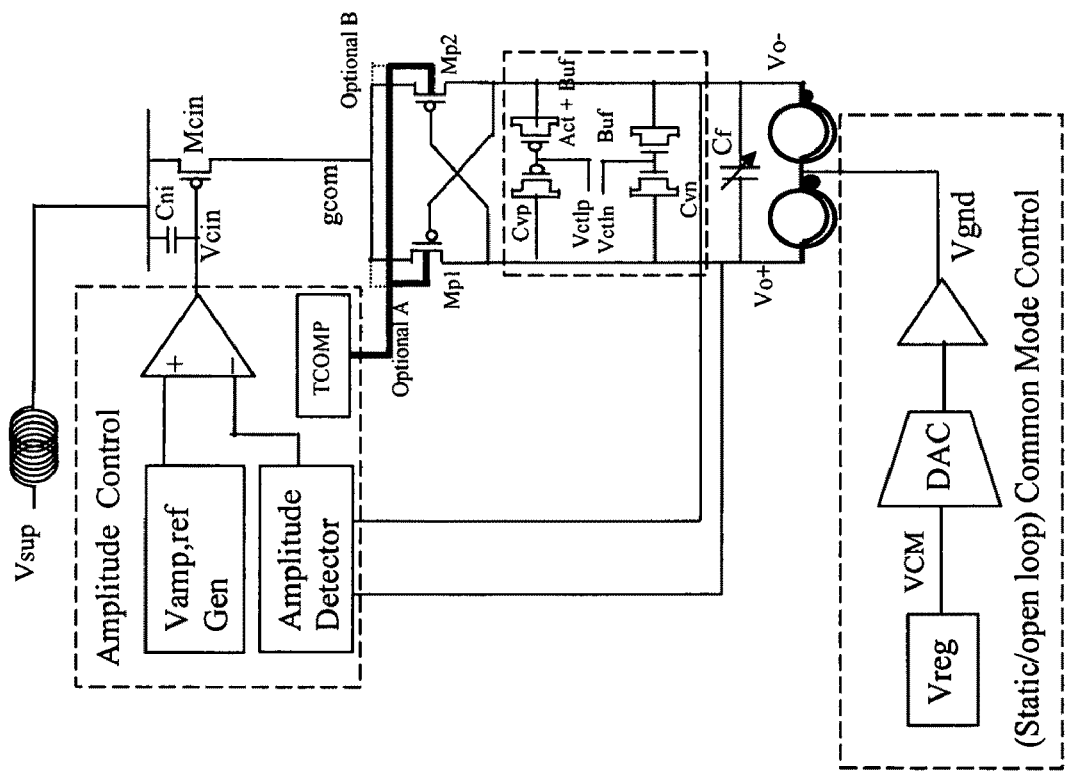

With the above self-compensation techniques and the self-adaptive capability of the amplitude control, only the $2^{nd}$ order effects are left. It is not necessary to trim for the $2^{nd}$ order effect to be the trimless/trimfree Xtaless ClockChip. It is noted that in the amplitude control, we use the active NMOS devices Mn1, Mn2 and PMOS devices Mp1, Mp2 as the bulk diode directly. We don't need the extra varactor diode as the prior art does. Furthermore, for the differential bulk diode and differential diode as shown in FIG. 6, the amplitude reference is related to temperature. LCO has the amplitude and common mode voltage controlled by the amplitude controller to compensate the temperature variation of the LCO. It is noted that the self-compensation bulk diode in FIG. 6 has both the voltage compensation and temperature compensation effects. As shown in FIG. 4A and FIG. 6H, the compensate bulk diodes are the sum of the active device and the buffer. The bulk of the buffer is biased by the control voltages ctrlp and ctrln, too. For the N-type latched amplifier as shown in FIG. 24A, there is no PMOS active device needed to compensate. For the P-type latched amplifier as shown in FIG. 25A, there is no NMOS active device needed to compensate.

As shown in FIG. 7, the Varactor Free Amplitude Controlled Oscillator (VFACO) amplitude controller has several applications in the control of the LC resonator.

(1) As the Varactor Free Amplitude Controlled Oscillator (VFACO) amplitude control voltages ctrlp, ctrln, vcom, gcom and the oscillation amplitude are fixed, there is no variation of the capacitance of the parametric bulk diode. There is no need for the addition of the extra varactor diode.

The varactor diode of the prior art is added to compensate the capacitance variance due to the catastrophic unstable loop. There is no need for the additional varactor diode at all. The addition of the varactor diode comes from the VCO of the PLL. However, the VCO of the Xtaless ClockChip is not the VCO of PLL. It is wrong to take the VCO of the PLL design to the VCO of the Xtaless ClockChip without the knowledge of the difference of the VCO of the PLL and the VCO of the Xtaless ClockChip.

(2) Controlling the biasing voltages of ctrlp and ctrln, the MOS devices Mp1, Mp2, Mn1 and Mn2 can serve as the bulk diode. We don't need the extra varactor diode at all.

(3) As the temperature varying, we can make the minor modifications for the controlling voltages of ctrlp and ctrln to compensate the $2^{nd}$ order variation of the LC tank.

It is very important to know that the Varactor Free Amplitude Controlled Oscillator (VFACO) amplitude controller LC resonator has the $1^{st}$ order self-compensation to have the self-adaptive capabilities to the variance of the environment. The trimming or calibration is only for the $2^{nd}$ order effect. All the $1^{st}$ effect has been cancelled in the $1^{st}$ order self-compensation and self-adaptive process of the amplitude controller LC resonator. Therefore, as we design the Varactor Free Amplitude Controlled Oscillator (VFACO) LC resonator, we need to design for the $1^{st}$ order self-compensation with the amplitude controller. Then use the trimming to correct the $2^{nd}$ order effect. A lot of times, the $2^{nd}$ order is so minor that it is no need to trimming. It is the trimming-free Xtaless ClockChip.

The design Target/Object Oriented is Self-Adaptive to cancel all the $1^{st}$ order effects. The order self-compensation design techniques for the amplitude controller LC resonator are as follows.

(1) In the design and layout, makes the $R_L=R_C(T)$.

As $R_L(T)=R_C(T)$, the frequency $f_o(T)=1/(L(T)C(T))^{1/2}$ which is independent of the $R_L(T)$ and $R_C(T)$. Therefore, we just need to worry the variances of the L(T) and C(T).

(2) The LC variance due to the temperature is self-compensated as follow.

Why we need to have the amplitude controller to keep the constant amplitude? For the same voltage level of amplitude, the increment of the inductor length is $\Delta T$. Therefore, the decrease of current is proportional to $\Delta T$. The area of the inductor increase is about $(\Delta T)^2$. So the net increment of the inductance is $(\Delta T)^2/\Delta T=\Delta T$. So, the $(\Delta L/L) \sim (\Delta T/T)$. For the capacitance, as the temperature increase, the insulate layer increases. Therefore, the decrease of the capacitance is proportional to $\Delta T$. This capacitor temperature effect $(-\Delta C/C) \sim (\Delta T/T)$ is applied to both the MOS capacitor and the main capacitance C.

Therefore, the inductor and capacitor has the LC Self-compensation effect as follows.

$$(L+\Delta L)(C-\Delta C)=LC(1+\Delta L/L)(1-\Delta C)=LC[1+(\Delta L/L-\Delta C/C)+(\Delta L/L)(\Delta C/C)]=LC \text{ with } \Delta L/L \sim \Delta C/C \sim \Delta T/T$$

(3) Varactor Free Amplitude Controlled Oscillator (VFACO) LC amplitude Controller.

First, we consider only the first-order effects. As shown in FIG. 7, for the constant amplitude operation, the variance of the parametric bulk diode is eliminated. The gain variance of the temperature, process, aging, etc is eliminated, too.

(4) Trimming for the $2^{nd}$ order minor effect.

With the Amplitude Self-compensation, for the Varactor Free Amplitude Controlled Oscillator (VFACO) amplitude controller LC resonator, there is only the $2^{nd}$ order minor non-linear effect being left. As shown in FIG. 7A, with the Mp1, Mp2, Mn1, Mn2 as the parametric bulk diode, we just make the minor modification of the ctrlp and ctrln. Alternatively, we can make the minor adjustment of $P_{mxmn}$ and $V_{mxmn}$ to make the finer adjustment of the amplitude. It just needs to make the minor amplitude adjustment for the LC resonator then it can compensate the $2^{nd}$-order temperature variance. However, due to the self-compensation and self-adaptive capability of amplitude controller, even the minor adjustment of the amplitude is not necessary to be optional.

FIG. 7 show the generic of the Varactor Free Amplitude Controlled Oscillator (VFACO) amplitude controller. It is well known the following relations:

$V\text{peak} \sim v\text{com} \sim V\text{max},$ $V\text{valley} \sim g\text{com} \sim V\text{min}$ $V\text{amp}=V\text{peak}-V\text{valley}=V\text{max}-V\text{min}$ $V\text{com}=(V\text{peak}+V\text{valley})/2=(V\text{max}+V\text{min})/2$ where Vpeak and Vvalley are the really measurements of the peak value and valley value of the V+ and V−. It conies from the feedback control. There are many ways to control the Vamp and Vcom. However, their principles are based on the same amplitude controller principle. Vamp and Vcom. No matter which ways the circuit designs are, there is the need to control both Vamp and %/coin at the same time with the versatile ways.

FIG. 7A shows the way Varactor Free Amplitude Controlled Oscillator (VFACO) to control vcom and gcom to control the Vmax and Vmin. Controlling Vmax and Vmin, then we can control the Vamp and Vcom. The control voltages ctrlp, ctrln tries to follow the voltage vcom and gcom to have the proper control voltage conditions for the bulk diode. The bulk control voltage ctrlp is connected to the PMOS bulk node 999 and the bulk control voltage ctrln is connected to the NMOS bulk node 888. However, it might make the minor modification for the $2^{nd}$ order effect to cancelling the $2^{nd}$ order variance of the oscillation conditions. As shown in FIG. 7B, as the temperature increases, the frequency increases and the amplitude decreases. As shown in FIG. 7C, with the constant amplitude control of the amplitude controller, the amplitude will increase from A1 to A0 that oscillation frequency will decrease from $f_l$ to $f_o$ again. This is the $1^{st}$ order self-compensation effect. Only the $2^{nd}$ order effect is left. Then we can make the finer adjustment with the fine tune $P_{mxmn}$, $V_{mxmn}$ or ctrlp, ctrln. FIG. 8 is the alternative design of the Varactor Free Amplitude Controlled Oscillator (VFACO) amplitude controller LC resonator. The control biasing voltages for the parametric bulk diode just follow the voltage won gcom and the amplitude of the oscillation for the LC resonator.

Even worse, the conventional frequency controller of the prior art never mentions how to handle the variance of the humidity on the moisture sensitivity level. In the prior arts, they just used the ceramic package to walk around the short term test problem. As shown in FIG. 9, the plastic package has the short transient time. In the test burner, changing the humidity from the Florida to the Las Vegas, there is 600 parts per million PPM frequency shift in the test period. Therefore, the prior art uses the ceramic package having the long-term transient constant to walk the test problem. In the short test period, the ceramic package cannot test the change of the frequency. However, in the real life application, for the ceramic package, the moisture sensitivity problem still comes out. It is the most serious problem of the prior art of the Xtaless ClockChip. However, all the prior arts fails to recognize this humidity problem and stay away from this problem. Therefore, none of the prior art is the product ready Xtaless ClockChip. None of our competitor can deliver the Xtaless ClockChip to the market. Only our MS0-GBQ-AC LCO solves this humidity problem and our Xtaless ClockChip is the market-ready to deliver product.

Figure 10A:
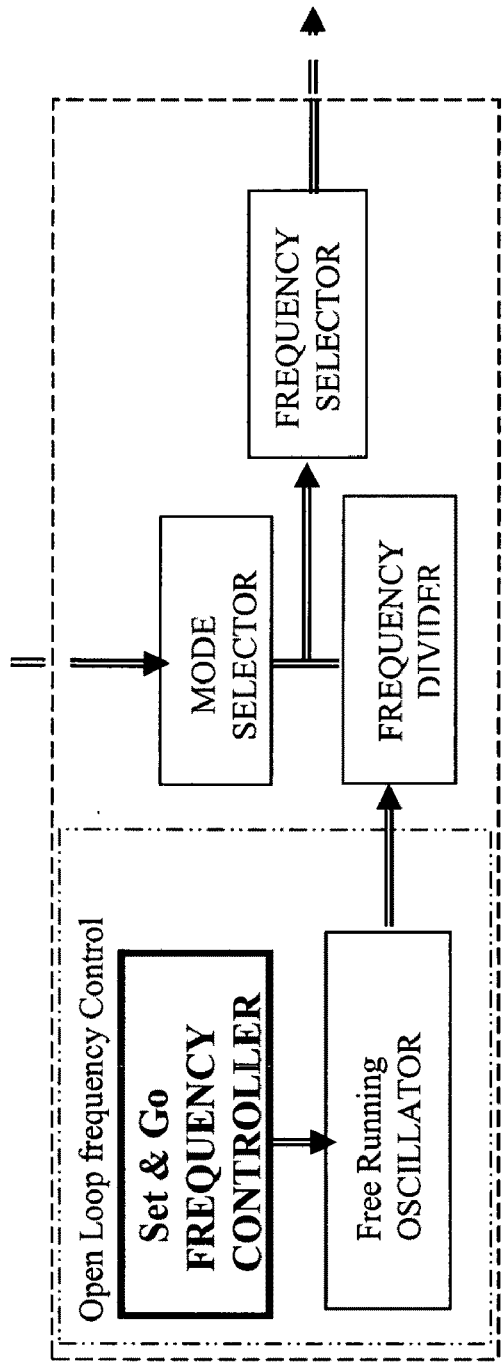
Figure 10B:
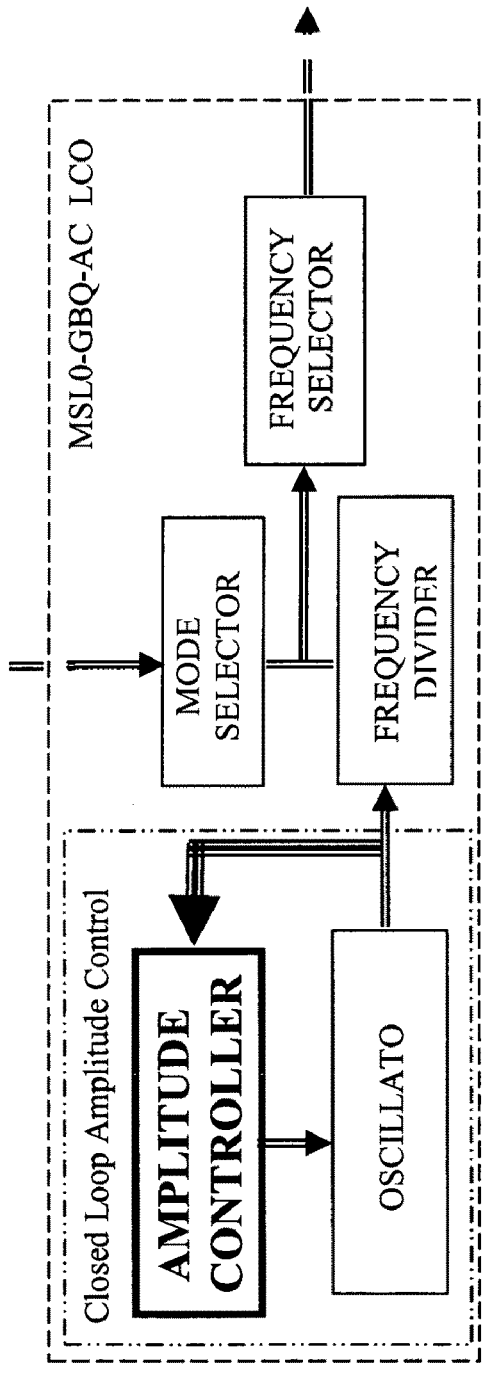

As shown in FIG. 10, the signal flow block diagrams show the difference between the conventional frequency controller and the amplitude controller. As shown in FIG. 10A, it is the open-loop frequency controller. It just the set & go for the oscillation frequency. In the real life application, there is no other reference clock. There is no feedback for the frequency deviation in the real time. Therefore, it is the open-loop without any control. However, as shown in FIG. 10B, the Closed Loop Amplitude Control has the oscillation amplitude deviation to be the feedback control. Controlling the amplitude, we can have the fixed oscillation frequency for the LC oscillator. It is the closed-loop feedback control.

Figure 11B:
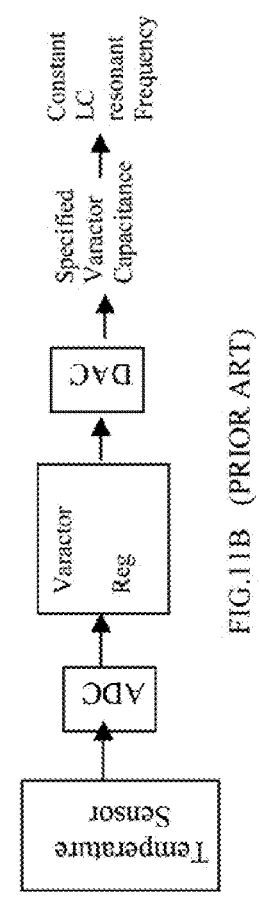
Figure 11C:
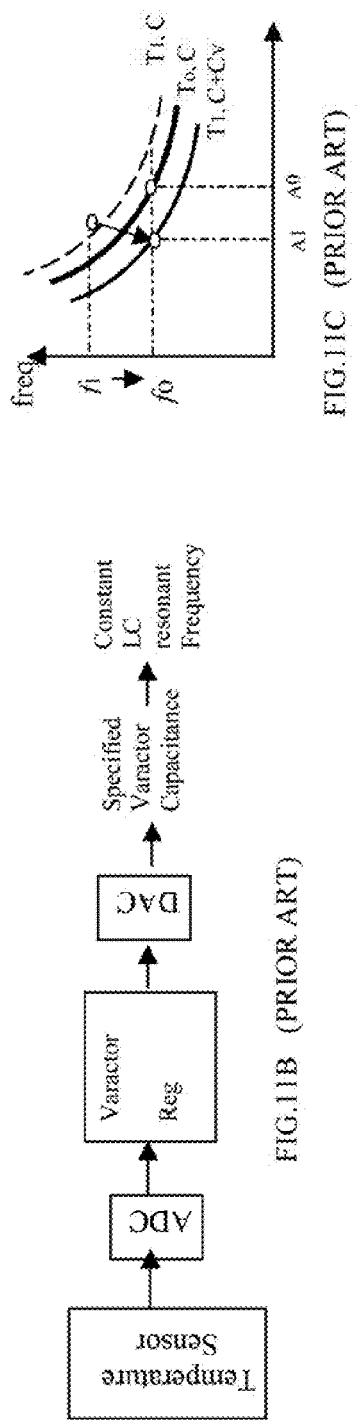

As shown in FIG. 11A, it is the block diagram for the conventional frequency controller. As shown in the dark blocks, the process, temperature and aging, etc, cause the gain change, capacitance change and induce the amplitude change, frequency change of the LC resonator. FIG. 11B is the signal flow for the conventional frequency controller for the temperature variation case. As the temperature varies, the temperature sensor senses the variance and sends the data through ADC to NVM to load the varactor control voltage data into the Varactor register. The DAC converts the Varactor register data to the varactor control voltage $V_{ctrl}$ to control the capacitance of the varactor diode to vary the capacitance of the LC resonator to tune up the LC resonator to be the fixed voltage. As shown in FIG. 11C, the temperature increases from $T_0$ to $T_1$ and the frequency increases to be $f_1$ and the amplitude decreases to be A1. Increasing the capacitance of the varactor diode with the varying of the control voltage Vctrl. Then the LC resonator will oscillate at the frequency $f_o$ with amplitude A1. It is well-known the variance amplitude will change the resonance of the LC resonator. Actually, the variance amplitude changes the equivalent capacitance of the LC resonator. The mutual influence of the amplitude and the capacitance of the LC resonator make the trimming of the frequency control become intractable. Furthermore, this process has to repeat for all the parameters. However, even worse, it is not N arrays parameters for aging, temperature, process, etc. It is the multi-dimensional arrays of aging, temperature, process, etc. It is (N*N*N . . . ) arrays. Therefore, it is hopeless to build up such kind multi-dimensional array. Therefore, the frequency controller is a hopeless approach.

As shown in FIG. 12A, the MSL0-GBQ-AMC Xtaless ClockChip not only has the electric amplitude controller but also has the magnetic confinement. Comparing FIG. 12B with FIG. 11B, the frequency controller generates the control voltage and varactor capacitance variance for the LC resonator; the amplitude controller generates the specified amplitude for the LC resonator. As shown in FIG. 12B, it has the option to be the analog temperature sensor without ADC. As shown in FIG. 12C, as the temperature increase from $T_0$ to $T_1$, the capacitance decreases and the frequency increases from fo to f1. Adjusting the amplitude according to the specified amplitude A1, the LC resonator will oscillates at the resonant frequency $f_o$. The control variable of the amplitude controller is completely different from the control variable of the frequency controller.

The most important characteristics for the amplitude controller is the self-compensation capacity as shown by the amplitude and common mode controller. The amplitude and common mode controller has the capability to self-adaptive to self-compensate for the gain change and capacitance change with the closed-loop feedback control. All the process, temperature and aging, etc will be convert to the gain-change and capacitance change. In other words, the amplitude and common mode controller has the self-adaptive capability to self-compensate for the process, temperature and aging, etc change. At least, the amplitude and common mode controller has the $1^{st}$ order compensation for the process, temperature and aging, etc change. Therefore, the trimming for the amplitude controller only for the $2^{nd}$ order minor effects.

Figure 13B:
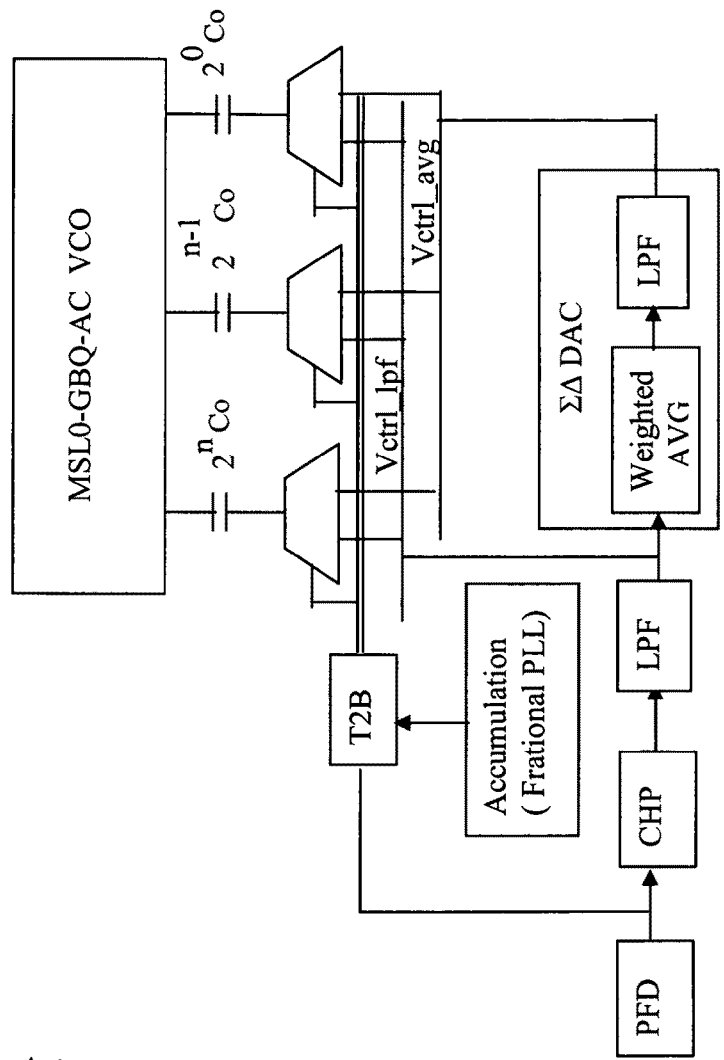
Figure 13C:
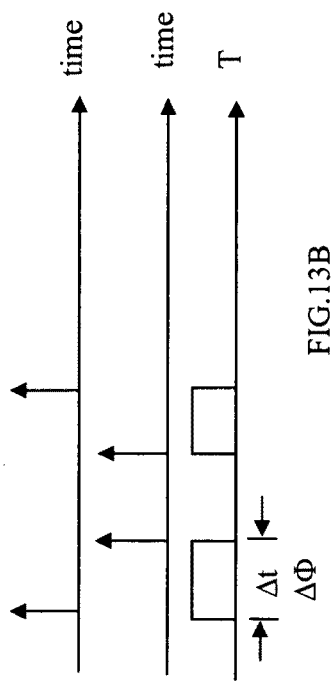
Figure 13A:
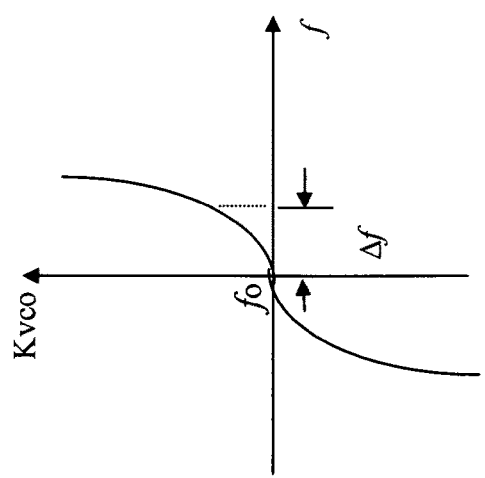

For the Xtaless ClockChip, there is an option to use the phase lock loop PLL to boost the frequency (1 GHz) to high frequency (80 GHz). The VCO of the clock reference should not have the varactor diode to tune the frequency. However, the VCO of the PLL has the voltage control Vctrl to tune the oscillation frequency. For the high frequency PLL, as shown in FIG. 13A, the nonlinear Kvco is used. The nonlinear Kvco has both large lock range and is jitterless at the locking frequency $f_o$. Only the nonlinear Kvco can have both characteristics. As the deviation of frequency is large, the Kvco is large: as the deviation of frequency is small, the Kvco is small. One implementation of the nonlinear Kvco is shown as FIG. 13C. In the implementation, the larger the frequency deviation is, the larger capacitance is connected to $V_{ctrl\_lpf}$ and the smaller capacitance is connected to $V_{ctrl\_avg}$. The smaller the frequency deviation is, the smaller capacitance is connected to $V_{ctrl\_lpf}$ and the larger capacitance is connected to $V_{ctrl\_avg}$. The frequency deviation is approximated with of $\Delta f \sim 1/\Delta t$ where the $\Delta t$ as shown in FIG. 13B. $\Delta t$ is the period between the two successive edge of the reference clock and the feedback clock. As shown in FIG. 13C, the T2B, time-to-binary, converts the $\Delta t$ to the binary value to switch the mux to have the nonlinear Kvco.

Figure 14A:
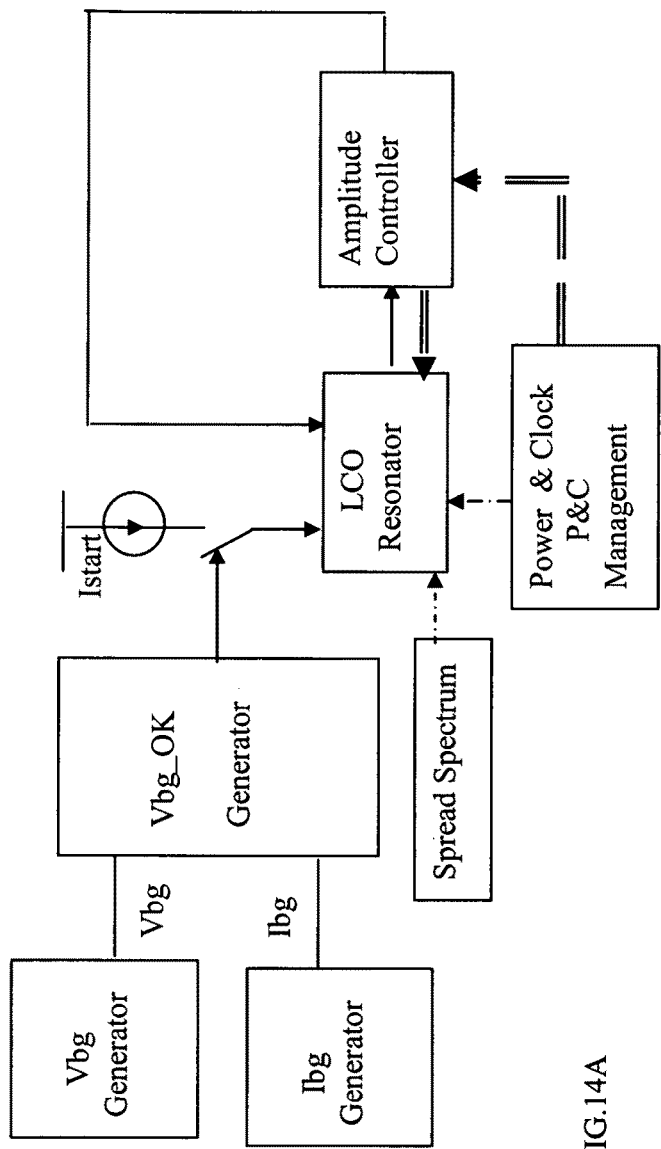

As shown in FIG. 12A and FIG. 36C, to have the clean power supplying to the LC resonator, there is voltage isolator. It has the low clock latency function during the power-up process, too. The power-up process needs to be temperature-independent, etc. Therefore, it is derived from the bandgap reference. As shown in FIG. 14A, the $V_{bg}$ Generator and $I_{bg}$ Generator the $V_{bg}$ and $I_{bg}$.

$$V_{bg}=V\text{ptat}+V\text{ctat} \quad I_{bg}=I\text{ptat}+I\text{ctat}$$

Figure 14B:
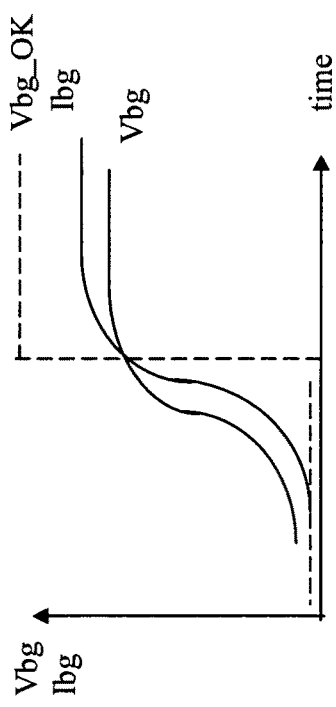

However, as shown in FIG. 14B, the rising curves for the Vbg and Ibg have the different slopes. As shown in FIG. 14A and FIG. 14B, the $V_{bg\_OK}$ generates the $V_{bg\_OK}$ step function as the Vbg signal is ready. The $V_{bg\_OK}$ is to switch off the initial power supply for the LCO resonator. During the power up process, the LC resonator uses the current source $I_{start}$ to generate the clock immediately as the power is on. After the bandgap voltage Vbg is ready and all the circuit is normal operation, the power supply is automatically in the normal amplitude controller operation. The $I_{start}$ switch can be turned off slowly and the Amplitude Controller will take over all the power supply work. During the power failure, as the power drop and Vbg fails to operate properly. The $Vbg_{bg\_OK}$ signal will turn on the $I_{start}$ switch that the LC resonator still can work to have all the system shut down according the power-down sequence.

As shown in FIG. 14C and FIG. 14D, in the Xtaless Clock-Chip, the bandgap module and temperature sensor share the same circuits. The temperature sensor has much higher linear requirement than the bandgap reference voltage requirement. The $V_{bg}$ and $I_{bg}$ are nonlinear and need to have the curvature compensation. It needs to eliminate the squared terms $I_{ptat}^2$ and $I_{ctat}^2$ from the $I_{ptat}$ and $I_{ctat}$ to be $I_{ptat\_linear}$ and $I_{ctat\ linear}$. The Xtaless ClockChip uses the temperature sensor to calibrate the frequency. The nonlinearity of the temperature sensor will add to the nonlinearity of the frequency over the temperature. Therefore, we need to reduce the nonlinearity of the temperature sensor. The nonlinearity of the temperature sensor is derived from the $I_{ptat}$ of the bandgap reference. The essential characteristics of the nonlinearity of the $I_{ptat}$ is to we need to make the curvature compensation for the nonlinearity of the $V_{BE}$ of the bipolar device.

As shown in FIG. 14C1 and FIG. 14C2, the temperature sensor uses the Proportional To Absolute Temperature $I_{ptat\_linear}$ to generate the temperature to have the temperature accuracy of 0.1 degree. The $I_{ptat\_linear}$ is converted to the biasing voltage ($I_{ptat\_linear}*pR+V_{th\_n}$). Then applying the biasing voltage to the NMOS device $M_{sq}$ to generate the current $$k(I_{ptat\_linear}*pR+V_{th\_n}-V_{th\_n})^2 = k(pR\ I_{ptat\_linear})^2 = \alpha I_{ptat\_linear}^2$$

Making the current subtract from the $I_{ptat}=I_{ptat\_linear}+\alpha I_{ptat\_linear}^2$, then we get $I_{ptat\_linear}$. This is a closed loop self-adjust feedback system. The same principle can be applied to the Complimentary To Absolute Temperature $I_{ctat}$.

As shown in FIG. 14D1 and FIG. 14D2, the Conjugate To Absolute Temperature $I_{ctat\ linear}$ is converted to the biasing voltage ($I_{Ctat\_linear}*cR+V_{th\_n}$). Then applying the biasing voltage to the NMOS device Msq to generate the current $$k(I_{ctat\_linear}*cR+V_{th\_n}-V_{th\_n})^2 = k(cR\ I_{ctat\_linear})^2 = \beta I_{ctat\_linear}^2$$

Making the current subtract from the $I_{ctat}=I_{ctat\_linear}+\beta I_{ctat}^2$, then We get $I_{ctat\_linear}$. This is a closed loop self-adjust feedback system.

Furthermore, there is the power and clock P&C management. There are the spread spectrum and the power and clock management to control the oscillation frequency of the LC resonator. As the power saving mode and the clock needs to slow down, the resonant frequency of the LC resonator is reduced. For the Xtaless Clock Chip there is two ways to make the P&C management. One way is to use the $I^2C$ bus and the other way is to use the Clock pin. In case the other chip or system doesn't have the $I^2C$ bus, the only way is to use the Xtaless Chip clock pin. As shown in FIG. 15 is the power and clock P&C protocol, system and circuit design for the power and clock P&C management with the Scalable Single End Multiple Level PMU.

Figure 15A:
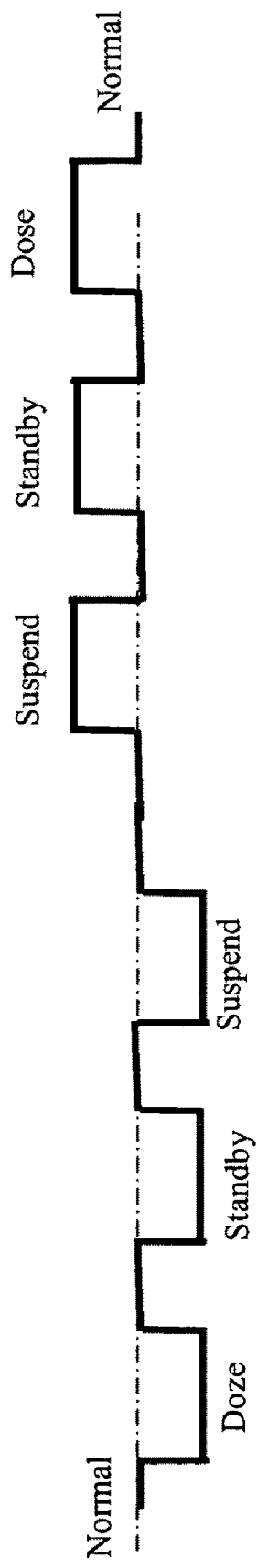

As shown in FIG. 15A, it is our novel innovation of the Scalable Single End Multiple Level P&C protocol. It can support any kinds chip interface with the clock interface. For the Xtaless Clock chip, there is only the power pin, ground pin and clock pin. The interface is compatible with the existed 2-pin crystal oscillator which has the XI and XO two pins. The Xtaless clock pin is connected with the XO pin of the traditional crystal clock. There is no need to add the extra pin to the Xtaless Clock chip just for the traditional crystal clock power management interface.

Figure 15B:
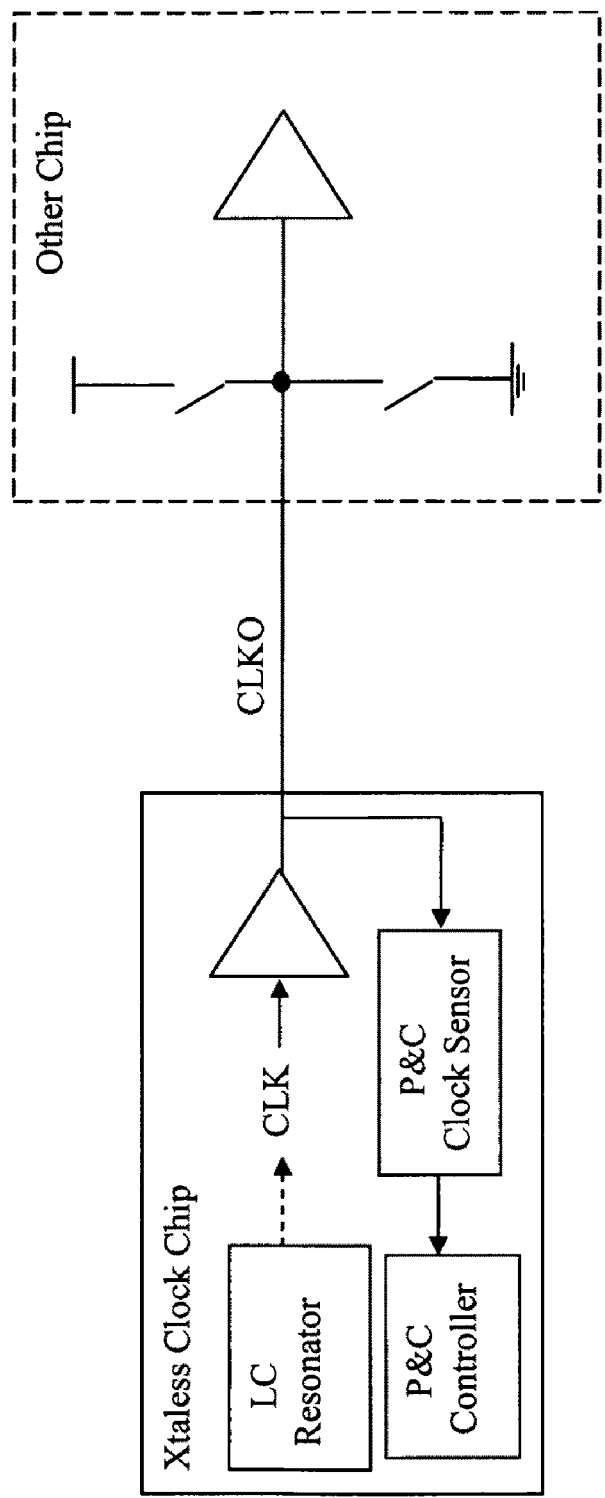

As shown in FIG. 15B, the other chip just needs to pull down or pull up the clock pin, then the Xtaless Chip can detect the pull-down and pull-up to change the P&C status. For the P&G management, there are the normal, doze, standby, suspend, etc state. For the CLKO, there are three states, tri-state, pull up and pull down. As the CLKO input of the other chip is in the tri-state, the P&G state stays in the original state. As the CLKO input of the other chip is in the pull down state, the P&G state moves down one state: as the CLKO input of the other chip is in the pull up state, the P&G state moves up one state, or vice versa. As the clock pin is pulled down, the P&C state can change from the normal to doze, standby, suspend, etc state. In other words, as the clock pin is pulled up, the P&C state can chance from the suspend, standby, doze, to etc states back to normal state. The state transition can be in sequence or in one-time of bi-state operation if the pull-up or pull-down is held for many clock cycles.

Figure 15C:
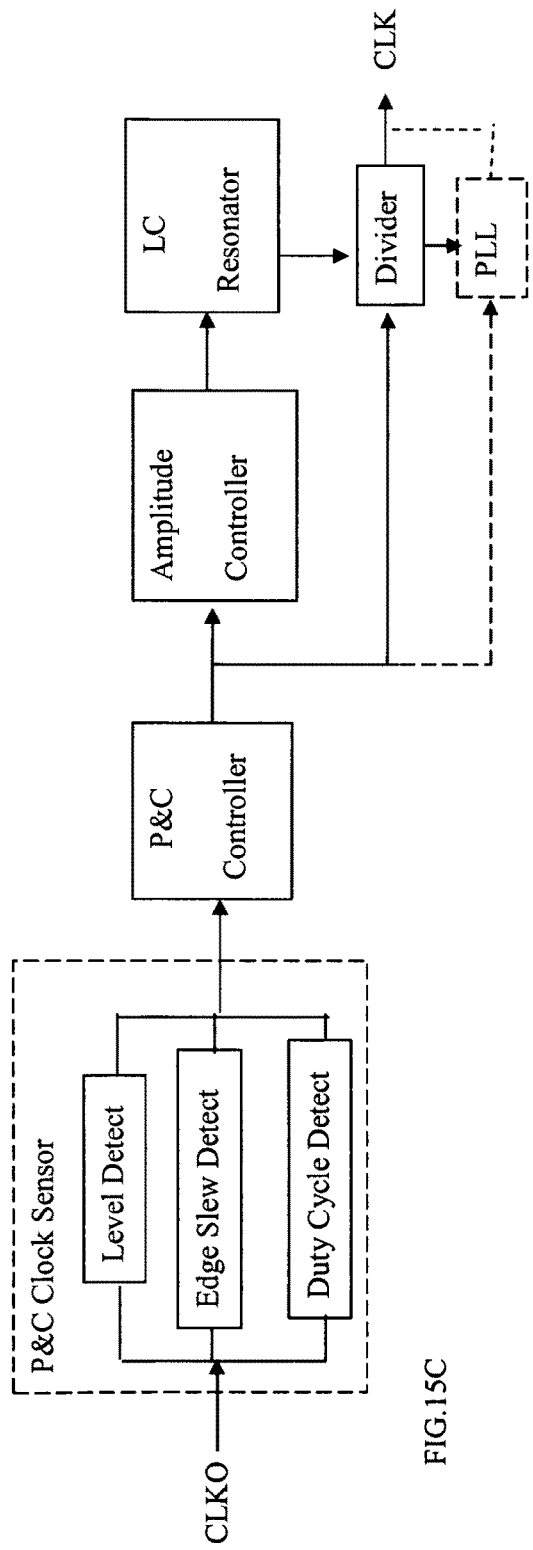

FIG. 15C shows the detailed signal flow block diagram for the P&C management. This P&C management can be applied to any kind resonator. Here, we just use our innovative Amplitude Controller Xtaless ClockChip as an illustrative example. The single direction clock signal pin CLKO is served as the bi-directional signal net in the P&C management. During the clock transmission, the other chip pulls up or pulls down the CLKO net, the voltage level, slew rate of the clock edge and the duty cycle will vary. The P&C Clock Sensor detects any variance of the voltage level, slew rate of the clock edge or the ditty cycle, it can determine it is tri-state, pull-up state or pull-down state. Either pull-up state or pull-down state, the state transition will transfer to the P&C control. After several cycles, if the state does not come back to the tri-state, then it is presume that this is the bi-state operation or just issues another same state transition command to move state continuously.

Figure 15E:
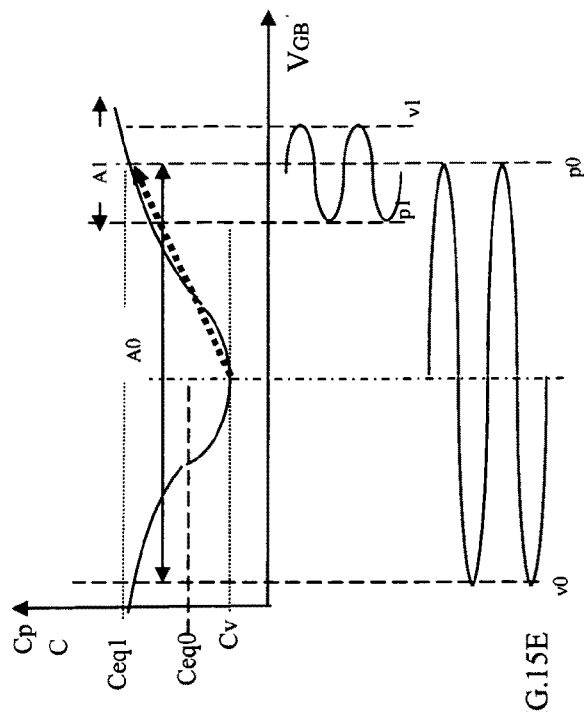
Figure 15D:
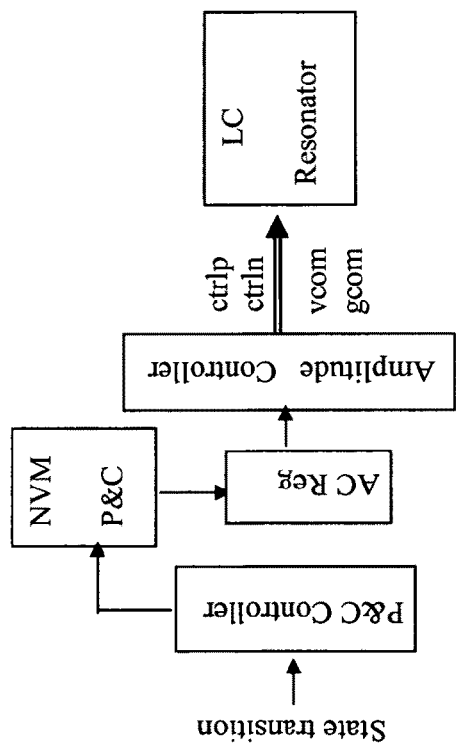

As shown in FIG. 15D, as the P&C controller receives the state transition command, the P&C Controller identify the correct P&G state memory in the NVM memory to load into the amplitude controller AC Register. Depending on the amplitude controller and oscillator design, the amplitude controller issues the amplitude controlling, bulk diode and capacitance controlling commands to the resonator. For example, the amplitude controller issues the amplitude controlling commands to control the vcom and gcom of the LC resonator; the amplitude controller issues the bulk diode or capacitance controlling commands to control the ctrlp, ctrln to control the capacitance of LC resonator.

To reduce the power dissipation, it needs to reduce the current flowing into the LC resonator. However, for the conventional frequency controller LC resonator, reducing the current, the frequency will increase instead of decreasing. The prior arts doesn't understand the reason that the prior arts add the extra redundant varactor diode to compensate the frequency shift effect. For the amplitude controller, we don't need to add the extra redundant varactor diode. As shown in FIG. 15E, we can change the substrate bias voltages ctrlp and min to shift the operating point to high capacitance range. So, even the power injecting the LC resonator is reduced, the frequency still can keep the same or even lower. If the clock frequency is needed to be reduced furthermore, as shown in the FIG. 15C, the divide ratio in the Divider or PLL can be changed to reduce the clock frequency in the P&C management.

In the test process, we need the fast scanning and decision capability. FIG. 16 shows the fast calibration for the LC resonator. The LC resonator is compared with the CLK_ref. First, the initial value is loaded into the register. Then start the counter. As the counter difference is large than 2, the counter is reset and the register value is increases or decreases depending on which counter has the larger value. As the counter value is larger than a large value, say 1000, the test is passed and the register value is stored back to the non-volatile memory NVM.

The principle and the essential characteristics of the amplitude controller are the amplitude control and the common mode control. However, there are versatile implementations of the amplitude controller. As shown in FIG. 17, it is the conjugate current mode amplitude controller. The conjugate pairs of the amplitude controller $V_{apo}$ Generator controls the sourcing current and the common mode controller $V_{cmo}$ Generator controls the sinking current, or the vice versa. As shown in FIG. 17B, the $V_{ref.apo}$ Gen is made of the $V_{ref.apo}$ Reg and the DAC. The DAC converts the digital value of the $V_{ref.apo}$ stored in the $V_{ref.apo}$ Reg to be the analog signal $V_{refapo}$. As shown in FIG. 17C, the $V_{ref.cmo}$ Gen is made of the $V_{ref.cmo}$ Reg and the DAC. The DAC converts the digital value of the $V_{refcmo}$ stored in the $V_{ref.cmo}$ Reg to be the analog signal $V_{refcmo}$. The most general $V_{ref.apo}$ Reg value is the temperature compensation of the $V_{ref.apo}$ TempReg. The most general $V_{ref.cmo}$ Reg value is the temperature compensation of the $V_{ref.cmo}$ TempReg. As the temperature varies, the $V_{ref.apo}$ TempReg and $V_{ref.cmo}$ TempReg are updated and the new values are loaded from the NVM into the registers to update the reference voltages $V_{refapo}$ and $V_{ref.cmo}$.

FIG. 18 is the addition of the bulk diode for the Xtaless Clock Chip voltage swing capacitance self-compensation. It also can add the extra pair of tunable capacitance in FIG. 6 for the LC resonator of the PLL type VCO.

Figure 19B:
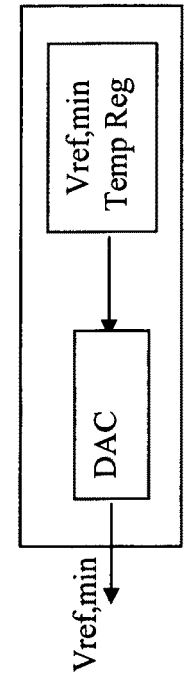
Figure 19C:
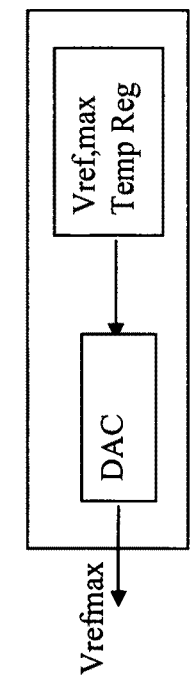

As shown in FIG. 19, it is another conjugate current mode amplitude controller. The conjugate pairs of the amplitude controller and the common mode controller of $V_{max}$ Generator controlling the sourcing current and $V_{min}$ Generator controlling the sinking current, or the vice versa. As shown in FIG. 19B, the $V_{ref.max}$ Gen is made of the $V_{ref.max}$ Reg and the DAC. The DAC converts the digital value of the $V_{ref.max}$ stored in the $V_{ref.max}$ Reg to be the analog signal $V_{refmax}$. As shown in FIG. 19C, the $V_{ref.min}$ Gen is made of the $V_{ref.min}$ Reg and the DAC. The DAC converts the digital value of the $V_{refmin}$ stored in the $V_{ref.min}$ Ret; to be the analog signal $V_{refmin}$. The most general $V_{ref.max}$ Reg value is the temperature compensation of the $V_{ref.max}$ TempReg. The most general $V_{ref.min}$ Reg value is the temperature compensation of the $V_{ref.min}$ TempReg. As the temperature varies, the $V_{ref.max}$ TempReg and $V_{ref.min}$ TempReg are updated and the new values are loaded from the NVM into the registers to update the reference voltages $V_{refmax}$ and $V_{ref.min}$. FIG. 20 is the addition of the bulk diode for the Xtaless Clock Chip voltage swing capacitance self-compensation. It also can add the extra pair of tunable capacitance in FIG. 6 for the LC resonator of the PLL type VCO.

For the LC resonator, the less the glitch at the common source nodes vcom and gcom, the better sinusoidal output voltage swing is. FIG. 21 is the amplitude controller has both the amplitude controller function and the glitch eliminating function for the common voltage source nodes of vcom and gcom. The outputs of Vo+ and V− have nearly perfect sinusoidal output. In other words, the Q of the LC resonator is much higher than the original amplitude controller circuit as shown in FIG. 17. This is the gain boost of the gain boost Q circuit for it to be the double gain-boost-Q DGBQ circuit.

FIG. 22 shows the alternative design of the double gain-boost-Q DGBQ circuit. The amplitude controller function is implemented with the $V_{max}$ and $V_{min}$.

FIG. 23 is the simplified double gain-boost-Q DGBQ circuit. It is the feedforward amplitude controller. It is relied on the following approximations:

$V$max=$v$com: $V$min=gcom:

Amplitude~$v$com−gcom=$V$max−$V$min

Common mode~($v$com+gcom)/2=($V$max+$V$min)/2

Furthermore, there are the other combinations such as (Vmax, VCM) and (VCM, Vmin) as shown by the optional.

For the (Vmax, VCM) combination:

Amplitude=($V$max−VCM)*2

Common mode=VCM

For the (VCM, Vmin) combination:

Amplitude=(VCM−$V$min)*2

Common mode=VCM

FIG. 24 and FIG. 25 show the amplitude controller being the hybrid of feedback and feed forward combination. The amplitude control uses the feedback control: the common mode control uses the feedforward control.

Amplitude=$V_{peak}$−$V_{valley}$ (feedback control)

Common mode=VCM (feedforward control/local feedback)

FIG. 24A is the N-type feedback amplitude control and feed forward/local feedback common mode control. It shows the inductor being implemented with the planar MS0 inductor. FIG. 24B is redrawn of the FIG. 24A with the latched amplifier having the inductor load. It shows the inductor being implemented with the planar MS0 inductor. FIG. 25A is the P-type feedback amplitude control and feed forward/local feedback common mode control. It shows the inductor being implemented with the planar MS0 inductor. FIG. 25B is redrawn of the FIG. 25A with the latched amplifier having the inductor load. The inductor is implemented with the planar MS0 inductor, too. However, no matter how, it still is the same as the characteristics of the amplitude controller to have both the amplitude control and common mode control. Nevertheless, the feedforward common mode control will destroy the high Q of the GBQ LC resonator. In the feedforward common mode amplitude controller, the common mode serves as both the power supply and the common mode. The injection current of the common mode will generate the glitch to destroy the high Q of the GBQ LC resonator performance.

Figures 24C, 24D:
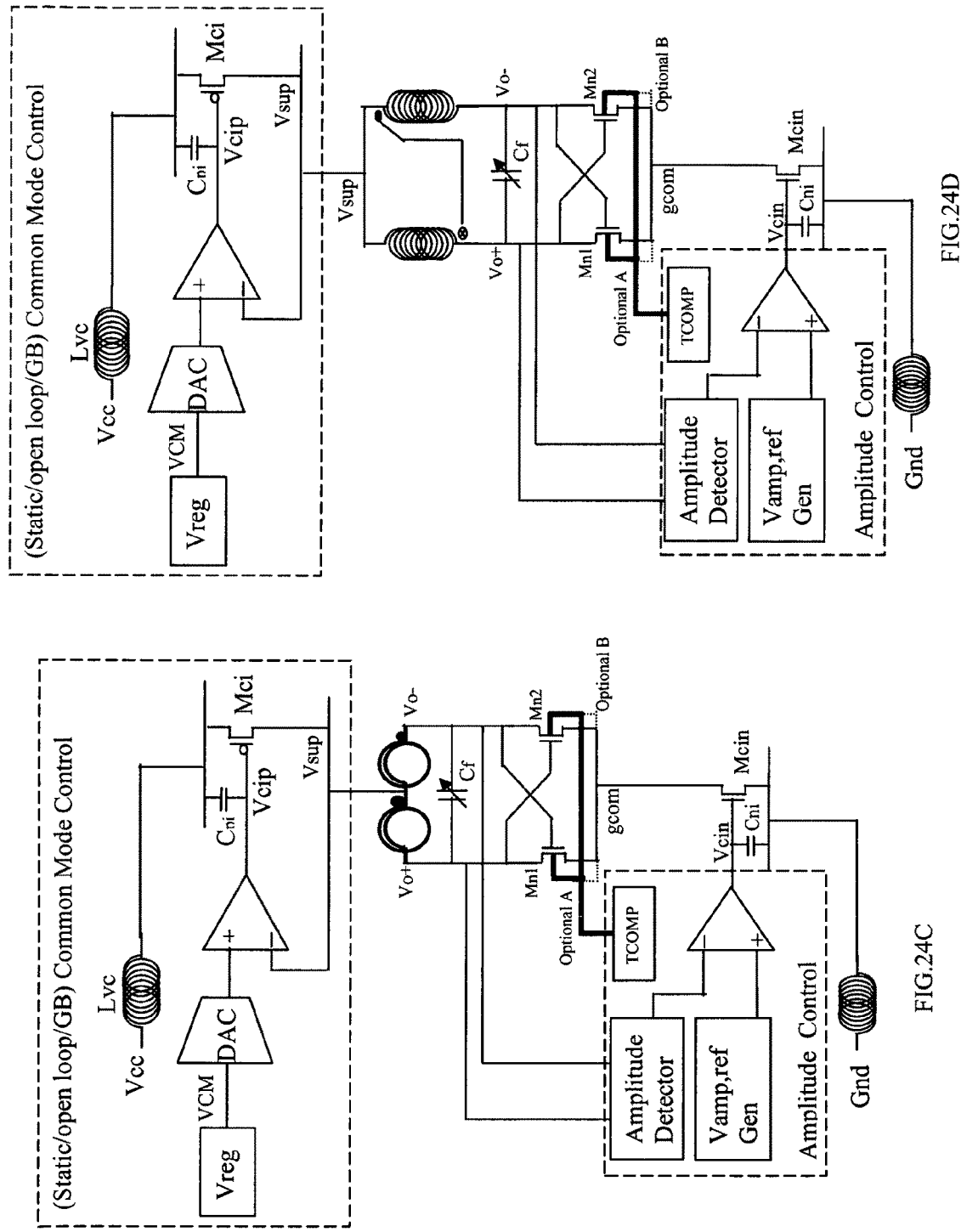
Figure 25D:
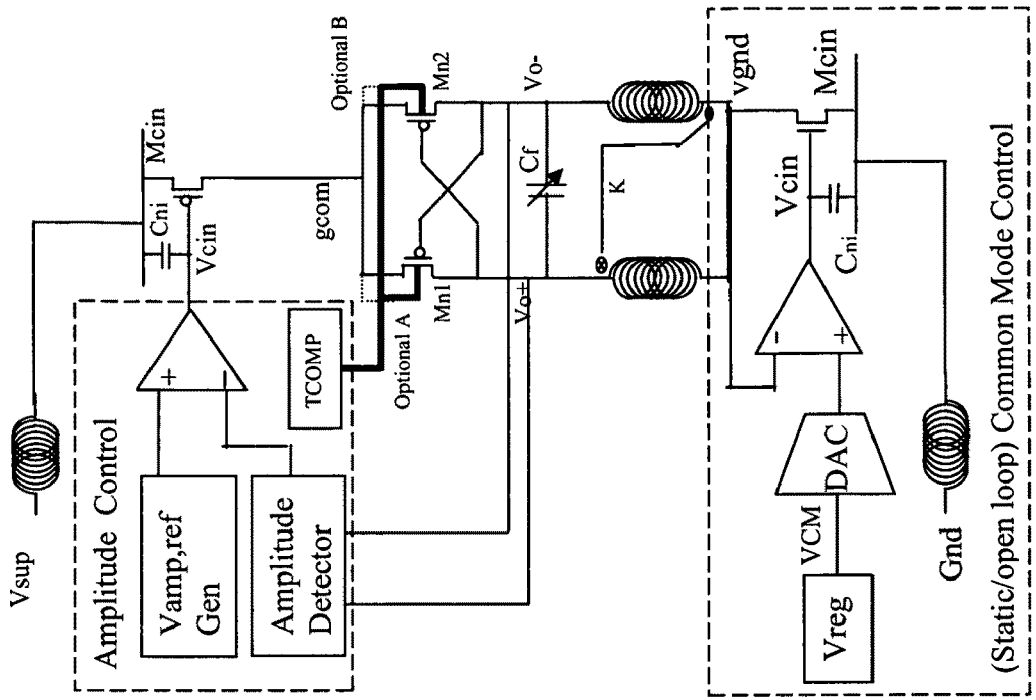
Figure 25C:
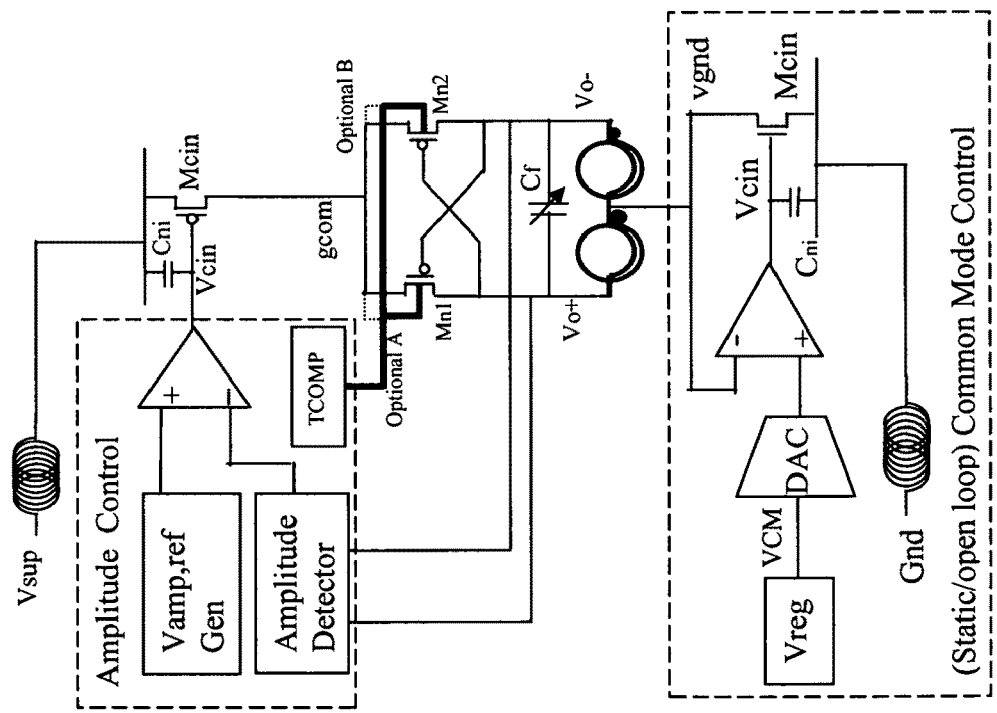

To solve the problem of high-Q being lost in the feedforward common mode, the gain boost architecture must be adopted as shown in FIG. 24C, FIG. 24D, FIG. 25C and FIG. 25D. FIG. 24C is the DBGQ version of FIG. 24A. FIG. 24D is the DBGQ version of FIG. 24B. FIG. 25C is the DBGQ version of FIG. 25A. FIG. 25D is the DBGQ version of FIG. 25B. FIG. 25D is a fully integrated full PMOS Low-Phase-Noise LC VCO. It can run 5 GHz. Now, there is the conjugate push-pull dual-loop control of the amplitude control and common mode control again. Just the man has two hands in the conjugate mode, the Double Gain-Boost-Q DGBQ amplitude controller has the conjugate push-pull dual-loop control of the amplitude control and common mode control. Just you cannot cut one arm to be the single-arm man, there is no way to use the feedforward common mode to walk around the high performance DBGQ conjugate push-pull dual-loop control. Even with the feedforward/local feedback common control, it is still the amplitude controller having both the common mode control and amplitude control. It still does not walk around the amplitude controller problems. However, the performance become even worse.

Figures 26A, 26B:
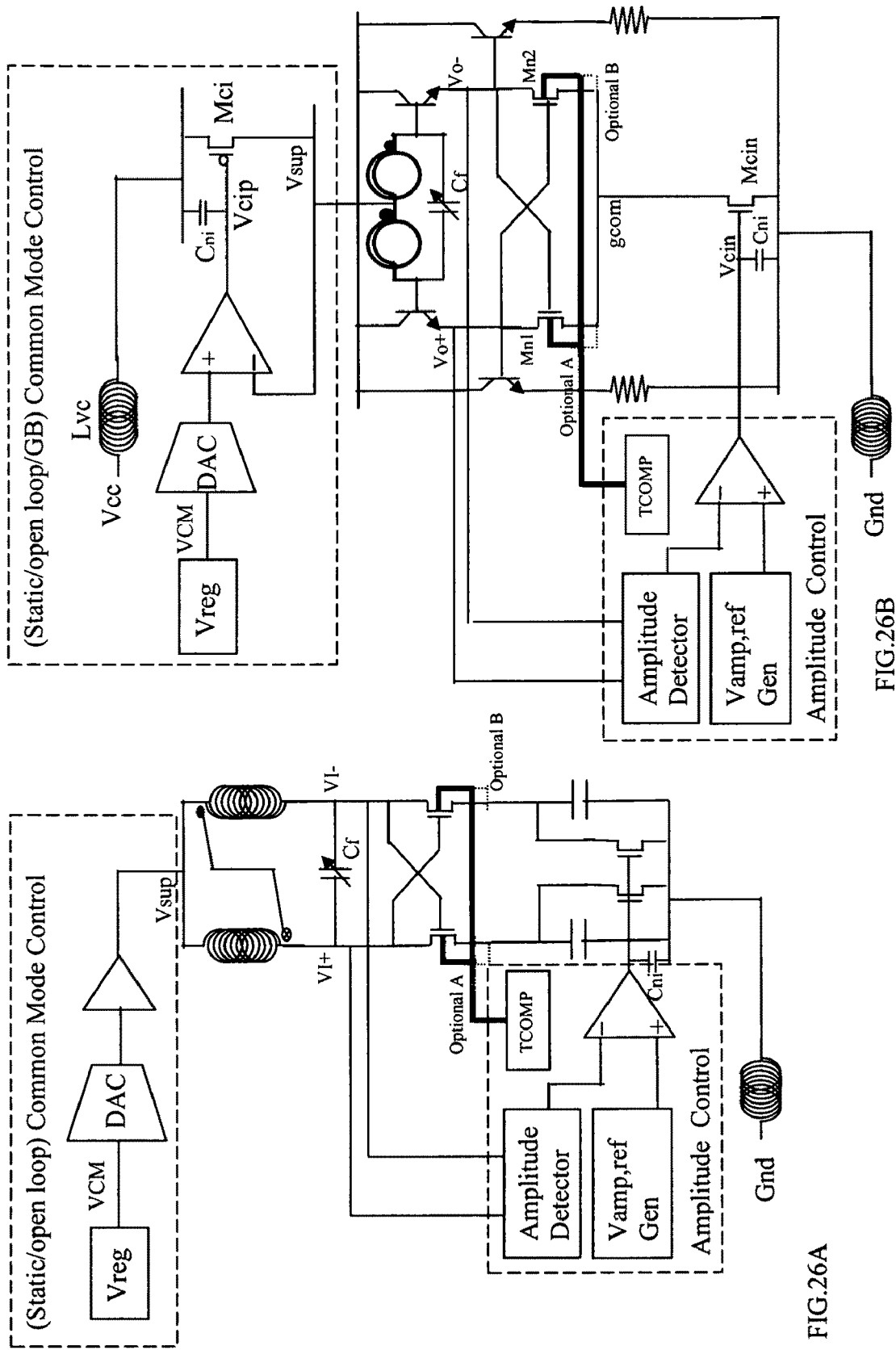

FIG. 26A is the amplitude controller applying to the source degenerated LC VCO. It can run 25 GHz. FIG. 26B is the amplitude controller applying to the high-frequency LC VCO design using emitter degenerated capacitive degeneration.

Figure 27A:
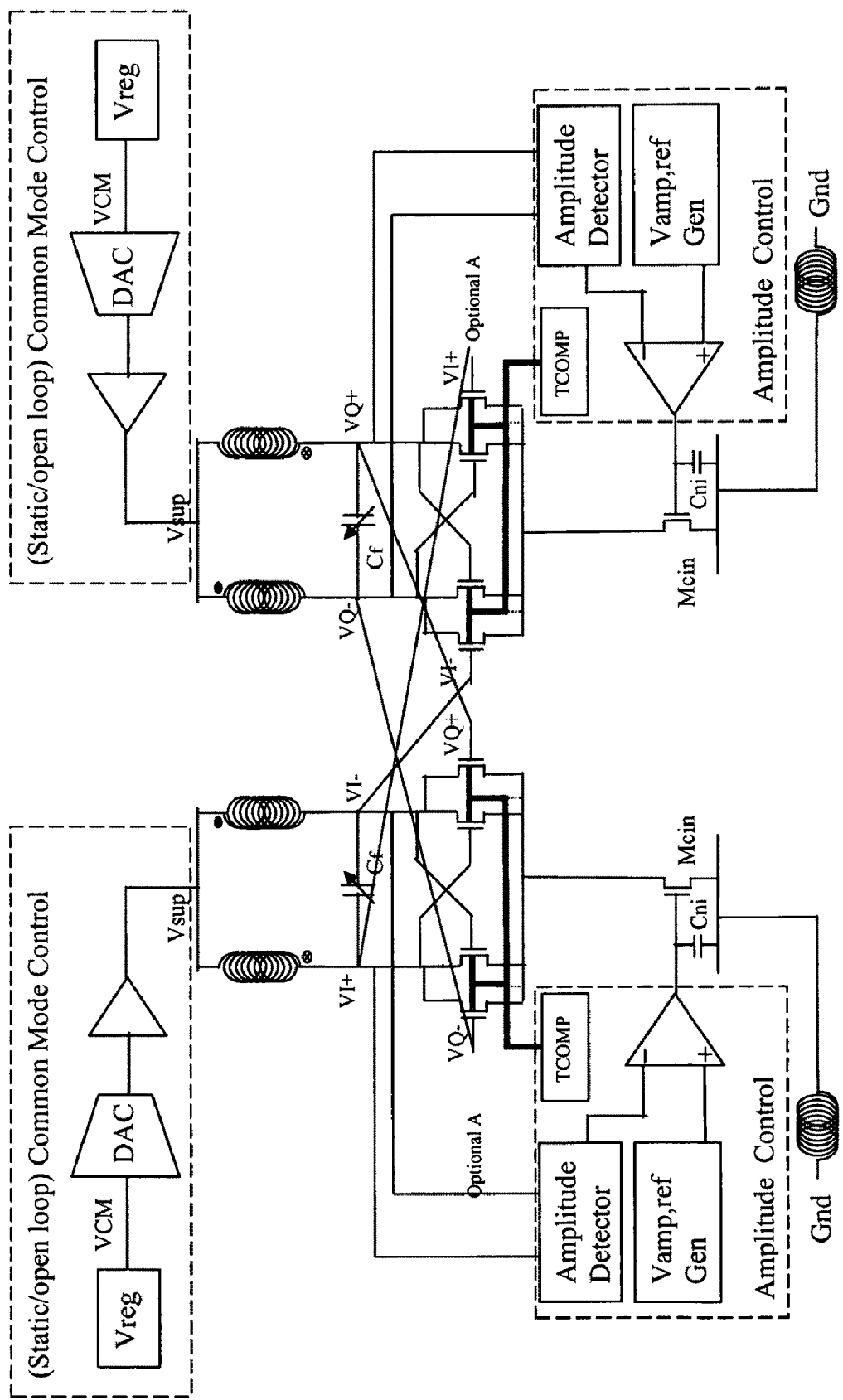
Figure 27B:
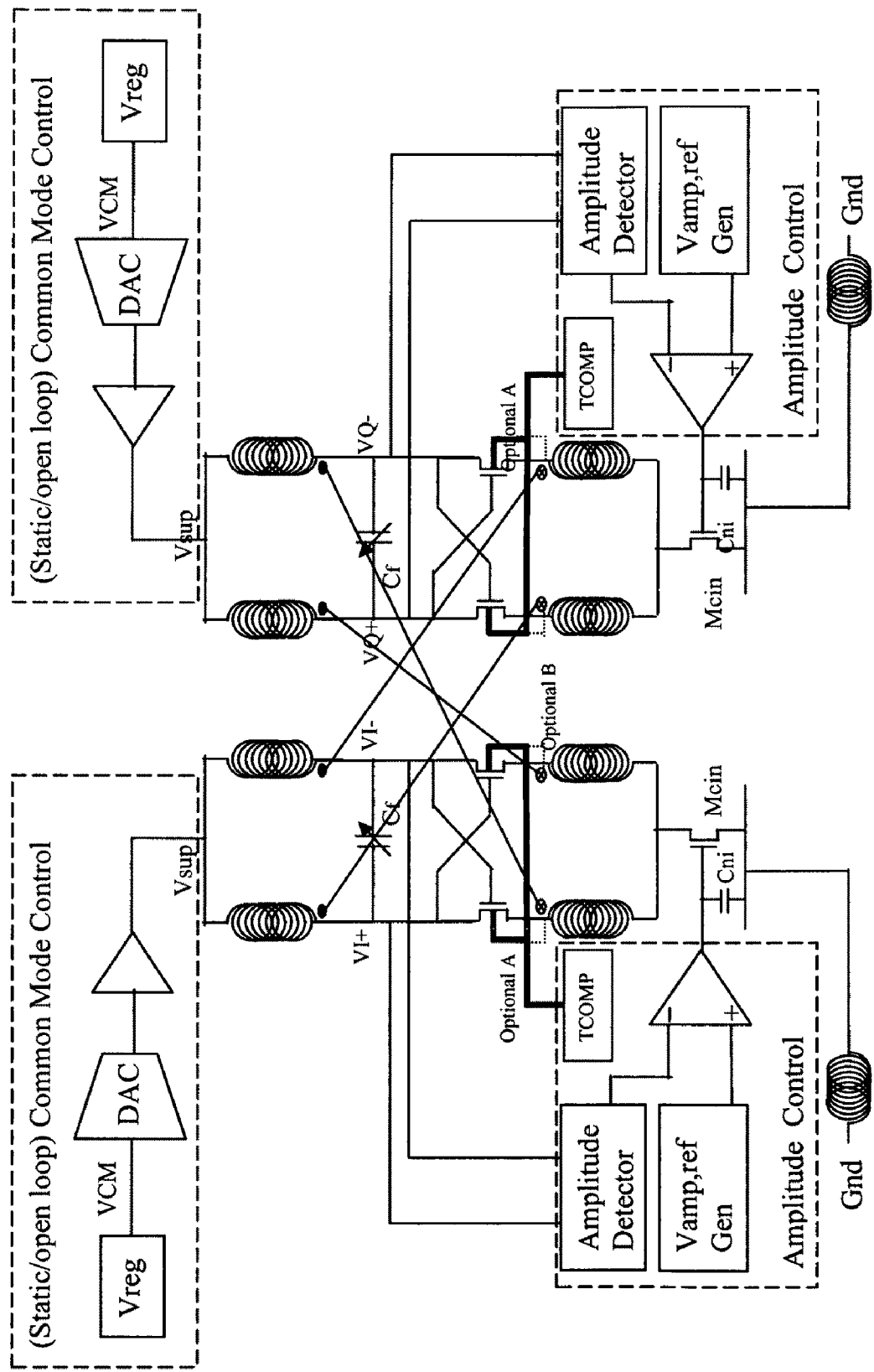
Figure 28B:
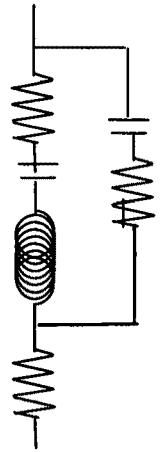
Figure 28A:
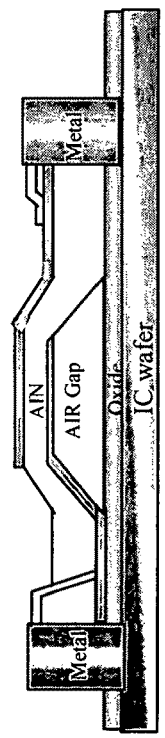
Figure 28D:
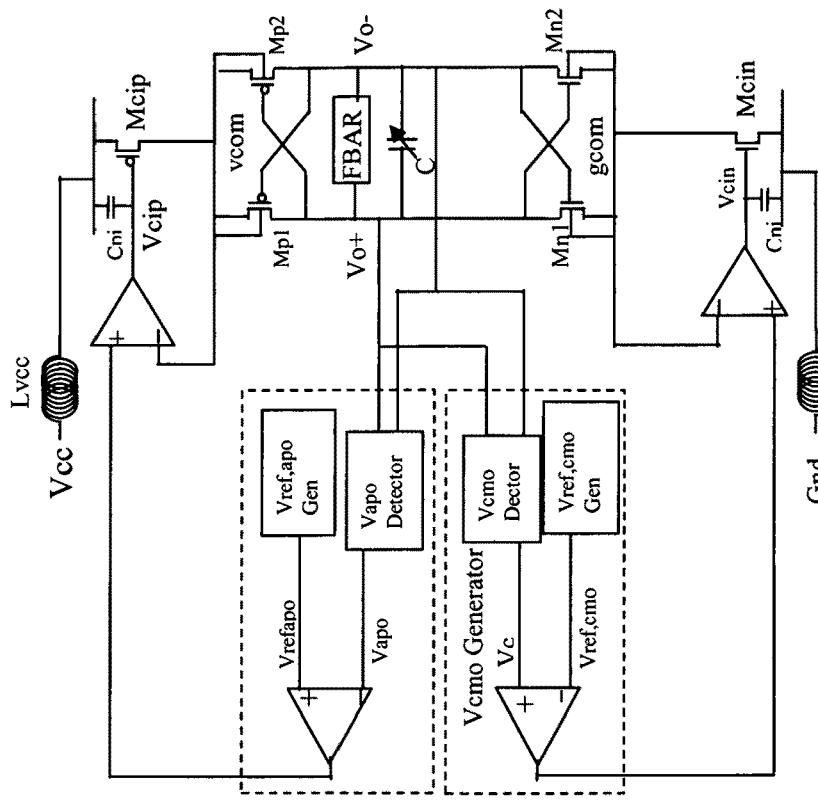
Figure 28C:
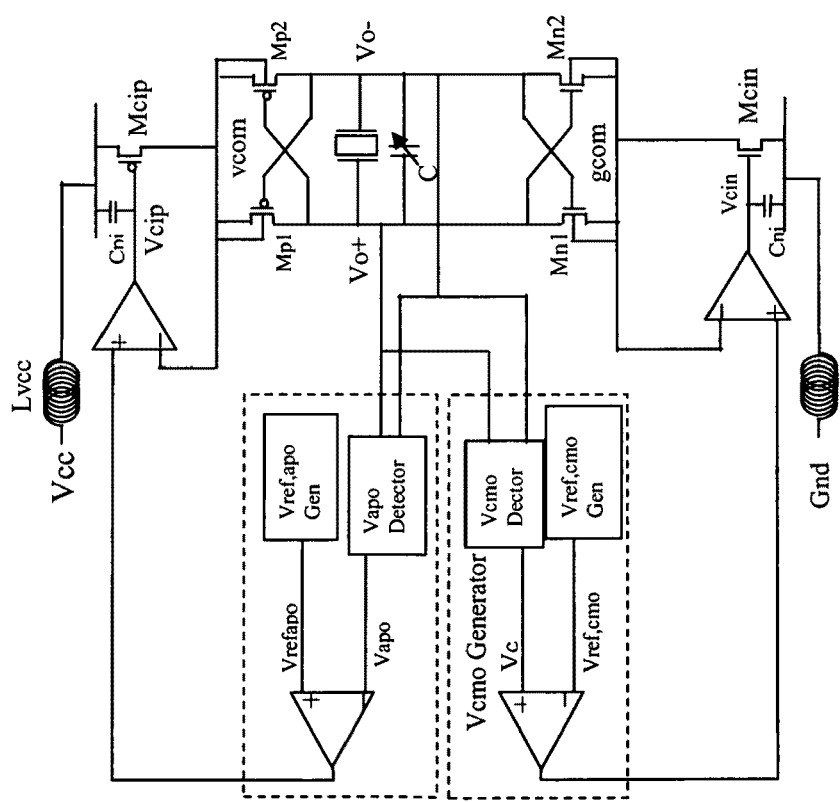

FIG. 27 is the amplitude controller applying to the quadratic QVCO. There are two kinds of quadratic QVCO: 1) the electric coupling: 2) the magnetic coupling. For the electric coupling, there are three types of QVCO, a) P-QVCO: TS-QVCO: c) BS-QVCO. FIG. 27A is the schematic views of the amplitude controller applying to the electric coupling quadratic P-QVCO with parallel coupling transistors. TS-QVCO is the coupling transistor is at the top of the latched NMOS. BS-QVCO is the coupling transistor is at the bottom of the latched NMOS. There have the same electric coupling mechanism. FIG. 27B is the amplitude controller applying to the magnetic coupling quadratic QVCO. The inductor could be replaced by transformer. The CMOS Quadrature VCO based on transformer coupling can run 17-GHz at low voltage and low power. The planar inductor as shown in FIG. 38 and FIG. 39 has the best on-chip transformer coupling properties. A Green Technology Platform apparatus comprises an on-chip LC or magnetic-electric resonator. The LC or magnetic-electric resonator comprising a inductor or magnetic means and capacitor. The inductor or magnetic means has its magnetic field flux being guided by a plurality of soft magnetic material layers. The magnetic field flux can be the center of magnet. The center magnetic field flux can be the toroid magnetic or planar inductor.

FIG. 28 is the amplitude controller applying to the crystal oscillator and the FBAR oscillator. FIG. 28A is the section view of voltage-tunable film bulk acoustic resonator (FBAR). FIG. 28B is the electric model of the film bulk acoustic resonator (FBAR). The FBAR has the similar electrical model as the crystal. Both of them are equivalent to the inductor. As shown in FIG. 28C, the amplitude controller applying to the crystal oscillator. Similarly, as shown in FIG. 28D, the amplitude controller applying to the FBAR oscillator. It is the on-chip voltage-tunable film bulk acoustic resonator FBAR VCO.

Figure 29A:
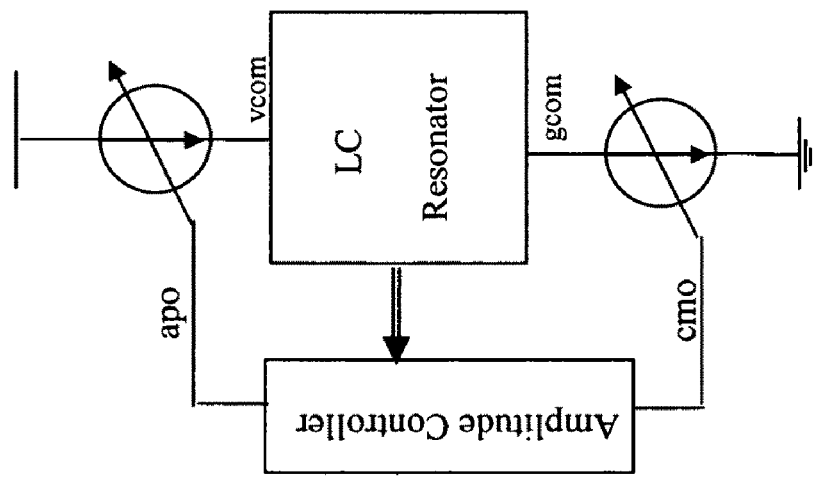

FIG. 29 shows the most advanced amplitude controller in the high-level block diagrams. FIG. 29A is the gain-boost-Q GBQ LC resonator has the amplitude controller controlling the conjugate current sources. For example, the amplitude controlling signal apo controls the sourcing current and the common mode controlling signal trio controls the sinking current. FIG. 29B shows the ultra-high performance double-gain-boost-Q DGBQ LC resonator. The voltage sources vcom and gcom are supplied to the LC resonator. The Differential Amp has the de-glitch effect. The Vcmo provides the common mode information to the Differential Amp to set the common mode of the vcom and gcom. FIG. 29C is the ultra-high performance double-gain-boost-Q DGBQ LC resonator having the MOS devices to serve as the bulk diode, too. The ctrlp controls the bulk bias of the NMOS: the ctrln controls the bulk bias voltage of the NMOS. The temperature induced capacitance variance of the MOS devices is self-compensated with the biasing controlling voltages ctrlp and ctrln.

Figure 30A:
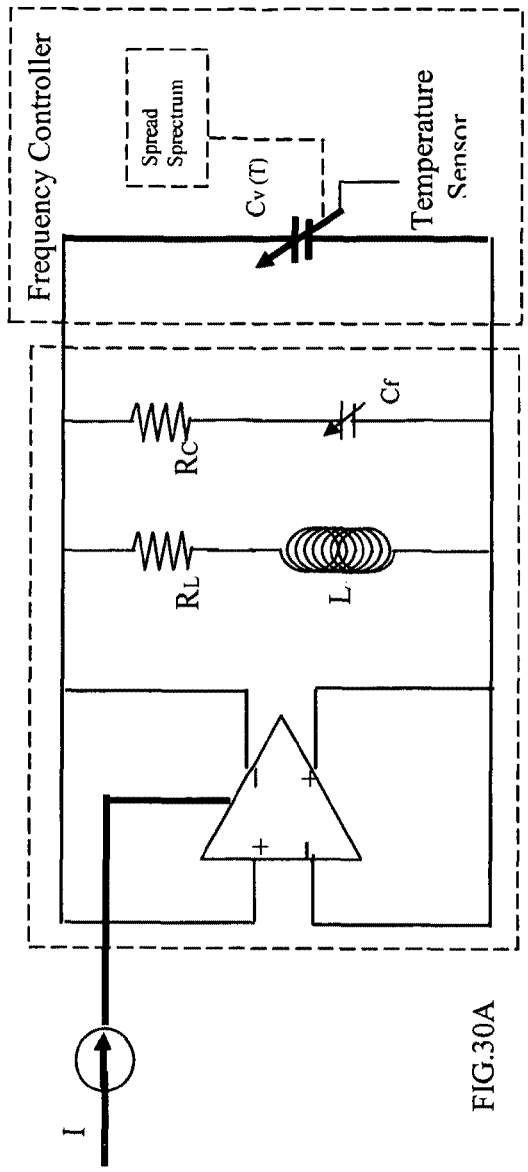

FIG. 30 shows the difference between the conventional frequency controller and our amplitude controller. As shown in FIG. 30A, it is the frequency controller LC resonator. The characteristics of the frequency control are the (1) current mode power supply: (2) using the varactor capacitance Cv(T) to compensate the temperature induced the catastrophic frequency variation due to the MOS devices; (3) has to compensate the $1^{st}$ order large temperature variation; (4) is the set & go type open-loop free running.

The temperature sensor is to adjust the varactor diode controlling voltage to change the Cv(T) capacitance directly. It is an open loop set & go system. There is no close loop feedback and no check for the supply current, etc. Everything is set and go. Even the prior art adopts the part of GBQ technology derived from our amplitude controller, however, it still doesn't use the variance of the amplitude to control the variance of the frequency. It still uses the varactor diode to vary the frequency. As shown in FIG. 6B, the spectrum spreading of the oscillation is due to the voltage swing inducing the variance of bulk capacitance and varactor capacitance to have the self-modulation change the frequency.

Figure 30B:
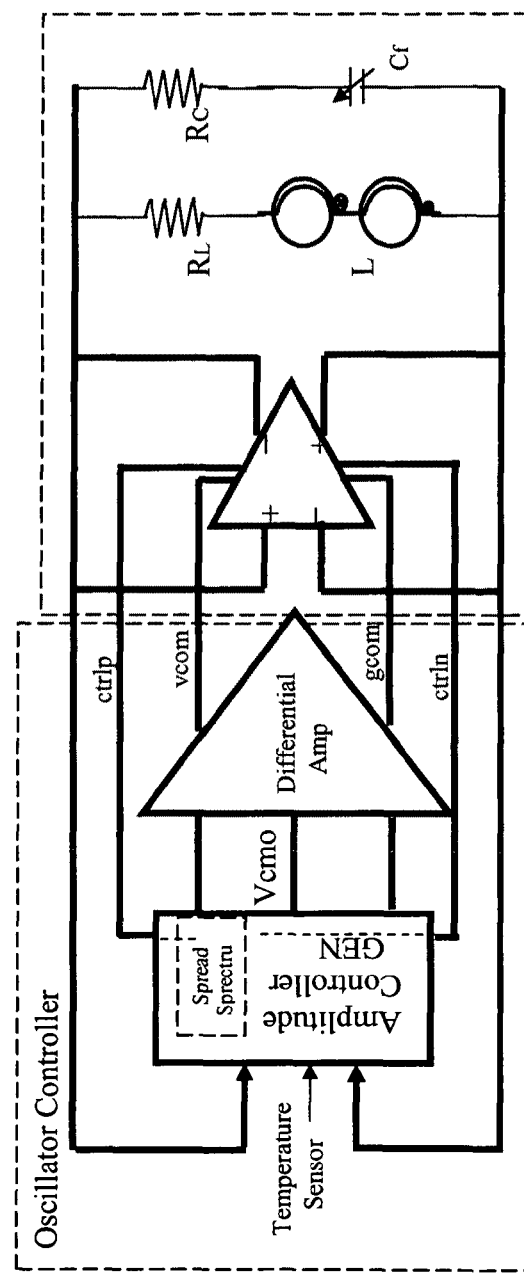

FIG. 30B shows the amplitude controller LC resonator. A Green Technology Platform apparatus comprises a reference resonator adapted to provide the reference signal having a resonant frequency. An amplifier is coupled to the reference resonator. An amplitude oscillator controller coupled to the reference resonator and the amplifier, amplitude control is for the reference signal. The amplitude oscillator controller is adapted to stabilize the reference resonator to control the resonant amplitude having an amplitude for controlling the frequency of reference resonator. The characteristics of the amplitude controller LC resonator are (1) Voltage mode power supply: (2) using the vcom, gcom to control the amplitude to have the $1^{st}$ order self-compensation of the frequency variance; and (3) using the ctrln, ctrlp to control the biasing voltage of the bulk diode to have the MOS self-compensation without the need of the extra varactor diodes: (4) it needs just to compensate the $2^{nd}$ order temperature induced variation; (5) is due closed-loop feedback control and the feedback control having the self-compensation effect.

The temperature sensor sends the information to adjust the amplitude of the LC resonator. There is no necessary to have the varactor to vary the capacitance of the LC resonator diode. The thick lines shows the amplitude controller being a closed-loop feedback control system. As shown in FIG. 6C, there is the self-compensation for the temperature variation of the MOS bulk diode capacitance with the ctrlp and ctrln.

Figures 31A, 31B:
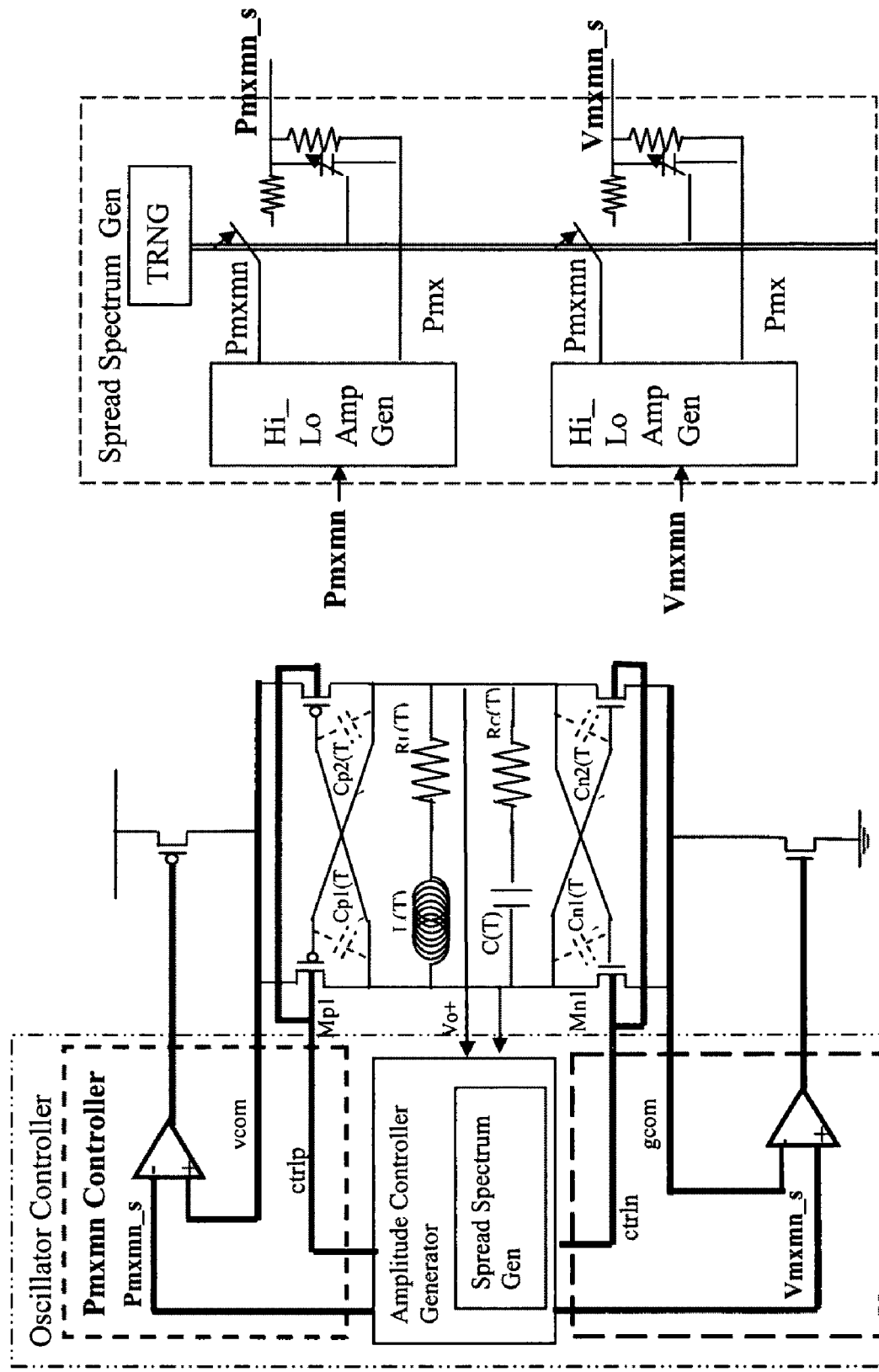
Figure 32B:
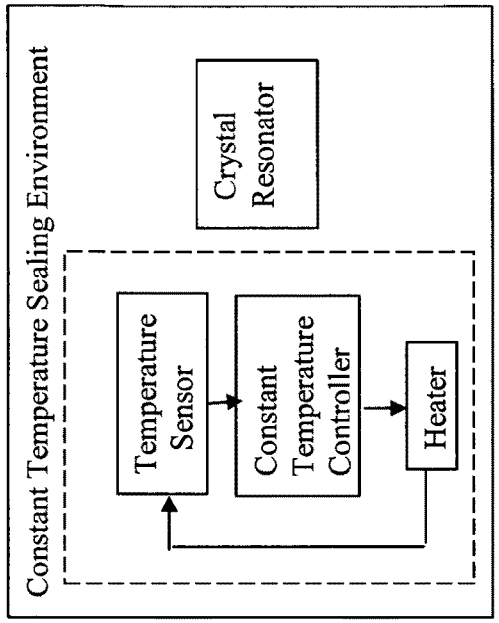
Figure 32D:
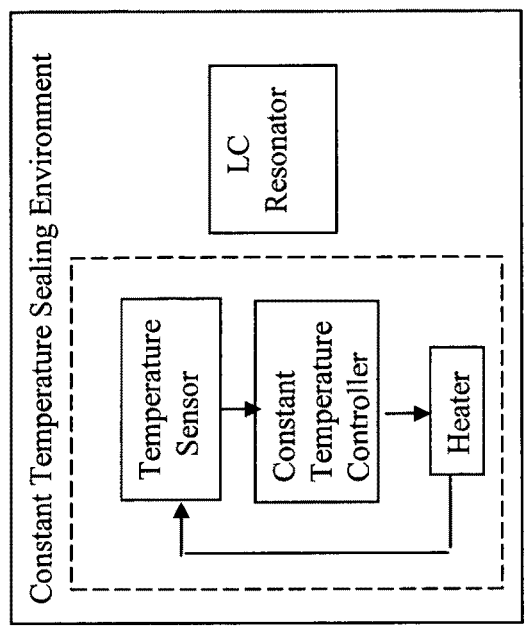
Figure 32A:
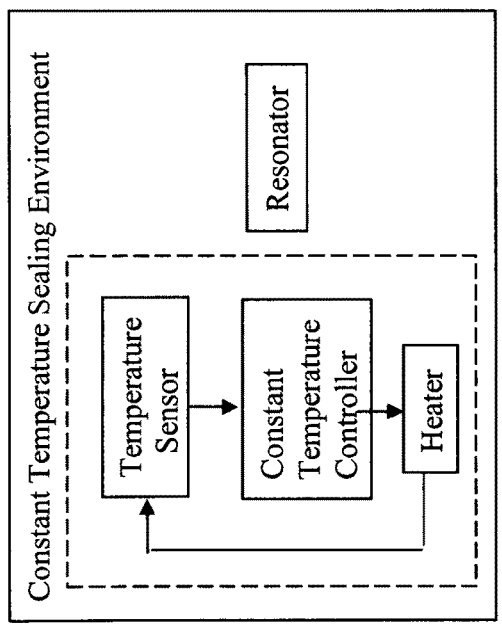
Figure 32C:
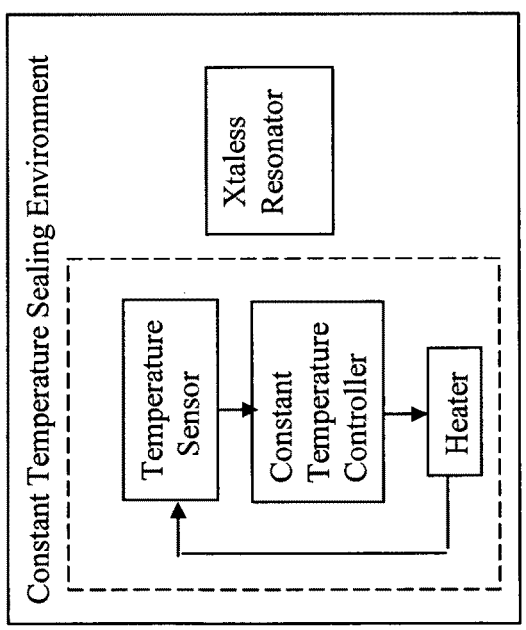

FIG. 31 shows one kind implementation of the spread spectrum for the oscillator controller having the amplitude controller. Referring to FIG. 7A and FIG. 31A, the spread spectrum is embedded in the amplitude controller. As shown in FIG. 31B, the amplitude controller signals such as the $P_{mxmn\_s}$ and $V_{mxmn\_s}$ are slightly modulated with the True Random Number Generator TRNG in the charging & discharging process between the finite intervals of the amplitude controller voltages.

FIG. 32 shows the ClockChip having peak-performance. As shown in FIG. 32A, to get rid of the temperature variance effect, the resonator and the constant temperature environment are incorporated together in the sealing environment. As shown in FIG. 32B, the resonator can be the Crystal Oscillator. The scaling environment is the high cost ceramic package. As shown in FIG. 32C, the resonator can be the Xtaless Resonator to be the Xtaless ClockChip. For the Xtaless ClockChip, the chip package itself is a constant temperature scaling environment. As shown in FIG. 32D, the LC resonator can serve as IP in the other chip.

Figure 33A:
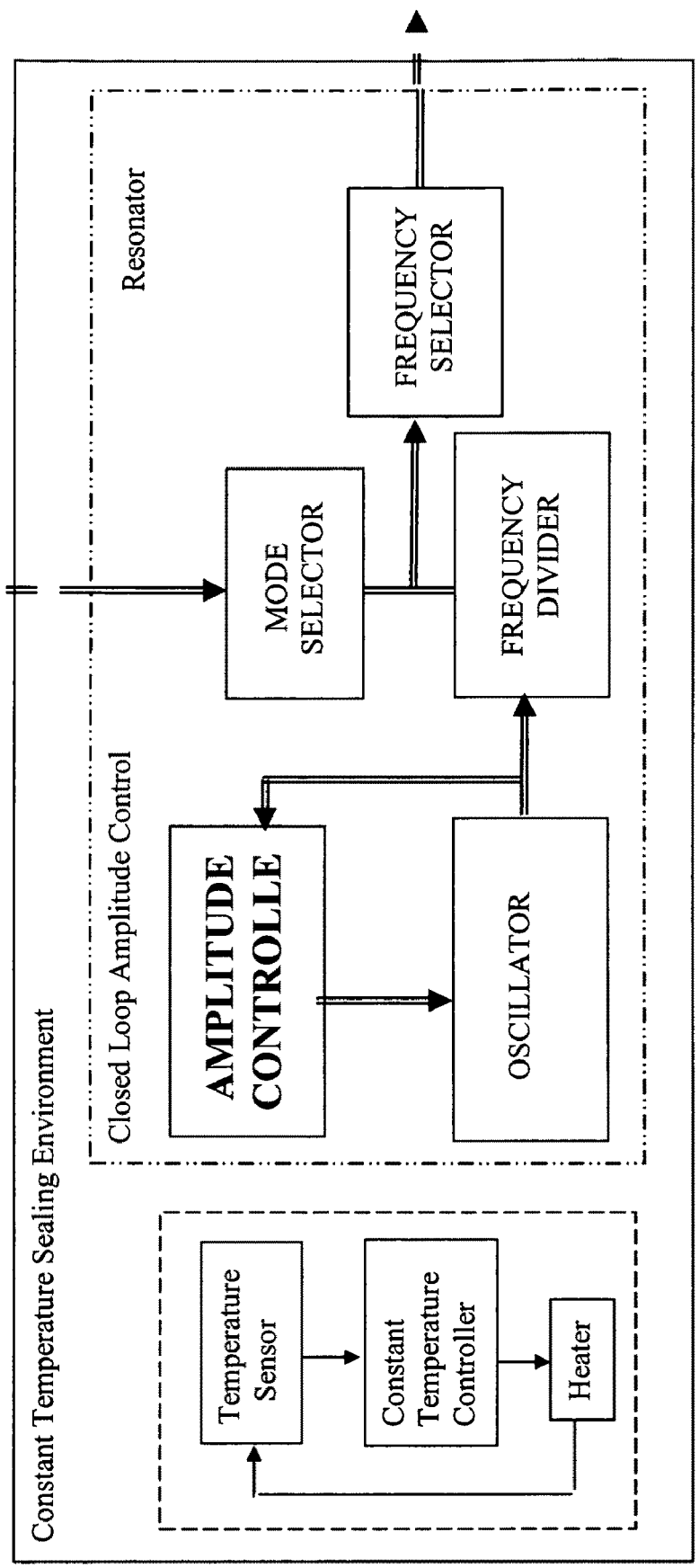
Figure 33B:
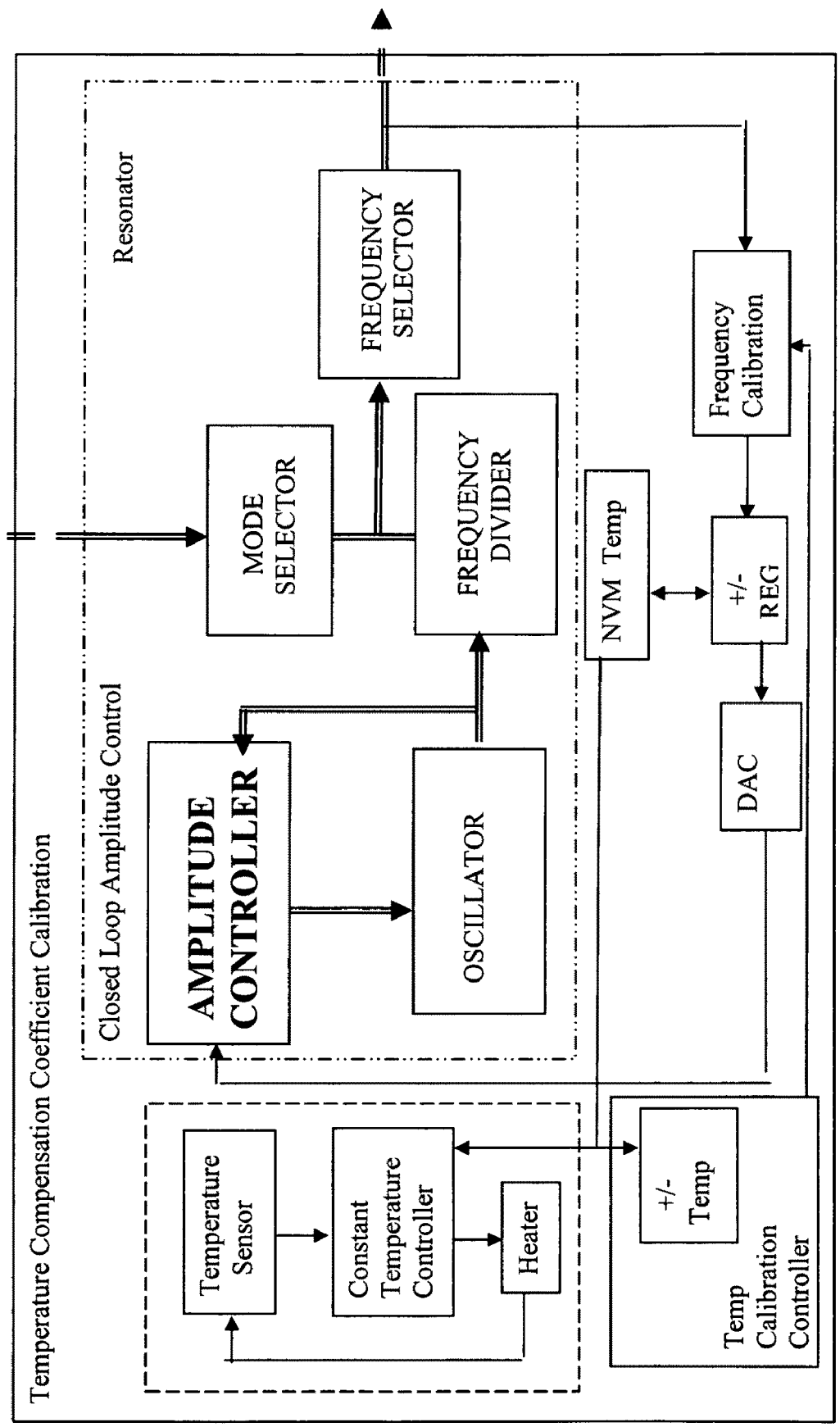

FIG. 33A shows the ultra-performance constant temperature Xtaless ClockChip. There is on-chip heater, the temperature sensor and the constant temperature controller to control the chip temperature to be constant that there is no need for the temperature compensation at all. FIG. 33B is the on-chip heater coupling with the frequency calibration system to make the fast scan for the temperature compensation calibration in the test procedure. A Green Technology Platform apparatus comprises a resonator accommodating to generate a plurality of clock signals having a resonant frequency and an oscillator controller to control the resonator. The oscillator controller further comprises a plurality of electronic heater to control the temperature of the resonator during calibration or testing processes. The temperature calibration controller cooperates the constant temperature controller and the frequency calibration to make the fast trimming process for the temperature coefficients stored in the NVM. The Temp Calibration Controller issues the temperature increment command to the Constant Temperature Controller. As the temperature becomes stable, the Temp Calibration Controller issues the Frequency Calibration command to make the frequency calibration. The frequency calibration process is as shown in FIG. 16. As the frequency calibration finishes the calibration, then issues the "done" command to the Temp Calibration Controller. Then the Temp Calibration Controller can start the temperature coefficient calibration for the next temperature. Due to the fast calibration process, theoretically, the Xtaless ClockChip can calibrate to have almost constant frequency over the temperature as we desire.

The humidity-independent, Mosisture-Sensity-Level 0 MSL0 relies on the EMI-Free planar Inductor. The prior art LC resonator has the moisture changing the oscillation frequency to be 500 ppm. The compact EMI-Free planar Inductor has many important applications in green technology. As shown in FIG. 34, the transformer allows the low voltage CMOS circuit to couple with the high voltage 110V(AC). With the EMI-Free planar Inductor, the single chip PMU chip can convert the AC power supply directly to the LCD TV power supply. As shown in FIG. 35A, with the EMI-Free planar Inductor, the modern home wall socket can provide the smoker socket which has the 12V output power. In such case, the automobile vacuum cleaner, etc having the 12V power can be used in home directly. As shown in FIG. 35B, with the single input multiple output technology as shown in FIG. 36A, the socket also can have the USB socket.

FIG. 36A shows the direct conversion from the AC input to the multiple outputs for the LCD, smoke plug and USB, etc with the single input multiple output technology. There is one switch button 87 to disable the SIMO single-input-multiple-output SM switching Mode power supply to save the power. The conventional strategy is to use the shottky diode in the rectifier. Therefore, the converted power level is high. For the high voltage operation, the component is individual on-board component and its cost is high. Our design strategy is to have the solid state integrated solution for the single chip PMU solution. The transformer 85 made of the planar magnet converts the high AC voltage to the low voltage directly that the solid state IC can handle easily. The transformer 85 can be implemented as the board-embedded planar magnet 85b as shown in FIG. 42 or on-chip planar magnet as shown in FIG. 39. For the low-voltage operation, to minimize the power loss, the rectifier 86 adopts the MOS devices instead of the schottky diode. The power factor correction PFC and the boost converter are merged together to have the single-input-multiple-outputs in one stage. To have the high power-efficiency more than 98%, the innovative architecture is adopted. The planar inductor 87 has the capacitor Cs connected at the middle node. The switch MOS MS adopts the Zero-Voltage Switch ZVS as shown is FIG. 36B. The output switch adopted the PMOS switches to minimize the power loss. With the planar magnet technology, all the switch adopts the recycling switching drive to save the switch loss that the switch power can operate at the high frequency. FIG. 36C1 is the switch mode power supply SMPS and low drop voltage regulator LDVR together to be the SM&LDVR switch mode low drop voltage regulator. SM&LDVR has the fast response of the LDVR and power efficiency of the SMPS. The SMPS has the PWM, PFM or PHM mode. Furthermore, as shown in FIG. 36C2, to save the power, the LDVR has the SMLDVR and idle mode. FIG. 36D shows the SMLDVR can further configure as the buck mode or boost mode power supply.

Figure 37B:
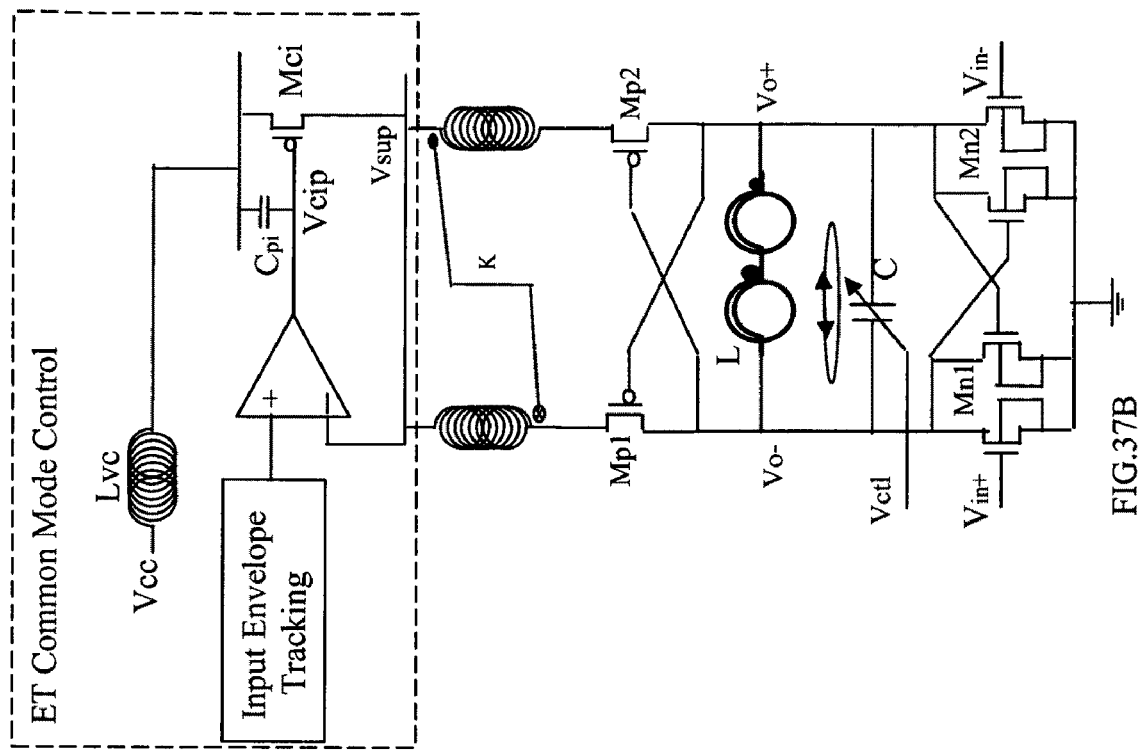
Figure 37A:
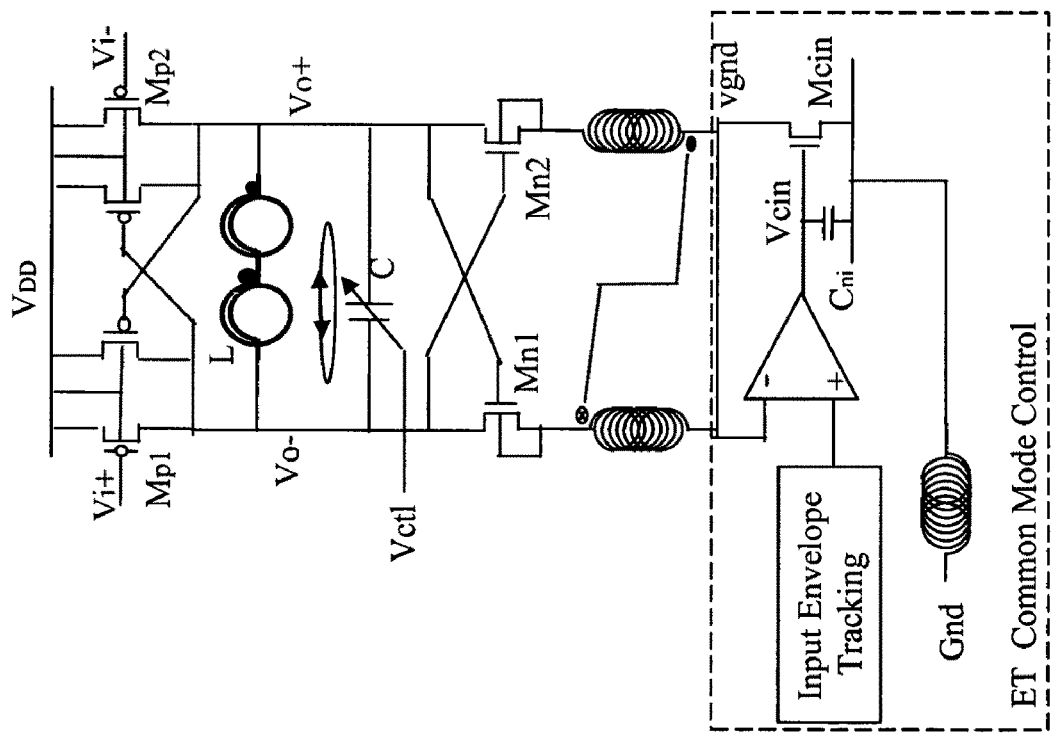

Furthermore, the planar inductor and amplitude control technology can be applied to the RF field such as the Sawless LNA and high power efficiency power amplifier. FIG. 37 is the amplitude controller and common mode technologies applying to the envelope extraction recovery EER of power amplifier. Instead of constant amplitude, the amplitude controller for the power amplifier has the amplitude to vary being proportional to the input signal. FIG. 37A is the N type envelop extraction recovery EER of power amplifier. The $V_{gnd}$ set the common mode. The oscillation amplitude will be double between the voltage difference of $V_{DD}$ and vgnd. The amplitude control circuit can boost up the power efficiency. FIG. 37B is the P type envelop extraction recovery EER of power amplifier. The $V_{sup}$ set the common mode. The oscillation amplitude will be double between the voltage difference of $V_{sup}$ and ground. The amplitude control circuit can boost up the power efficiency.

The Green Technology Platform apparatus comprises an on-chip LC resonator. The LC resonator comprises an inductor and capacitor. The inductor of said LC resonator is EMI-free inductor. FIG. 38A shows the fundamental principle of the planar magnet. The magnetic field B// is parallel to the surface 88. It is the directional guided magnetic field flux. FIG. 38B and FIG. 38C are the different symbols for the planar magnet. FIG. 39A is the top view of planar magnet made of the current loop 83. To reduce the eddy loss, the magnet 82s is in the form of slices. The magnet 82s material can be SiFe. FIG. 39 shows the alternative design of the planar magnet 82. It is in the shape of the plate. FIG. 39C shows the cross-section of the planar magnet. There is no gap of the magnet 82s. FIG. 39D shows the alternative design of the planar magnet 82s. FIG. 39E is another implement of the planar magnet 82s. FIG. 39F is the planar magnet can be used the simplest dipping process to coating a thin layer of the magnet 82s on the wafer 89. FIG. 39G shows the whole die 89 is covered with the magnet material 82s. This process is cheap. However, the performance will be degraded.

There are other type EMI-Free planar which can be made with the MEM process. FIG. 39H1 is the top view of the EMI-Free spiral-type planar inductor. The current loop 830 generates the magnet flux flow in the magnet 820. FIG. 39H2 is the section view of the EMI-Free spiral-type planar inductor. FIG. 39I1 is the top view of the EMI-Free solenoid-type planar inductor. The current loop 831 generates the magnet flux flow in the magnet 821. FIG. 39I2 is the section view of the EMI-Free solenoid-type planar inductor. FIG. 39J1 is the top view of the EMI-Free toroidal-meander-type planar inductor. The current loop 832 generates the magnet flux flow in the magnet 822. FIG. 39J2 is the section view of the EMI-Free toroidal-meander-type planar inductor. They all have the EMI-Free effect which can be applied to the on-chip LC resonator to have the EMI-Free MS0 LC resonator.

The EMI-Free structure can be applied to the integrated EMI-Free LC resonator. As shown in FIG. 40 and FIG. 41. EIMC is the Electric Insulation Magnetic Conductive layer.

With EIMC, the magnet confinement material serves as the capacitor plate, too. FIG. 40 is the single integrated LC resonator. FIG. 40A is the inductor current flowing in the direction to charge up the top magnetic confinement which serves as the top plate of the capacitor Vo+. FIG. 40B is the capacitor charge storage distribution after the charge up. FIG. 40C is the inductor current flowing in the reverse direction to charge the bottom magnet confinement which serves as the bottom plate of the capacitor Vo−. FIG. 40D is the capacitor in the reverse charge storage state. This FIG. 40A, FIG. 40B, FIG. 40C and FIG. 40D four processes are repeated as the LC resonates.

FIG. 41 is the dual integrated LC resonator. FIG. 41A is the inductor current flowing in the direction to charge up the top magnetic confinement which serves as the top plate of the capacitor Vo+. FIG. 41B is the capacitor charge storage distribution after the charge up. FIG. 41C is the inductor current reverse flowing in the reverse direction to charge the bottom magnet confinement which serves as the bottom plate of the capacitor Vo−. FIG. 41D is the capacitor in the reverse charge storage state. This FIG. 41A, FIG. 41B, FIG. 41C and FIG. 41D four processes are repeated as the LC resonates.

Figure 42B:
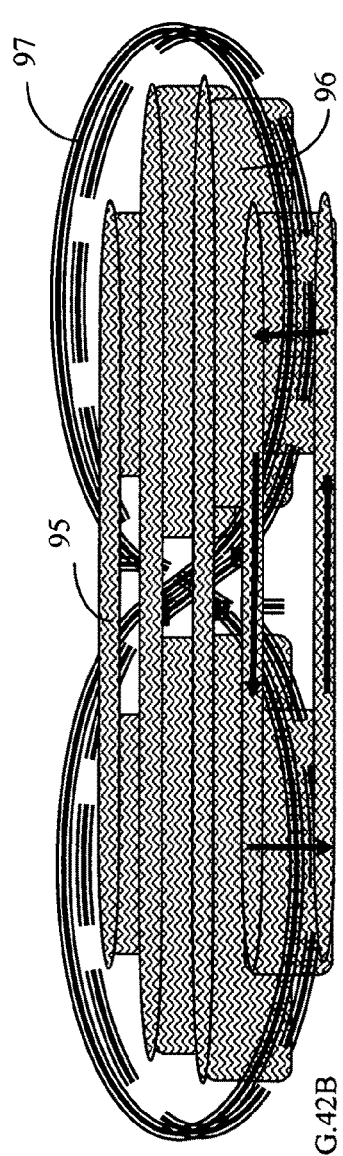
Figure 42C:
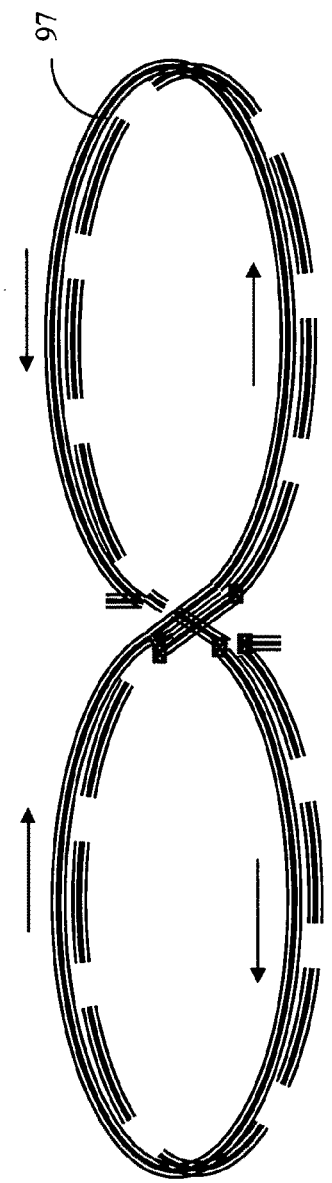

FIG. 42 shows the board embedded planar magnet 85b. The PC board has four layers, the top signal layer 91, the middle power layer 92, the middle ground layer 93 and the bottom signal layer 94. The planar magnet layer 951 is coated on the top signal layer 91: the planar magnet layer 952 is coated on the bottom signal layer 94. To reduce the magnetic resistance of the magnet eddy current, there are the slicing magnet plate 96 connecting the planar magnet layer 951 with the planar magnet layer 952. The electrical current loop flows in the metal loops 97. In FIG. 42B shows the magnet loop in a circle loop with the magnet being parallel to the surface of the board. As shown in FIG. 42C, it shows the corresponding to the electric current loop. There are conjugate two layers of the electrical loops. Therefore, the magnet flux is doubled.

FIG. 43A shows the chip 111 with pin 112 being mounted on the ESD switch layer esd. The equivalent circuit schematics is shown in FIG. 43B. As the Electric-Static-Discharge attacks on the device as shown in FIG. 43C, the high voltage turns on the esd switching layer and discharges through the path as shown in FIG. 43C and FIG. 43D. This alignment of the board layer has the advantage that the ESD switching layer docs not change the schematic of the original design. However, the disadvantage is the parametric capacitance as shown in FIG. 43B.

To reduce the parametric capacitance, the power supply layers vdd and gnd are moved to the middle of the board as shown in FIG. 44A. There are buried vias under the layer esd. The equivalent schematic is as shown in FIG. 44B. As the ESD attacks the circuit as shown in FIG. 44C and FIG. 44D, the esd layer switches on and the charge is discharged. The disadvantage is the need of the extra esd layer and the buried vias is not compatible with the existed layout. However, for the RF and the high speed circuit, this buried vias will not change the characteristics of the transmission lines.

FIG. 45A is the board arrangement having the only addition of one esd layer between the power layers vdd and gnd. The equivalent circuit schematic diagram is shown as FIG. 45B. As the ESD attacks the PCB board, as shown in FIG. 45C and FIG. 45D, the ESD is discharged through the vias. This alignment of the board has the advantages to be compatible with the existed PCB structure with the minimum additional one esd layer. However, for the RF circuit, the additional of the via will destroyed the characteristics with the addition of stub branch structure. It needs to do the additional impedance matching.

For each signal has to assign only one esd via. The esd via can share with the existed routing via that no extra via is needed. However, for the multiple pin nets, it might have the extra redundant vias is needed. So we need to do the via minimization and via assignment.

As shown in FIG. 46A, in the high acceleration high-g environment, the chip 113 is embedded in the board 115 with the pin 114 being soldiered on the board. Being similar to the chip placement and route, there is no routing beneath the chip. Furthermore, today's pitch of the pins is very tiny. Varying the net width, it will change the characteristic impedance of the signal net for the high speed signal nets. It had better to rout the net outside the chip area. Therefore, we develop the via minimization and via assignment algorithm for the general placement and routing which can apply to the IC, hybrid and PCB.

For the Vialess ESD-Free ESDS-PCB Green Board, the layout has the Floor Plan, Power Plan, Noise Plan and ESD Plan. The ESD plan is for the object function to be Vialess. Via Minimization problem including the Via Assignment for Switch Box and the Global Optimum with Pin and via Assignment for Chip or board.

As shown in FIG. 46B, it is one example of the general two dimensional 2-D placement and router. As shown in FIG. 46B, in the middle of the blocks, there is an open space enclosed with the dotted line. It is named as the switch box. FIG. 47A is this switch box router. FIG. 47B is the square shape rectangular box is transformed to be a circular graph. As shown in FIG. 47C, it is the split of the boundary to transform the switch box router to the circular linear graph as shown in FIG. 47D. In the graph, the vertical line is the solid lines: the horizontal lines are the dotted lines. As shown in FIG. 47E, the net having the pin at the bottommost pin can be implemented on the $1^{st}$ layer to have the solid line. The net having the pin at the top pin can be implemented on the $2^{nd}$ layer to have the dotted line Each 2-pin net needs 1 via to implement the So, we the following TANGS Theorem.

[TANGS THEOREM] In the Via Assignment for the 2-pin N nets, the maximum number of vias needed to rout the 2-pin N nets is (N−2).

The linear interval graph, circular linear graph and Tangs Theorem were first invented by the Min Ming Tarng. Ph.D. in 1981. Based on the (circular) linear interval graph, the minimum via assignment with the maximum planarity algorithm can be derived. It is noted that the (circular) linear interval graph is the split can dependent. However, with two different linear interval graphs corresponding to different split cuts, finding the minimum reduced Tangs distance to be the distance, we can complete cover all the versatile conditions to be the complete circular graph. Now, we use only one linear circular graph to explain the heuristic optimum algorithm. This is the Local Optimum for Switch Box.

The definition of the node is the Pin on Switch box, module, or chip boundaries. Referring to FIG. 49 and FIG. 50, the node Split & node Merge are the important operations of the algorithm to convert the general multi-pin net to be the 2-pin nets. As shown in FIG. 48A, find out the Tangs distance for each 2-pin net. The Tangs distance is the number of the pins which can not merged and removed from the linear interval graph. As shown in FIG. 49A, the neighboring 2 pins belonging to the same net x. As shown in FIG. 49B, these two x pins are merged and removed from the linear interval graph. This process can be repeated recursively. The residue pins which cannot be merged is left in the interval graph to be named as the "Tangs Distance". For example, as shown in FIG. 48A, the number sequence "2~2={3,4,1,4}", is "net~Tangs Distance={pins list}". Even there are 4 pins in the pins list.

However, the net 4 has two pins 4 which can be merged and deleted. Therefore, only the pins 3 and 1 are counted to be the "Tangs Distance" to be 2. Find out the net has the maximum Tangs Distance and remove it out from the linear interval graph and updated the Tangs Distance again. This process is repeated until all the net either has been removed or has the Tangs Distance to be zero as shown in FIG. 48C. Finally, apply the Tang Theorem to the linear interval graph for the top net and bottom net as shown in FIG. 48D. Then end the algorithm. The final via minimization and optimum placement result is shown in FIG. 48E.

The 2-pins net result can be generalized to be the multiple pins net. As shown in FIG. 50A, the net 1 has the multiple pins. The net 1 can be split to be two nets 1a and 1b as shown in FIG. 50B. With this process, we can generalize the algorithm for the 2-pin nets to multiple-pin nets.

Furthermore, the switch box maximum-planarization minimum-via assignment result can be extended to be the building block layout. As shown in FIG. 51, it is the building block layout with the pins being assigned on the boundary of the blocks. As shown in FIG. 51, the pins are connected to outside with the pin assignment. The design goal is to have the optimum pin assignment to have the maximum planarization to have the minimum via number. As shown in FIG. 53A, with the boundary splitting, the 2D building block layout BBL can be transformed to be the 1-D linear interval graph as shown in FIG. 53B. FIG. 54A shows another set of the boundary splitting, the 2D building block layout BBL can be transformed to be the 1D circular linear interval graph as shown in FIG. 54B. The circular list in FIG. 54B is re-construct as FIG. 54C, Calculating the Tangs distance for each net and making detour for the nets to reduce the Tangs distance as shown in FIG. 54D, finally, the circular linear graph result is transformed back to the building block layout as shown in FIG. 54E. It is very impressed that the number of via is only one.

The maximum-polarization, minimum-via assignment, optimum pin & via assignment algorithm is as shown in FIG. 55. The complete algorithm is a hierarchical layout algorithm. The bottom level circular linear placement core algorithm is constituted of the three procedures of converting the 2-D placement to 2 circular linear Placement, converting the multiple-pin-net to be 2-pin-net, build-up or update the reduced interval graph and calculate the "Tangs Distance" for each nets and mark the minimum "Tangs Distance" in 2 interval graphs to be the complete circular linear interval graph. This process will be repeated three times for the upper level layout processes of the BAP Block Array Placement. PAP Pin Array Placement and FAP Fixed Array Placement. As shown in FIG. 54A and FIG. 54B, the blocks can permutated to have the minimum maximum Tangs Distance. This is to change the permutation order to have the optimum placement. This is the Block Array Placement. Further, on the same module, the pins order can have the cycling change to have the minimum maximum Tangs Distance. For example, for the BK1 in FIG. 54B, the pin list order is {1,2,3,4}. As long the cycling order is kept the same, the order can be {2, 3, 4, 1}, {3, 4, 1, 2}, etc. This is the Pin Array Placement. After the optimization processes of the Block Array Placement and Pin Array Placement, the blocks and pins placement are fixed. Then it can start the Fixed Array Placement. It will go through the complete processes of converting the 2-D placement to 2 orthogonal circular linear placement, converting the multiple-pin-net to be 2-pin-net, build-up or update the reduced interval graph and calculate the "Tangs Distance" for each nets and mark the minimum "Tangs Distance" in 2-orthogonal interval graphs to be the complete circular linear interval graph, find the net has the highest cost of "Tangs Distance", trying to make the detour for this net, removing this net from interval graph, etc.

Figure 56A:
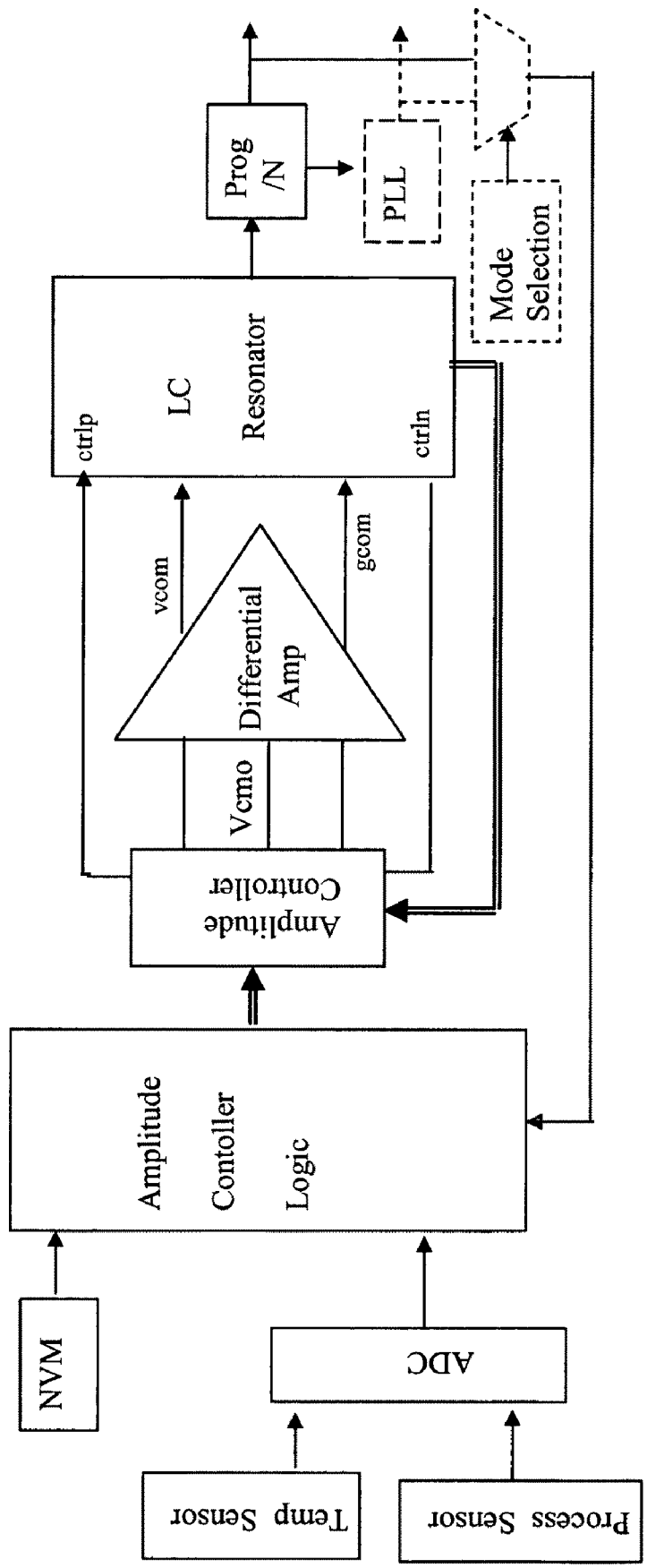
Figure 56B:
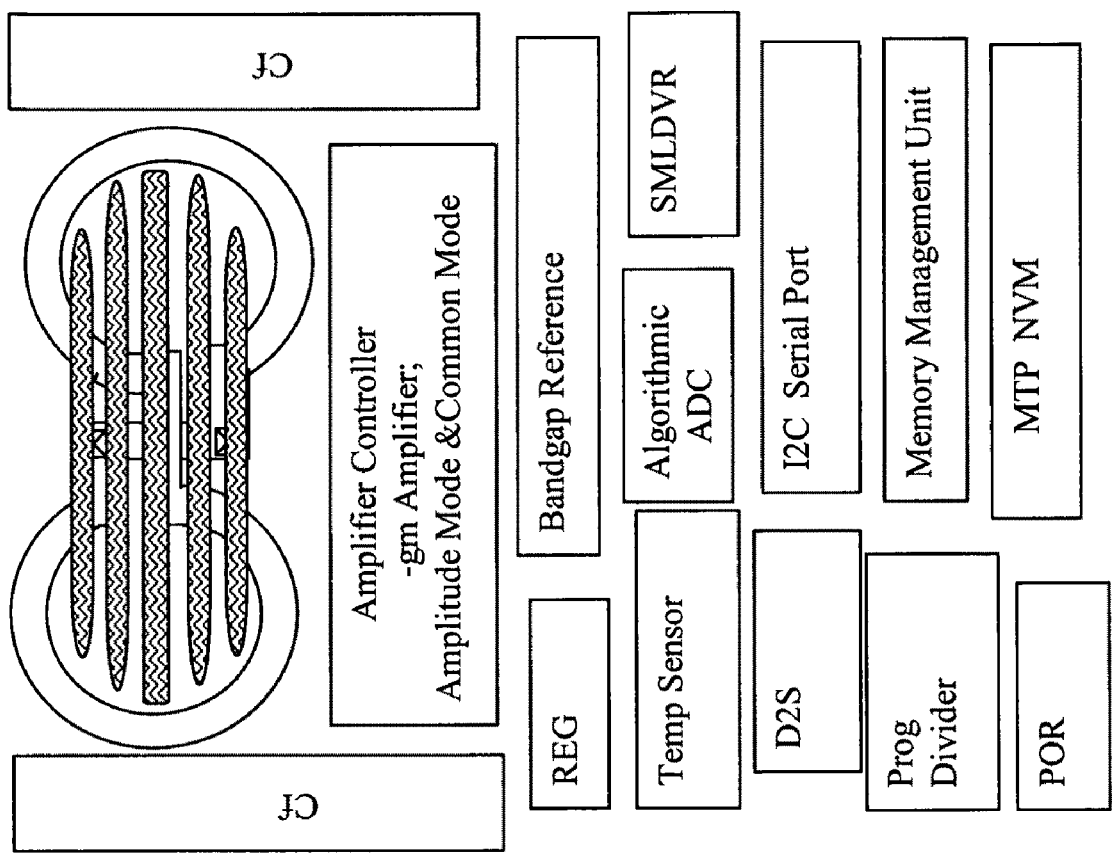
Figure 57A:
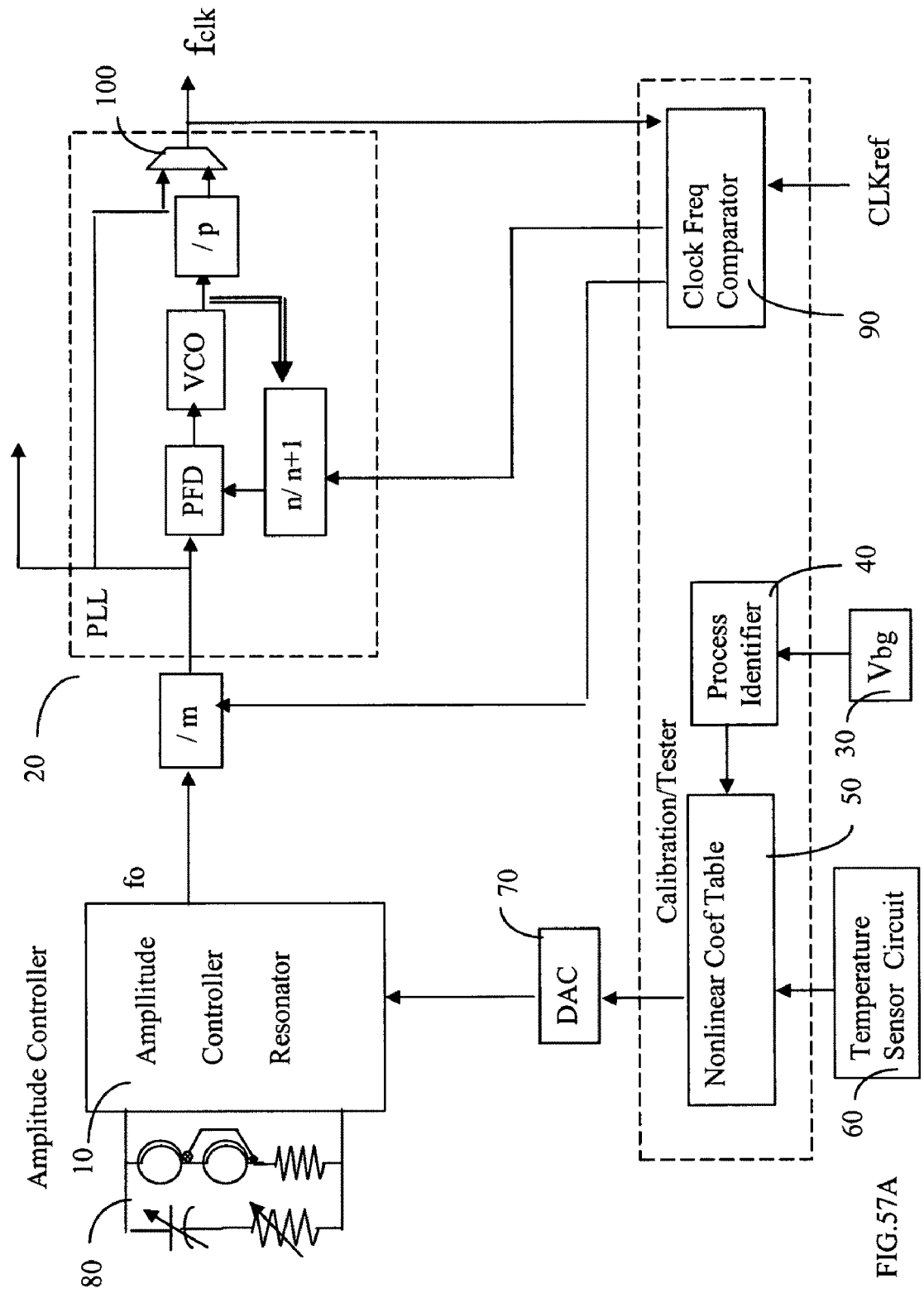

Now, we can integrate all the above software and hardware to build the optimum Xtaless ClockChip design. As shown in FIG. 56A, it shows the signal flow block diagram for the core of the amplitude controller. FIG. 56B shows the Layout and Floor Planning for the Xtaless ClockChip. FIG. 57A shows the IP version for the Xtaless Amplitude Controller Clock. It includes the PLL. The VCO of the PLL can be any resonator. Furthermore, the PLL can use the ring oscillator of LC VCO to be multi-phase ring oscillator. The multi-phase ring oscillator being made of the LC resonator has the better performance. With the 8-phase-LC-ring oscillator, it can use 10 GHz CMOS LC resonator to handle the 80 Gb/s data transmission. Furthermore, for the clock self-reference, the PLL uses the frequency internal counter instead of the phase frequency detector PFD.

Figure 57B:
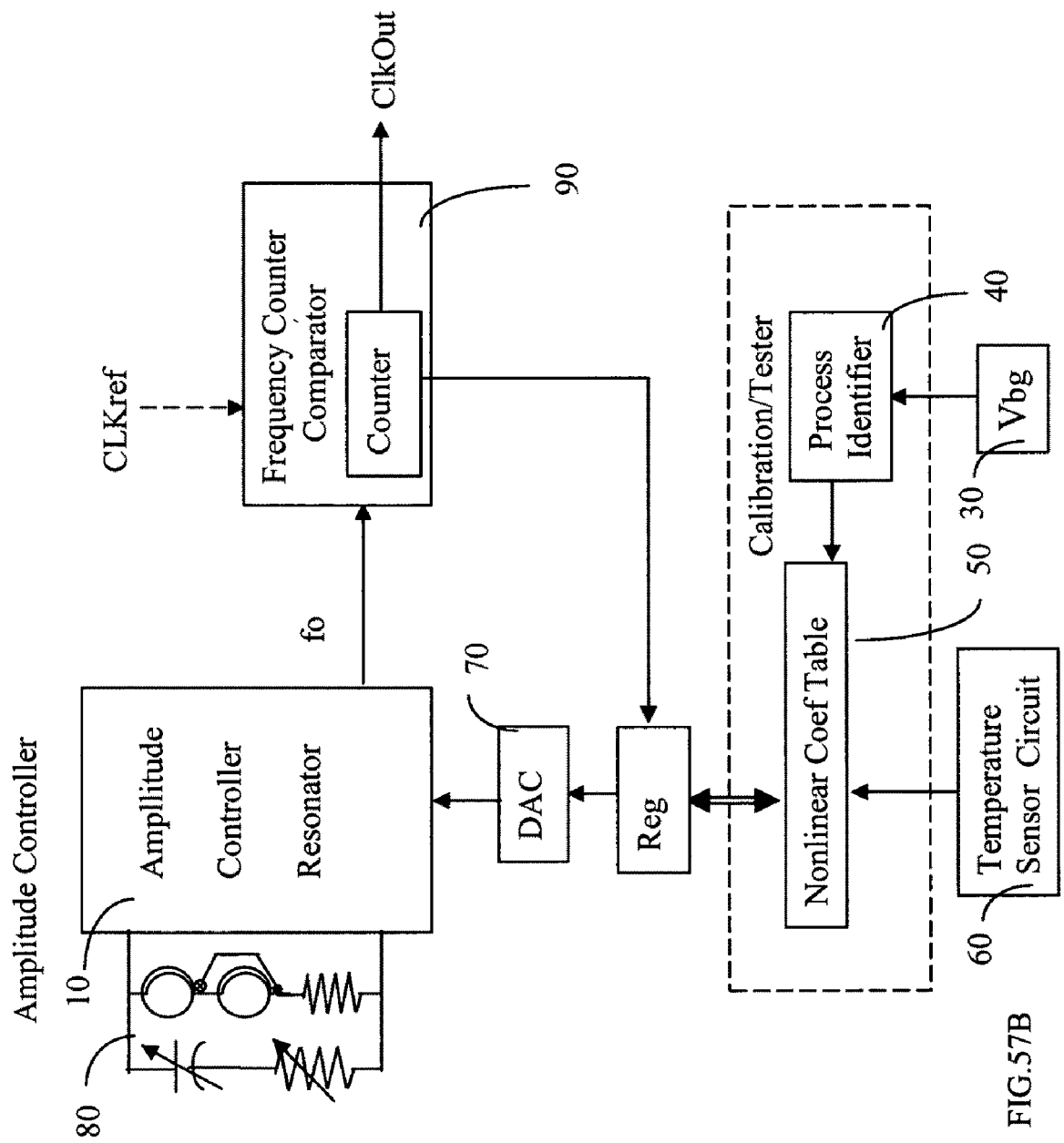

For the low frequency clock, as shown in FIG. 57B, we can use the frequency divider to replace the PLL. The frequency divider serves as the calibration circuit in the test mode, too. We don't need the fractional divider to generate the $2^{nd}$ or the $3^{rd}$ clocks to support the plurality clock chip. The Green Technology Platform apparatus comprises a reference magnetic-electric resonator accommodating to generate the reference clock signal having a resonant frequency. The gm-amplifier is coupled to the reference resonator and the oscillator controller is coupled to the reference magnetic-electric resonator and the gm-amplifier. The oscillator controller is adapted to control the frequency of the reference resonator by modulating the amplitude of said reference resonator. The amplitude of said reference resonator being correlated to temperature. The Green technology platform further comprises a magnetic means and capacitor. The magnetic means having its magnetic field flux being guided by a plurality of soft magnetic material loops to form a closed-loop magnetic field flux to be EMI-Free. Furthermore, the magnetic means has its center magnetic field flux being guided by a plurality of soft magnetic material layers. This concept can be used in designing a high performance conventional PLL.

The Xtaless ClockChip is not only a clock chip but also it has very important system applications. Here we use two examples. USB-3 and tire safety, to illustrate the powerful applications of the Xtaless ClockChip technology. USB3 is the SERDES working at 5 GHz. Traditional approach needs to use the 25 MHz crystal oscillator and PLL to boost up the frequency 200 times to be 5 GHz. It takes a lot resources and the performance is poor. As shown in FIG. 38A, we invent the 3SGLL-USB3. It has the hierarchical clock & data structure of the Global Frequency Layer and the Local Phase Delay Layer in the signal propagation. In contrast to the prior art, all the VCOs in the PLL are replaced with the Xtaless Clocks. There is the delay line to match the difference in phase. However, all the Xtaless Clocks are synchronized to be the same frequency. During power up, all the Xtaless Clocks are automatically run at the set up frequency without synchronization. As the data starts to transmit, then the Xtaless Clocks start to synchronize with each other. As shown in FIG. 58D, the generic 3SGLL-USB3 has the DLL loop for the phase matching among the clock and the PLL loop for the synchronize of the frequency. As shown in FIG. 58E, the advanced implementation of the 3SGLL-USB3 has phase loop for the phase matching and the frequency loop for the frequency synchronization. The frequency synchronization adopts the early/late CDR algorithm as shown in FIG. 58B and FIG. 58C. It has the accumulation count effect to have the fine tune of the frequency of the Xtaless Clocks. There are many different versions of the early/late detecting methodologies. As shown in FIG. 58B and FIG. 58C, if the sampled data at 90 degrees position is different from the sampled data at 0+d position or the sampled data at 270 degrees position is different from the sampled data at 180+d position, the Xtaless Clock is early. If the sampled data at 90 degrees position is different from the sampled data at 180−d position or the sampled data at 270 degrees position is different from the sampled data at 0−d position, the Xtaless Clock is late. If both early and late, the Xtaless Clock frequency is higher than the input data, reduce the Xtaless Clock frequency a little bit, etc. The Xtaless Clock serves the clock for both transmitter and receiver. With this approach, all the Xtaless Clocks in the USB system are synchronized together to be the same frequency. It is noted that the DLL loop in FIG. 58E being optional. The input data Din feeds to the Din_direct signal line directly without the DLL, the 3SGLL-USB3 CDR still works greatly. Furthermore, there are many different versions to implement the frequency loop. It can be traditional LPF or the digital late/early, etc. As shown in FIG. 58E, changing the LPF to be the early/late digital frequency-locking loop, the 3SGLL-USB3 CDR is a SERDES having no PLL at all. With the self-automation to be the target frequency capability, the Xtaless Clock can automatically runs at the target frequency such as the 5 GHz for the 3SGLL-USB3. It is noted the terrific architecture can be applied to any SERDES to be the PLL-Free SerDes such as PLL-Free 3SGLL-USB3 and PLL-Free 10 GB Ethernet, etc. It is not limited to 3SGLL-USB3 CDR.

As shown in FIG. 1 and FIG. 59, the green technology platform is applied to the Tire Safety Pressure Monitor to illustrate the applications of the green technologies in the advanced modern designs. Form the traffic bureau regulation, all the stub 777 of the tire 666 has to install the Tire Safety Pressure Monitor chip 555. The Pressure Monitor chip 555c is the option to install the Pressure Monitor chip 555c in the cap. However, so far, the regulation cannot be forced due to the lack of technologies. Our green technologies make up the technology gaps to implement the Tire Safety Pressure Monitor. As shown in FIG. 44 and FIG. 46, the Tire Safety Pressure Monitor chip 555 has to adopt the ESDS-PCB to mount on the stub 777 in the high acceleration high-G and high electric static discharge ESD environment. In the high-G and high-ESD environment, as shown in FIG. 59C, it must use the Xtaless ClockChip technology. SM&LVDR technology, etc to implement the Tire Safety Pressure Monitor chip 555.

While the invention has been particularly shown and described with reference to the preferred embodiments thereof, it will be understood by those skilled in the art that various changes in form and details may be made therein without departing from the spirit and scope of the invention. For examples:

1) a LC resonator could be replaced by a transformer-capacitor resonator (TC resonator) or a quadrature VCO resonator based on transformer coupling.

2) We show a differential version of the amplitude controller, etc for noise suppression issue, but the LC resonator could be design in many single-end versions.

3) The gm-amplifier couples to LC tank to generate a negative resistance could be a capacitive degeneration circuit topology instead of cross couple circuit topology.

4) We show using cmos transistors, But it could be designed to use bipolar transistors or both types transistors.

5) etc.

Acknowledgement

The inventor Min Ming Tarng. Ph.D. does appreciate many years support of Mei-Jech Lin, Ph.D., Eric Yu-Shiao Tarng, Alfred Yu-Chi Tarng, Angela Yu-Shin Tarng, Jwu-Shyan Tarng, Minh V Nguyen, Wendy Nguyen, Hai Van Nguyen, Jwu-Ing Tarng, Huang-Chang Tarng, Shun-Yu Nieh and walk with me through these un-forgetable tough days.

I claim:

1. A Green Technology Platform apparatus having an Amplitude Controlled Oscillator (ACO) apparatus comprising:
   a reference resonator adapted to receive an input control signal of a specified amplitude to generate a reference resonator signal at a resonant frequency;
   a plurality of amplifiers coupled to said reference resonator;
   an amplitude controller coupled to said reference resonator and said plurality of amplifiers;
   said amplitude controller adapted to fine tune said resonant frequency of said reference resonator by controlling an amplitude of said reference resonator signal.

2. The Green Technology Platform apparatus according to claim 1, further comprising:
   a plurality inductances;
   wherein a magnetic field flux of said inductances is guided and shielded by a plurality of soft magnetic material loops.

3. The Green Technology Platform apparatus according to claim 1, further comprising:
   a plurality inductances;
   wherein a center magnetic field flux of said inductances is guided by a plurality of soft magnetic material layers.

4. The Green Technology Platform apparatus according to claim 1, further comprising: a coefficient means adapted to store a plurality of calibration coefficients; wherein an oscillator controller is adapted to set an amplitude and a frequency of said reference resonator according to the plurality of calibration coefficients.

5. The Green Technology Platform apparatus according to claim 1, further comprising: a frequency divider coupled to said reference resonator; wherein the frequency divider is adapted to divide a signal output from the reference resonator into a plurality of second signals having a corresponding plurality of frequencies; wherein the plurality of frequencies are substantially equal to or lower than the reference resonant frequency.

6. The Green Technology Platform apparatus according to claim 1, further comprising: a frequency lock means coupled to the reference resonator; wherein the frequency lock means is adapted to generate a set of signals having a corresponding plurality of frequencies.

7. The Green Technology Platform apparatus according to claim 1, further comprising: a frequency calibration system for receiving a second reference signal with a second reference frequency from a second reference oscillator;
   a frequency divider coupled to the said reference resonator; wherein said frequency divider is adapted to provide an output signal having an output frequency which is a rational fraction of the reference resonant frequency;
   a comparator configured to compare the output frequency of said frequency divider to the second reference frequency and to provide a comparison signal; wherein when said output frequency of said frequency divider is not substantially equal to the reference resonant frequency;
   an amplitude modulator coupled to said comparator and to said reference resonator configured to determine and provide a plurality of coefficients to the coefficient register; wherein said plurality of coefficients control said plurality of amplifiers.

8. The Green Technology Platform apparatus according to claim 1, further comprising:
a start-up apparatus for a free-running harmonic oscillator; said start-up apparatus comprising: a current source adapted to provide a first current; a power source module adapted to provide a power source; a bandgap reference Vbg_OK controller module generating a Vbg_OK signal that indicates a status of a bandgap reference voltage Vbg; and wherein the bandgap reference Vbg_OK controller module is adapted to switch off the first current from said free-running harmonic oscillator in response to the Vbg_OK signal.

9. The Green Technology Platform apparatus according to claim 1, further comprising:
a spread spectrum controller adapted to control an oscillator controller to generate a spread spectrum reference signal at a plurality of different reference frequencies according to a spread spectrum parameter; wherein said spread spectrum parameter comprises at least one of the following spread spectrum parameters: a biasing substrate voltage of an active device, an effective reactance, a control voltage, an oscillation amplitude, a common mode voltage, or a transconductance.

10. The Green Technology Platform apparatus according to claim 1, further comprising: a power and clock (P&C) management module including a P&C clock sensor and a P&C controller; wherein said P&C clock sensor detects a clock output variance and sends a P&C state transition command to said P&C controller; wherein said P&C controller receives said P&C state transition command and sends a controlling signal to an oscillator controller to vary the amplitude and frequency of the reference resonator.

11. The Green Technology Platform apparatus according to claim 1, further comprising:
a planar magnetic circuit formed by a plurality of planar electric current loops and a plurality of magnetic loops; wherein said plurality of planar electric loops are constructed on a plurality of internal planar layers; wherein said plurality of magnetic loops are constructed by a plurality of outer planar layers formed by a soft magnetic material connecting magnetic field flux generated at centers of said plurality of planar electric current loops.

12. The Green Technology Platform apparatus according to claim 1, further comprising:
a planar magnetic shield;
a plurality of planar electric current loops constructed on a planar integrated circuit; wherein said planar integrated circuit is covered by said planar magnetic shield.

13. The Green Technology Platform apparatus according to claim 1, further comprising:
a single-input-multiple-output (SIMO) power supply; wherein said single-input-multiple-output power supply comprises: an AC source, a transformer, a rectifier, a Power Factor Correction (PFC) module; single-input-multiple-output switches, and a socket; wherein said SIMO power supply converts AC power directly to multiple DC power sources.

14. A Green Technology Platform apparatus according to claim 1, further comprising:
an Electric Static Discharge Switch (ESDS) comprising: a power layer; a ground layer; and an Electric Static Discharge (ESD) layer; wherein said ESD layer is clamped between said power layer and said ground layer; wherein said ESD layer is switched on by an electric static charge; said power layer is conducted with said ground layer to discharge said electric static charge; wherein said ESDS further comprises a signal layer and a via; wherein said via discharges a charge from said signal layer to said power layer and said ground layer; wherein said via is minimized with via assignment of circular linear interval graphs and TangTheorems.

15. A Green Technology Platform apparatus having Amplitude Controlled Oscillator (ACO) apparatus comprising:
an Amplitude Controlled reference resonator adapted to provide a first reference signal having a Amplitude Controlled resonant frequency;
a plurality of amplifiers coupled to the reference resonator;
a plurality of coefficient registers adapted to store a first plurality of calibration coefficients;
an amplitude controller coupled to the Amplitude Controlled reference resonator; the amplitude controller adapted to select a reference resonator amplitude from a plurality of amplitudes for fine-tuning said resonant frequency without varying a capacitance of said reference resonator;
wherein said selecting of the reference resonator amplitude is performed in response to the plurality of calibration coefficients;
a common mode controller coupled to the reference resonator for generating a harmonic reference signal;
wherein the common mode controller is adapted to maintain a common mode voltage level of the reference resonator substantially constant.

16. The Green Technology Platform apparatus according to claim 15, further comprising: wherein the amplitude of said Amplitude Controlled reference resonator is correlated to temperature;
said amplitude controller includes a plurality of temperature sensors; said amplitude controller being adapted to fine tune said resonant frequency of said reference resonator by controlling an amplitude of said reference resonator signal based on a plurality of outputs of said a plurality of temperature sensors.

17. The Green Technology Platform apparatus according to claim 15, further comprising:
a plurality of electronic heaters provided to control the temperature of said LC reference resonator during calibration or testing processes.

18. A Green Technology Platform apparatus comprising:
an LC resonator adapted to generate a plurality of clock signals having a resonant frequency;
a plurality of gm-amplifier means coupled to said LC resonator;
an oscillator controller coupled to said LC resonator and said plurality of gm-amplifier means;
wherein said oscillator controller is adapted to receive an amplitude varying feedback of said LC resonator to generate a plurality of control signals to control a plurality of bulk nodes of said gin-amplifier means to control said plurality of clock signals and to minimize phase noise generated by said gm-amplifier;
a common mode controller coupled to the LC resonator for generating a harmonic reference signal;
wherein the common mode controller is adapted to maintain a common mode voltage level of the LC resonator substantially constant.

* * * * *